US012237021B2

(12) United States Patent
Nakagawa

(10) Patent No.: US 12,237,021 B2
(45) Date of Patent: Feb. 25, 2025

(54) MEMORY SYSTEM

(71) Applicant: KIOXIA CORPORATION, Tokyo (JP)

(72) Inventor: Takashi Nakagawa, Chofu Tokyo (JP)

(73) Assignee: Kioxia Corporation, Tokyo (JP)

( * ) Notice: Subject to any disclaimer, the term of this patent is extended or adjusted under 35 U.S.C. 154(b) by 208 days.

(21) Appl. No.: 17/896,950

(22) Filed: Aug. 26, 2022

(65) Prior Publication Data
US 2023/0298671 A1 Sep. 21, 2023

(30) Foreign Application Priority Data
Mar. 18, 2022 (JP) .................. 2022-043988

(51) Int. Cl.
*G11C 16/26* (2006.01)
*G06F 3/06* (2006.01)
*G11C 16/04* (2006.01)
*G11C 16/10* (2006.01)
*G11C 16/34* (2006.01)
*G11C 29/02* (2006.01)
*G11C 29/50* (2006.01)

(52) U.S. Cl.
CPC ........... *G11C 16/26* (2013.01); *G06F 3/0658* (2013.01); *G11C 16/0483* (2013.01); *G11C 16/10* (2013.01); *G11C 16/3404* (2013.01); *G11C 29/021* (2013.01); *G11C 29/028* (2013.01); *G11C 29/50004* (2013.01)

(58) Field of Classification Search
CPC ..... G11C 16/26; G11C 16/0483; G11C 16/10; G11C 29/50004; G11C 11/5642; G11C 16/3404; G11C 29/021; G11C 29/028; G06F 3/0658
See application file for complete search history.

(56) References Cited

U.S. PATENT DOCUMENTS

| | | | |
|---|---|---|---|
| 9,159,437 B2 | 10/2015 | Jeon et al. | |
| 9,251,892 B1* | 2/2016 | Asami ................. | G11C 11/5642 |
| 10,726,934 B2 | 7/2020 | Chew et al. | |
| 2014/0365836 A1 | 12/2014 | Jeon et al. | |
| 2018/0190348 A1* | 7/2018 | Tokutomi ........... | G11C 16/0483 |
| 2019/0066776 A1* | 2/2019 | Tamiya ............... | G11C 11/5628 |
| 2020/0026470 A1* | 1/2020 | Yang .................... | G06F 3/0616 |
| 2020/0075106 A1* | 3/2020 | Tokutomi ............. | G06F 3/0679 |
| 2020/0075118 A1 | 3/2020 | Chew et al. | |
| 2020/0090762 A1* | 3/2020 | Shirakawa ......... | G11C 16/0483 |

(Continued)

Primary Examiner — Hoai V Ho
Assistant Examiner — Justin Bryce Heisterkamp
(74) Attorney, Agent, or Firm — Kim & Stewart LLP

(57) ABSTRACT

A memory system includes first and second memory cells, and a controller configured to write data having a first value in the first memory cells and data having a second value in the second memory cells, determine a first voltage by executing a tracking process, and read data from the memory cells using the first voltage. In the tracking process, the controller performs a plurality of read operations to determine a first distribution of the memory cells, estimate a second distribution of the first memory cells based on the first distribution, calculate a third distribution of the second memory cells based on a difference between the first distribution and the second distribution, and determine a voltage that is within the third voltage as the first voltage based on the second distribution and the third distribution.

20 Claims, 43 Drawing Sheets

(56) References Cited

U.S. PATENT DOCUMENTS

2020/0211654 A1* 7/2020 Asami ................... G11C 29/52
2020/0357475 A1* 11/2020 Kwak ................... G06F 3/0659
2021/0089232 A1   3/2021 Yamaki et al.
2021/0208813 A1* 7/2021 Kim ........................ G11C 7/00

* cited by examiner

MEMORY SYSTEM

CROSS-REFERENCE TO RELATED APPLICATION(S)

This application is based upon and claims the benefit of priority from Japanese Patent Application No. 2022-043988, filed Mar. 18, 2022, the entire contents of which are incorporated herein by reference.

FIELD

Embodiments described herein relate generally to a memory system.

BACKGROUND

A memory system which includes a memory device capable of storing data in a non-volatile manner and a controller controlling the memory device, is known.

DETAILED DESCRIPTION

Figure 1:
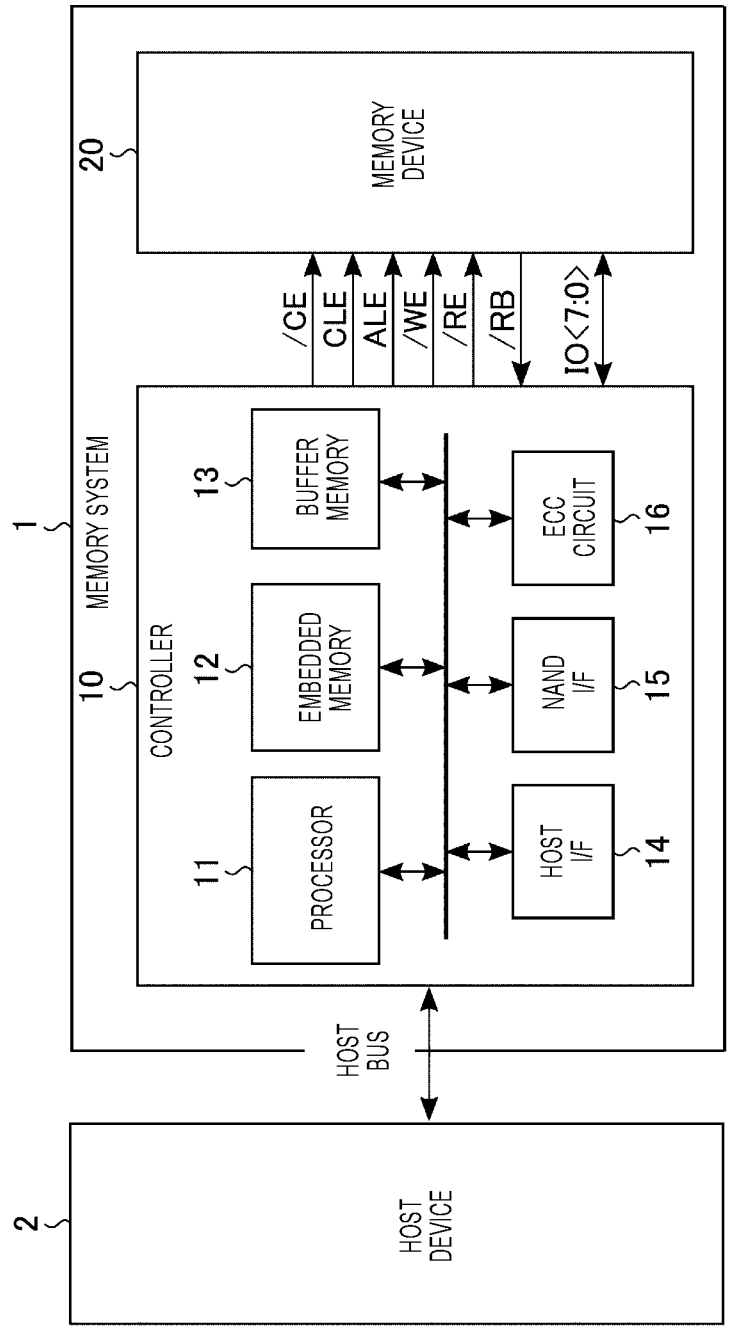
FIG. 1 is a block diagram illustrating an example of a configuration of an information processing system including a host device and a memory system according to an embodiment.

Embodiments provide a memory system that has improved reliability.

In general, according to one embodiment, a memory system according to an embodiment includes a semiconductor memory and a controller. The semiconductor memory includes a plurality of memory cells each configured to store data having one of at least a first value and a second value according to a threshold voltage thereof, the first value corresponds to the threshold voltage included in a first voltage range and the second value corresponds to the threshold voltage included in a second voltage range. The controller is configured to write data having the first value in each of a plurality of first memory cells among the plurality of memory cells, write data having the second value in each of a plurality of second memory cells among the plurality of memory cells, determine a first voltage by executing tracking process for the plurality of memory cells, and read data from the plurality of memory cells using the first voltage in a read process after the tracking process. The controller is configured to perform a plurality of read operations using a plurality of read voltages in a third voltage range, the third voltage range including a part of the first voltage range and a part of the second voltage range, to determine a first distribution of the plurality of memory cells, estimate a second distribution of the plurality of first memory cells in the third voltage range based on the first distribution, calculate a third distribution of the plurality of second memory cells in the third voltage range based on a difference between the first distribution and the second distribution, and determine a voltage that is within the third voltage range as the first voltage based on the second distribution and the third distribution.

Hereinafter, embodiments will be described with reference to the accompanying drawings. Further, in the following description, the same reference numerals refer to components having substantially the same function and configuration.

When components having the same configuration need to be distinguished, different characters or numbers may be added to the end of the same reference numerals.

1. Embodiment

1.1 Configuration 1.1.1 Memory System

An example of a configuration of a memory system will be described with reference to FIG. 1. FIG. 1 is a block diagram illustrating an example of a configuration of an information processing system including a host device and a memory system according to an embodiment.

A memory system 1 includes a controller 10 and a memory device 20.

The memory system 1 is, for example, a solid state drive (SSD) or an SD® card. The memory system 1 communicates with, for example, an external host device 2. The memory system 1 stores data for the host device 2. Further, the memory system 1 reads data for the host device 2.

The controller 10 may be configured with an integrated circuit such as, for example, a system-on-a-chip (SoC). The controller 10 receives a command from the host device 2. A function of each component of the controller 10 may be implemented by dedicated hardware, a processor executing a program (e.g., firmware), or a combination thereof. The controller 10 controls the memory device 20 based on the received command. Specifically, the controller 10 writes data for which writing is commanded, to the memory device 20 based on a write command received from the host device 2. Further, the controller 10 transmits to the host device 2 data read from the memory device 20 based on a read command received from the host device 2.

The memory device 20 is, for example, a semiconductor memory. The memory device 20 is, for example, a NAND type flash memory. Hereinafter, the memory device 20 will be referred to as a NAND memory 20. The NAND memory 20 includes a plurality of memory cell transistors. The NAND memory 20 stores data in a non-volatile manner. The NAND memory 20 is connected to the controller 10 by a NAND bus.

The NAND bus transmits and receives various signals according to a NAND interface standard through individual signal lines. The various signals include, for example, IO<7: 0>, /CE, CLE, ALE, /WE, /RE, and /RB. The signal /CE is a chip enable signal. The signal /CE is a signal for enabling the NAND memory 20. The signal CLE is a command latch enable signal. The signal CLE notifies to the NAND memory 20 that the signal IO<7:0> transmitted to the NAND memory 20 is a command while the signal CLE is at "high (H)" level. The signal ALE is an address latch enable signal. The signal ALE notifies to the NAND memory 20 that the signal IO<7:0> transmitted to the NAND memory 20 is an address while the signal ALE is at "high (H)" level. The signal/WE is a write enable signal. The signal/WE instructs the NAND memory 20 to take in the signal IO<7:0>. The signal/RE is a read enable signal. The signal/RE instructs the NAND memory 20 to output the signal IO<7:0>. The signal/RB is a ready busy signal. The signal/RB indicates whether the NAND memory 20 is in a ready state (a state capable of receiving a command from the outside) or a busy state (a state not capable of receiving a command from the outside).

The signal IO<7:0> is, for example, an 8-bit width signal. The signal IO<7:0> is transmitted and received between the controller 10 and the NAND memory 20. The signal IO<7:0> includes an address, a command, and data. The command is a signal for controlling the NAND memory 20. The data includes read data and write data.

1.1.2 Controller

The controller 10 includes a processor (CPU: central processing unit) 11, an embedded memory 12, a buffer memory 13, a host I/F (e.g., host interface circuit) 14, a NAND I/F (e.g., NAND interface circuit) 15, and an error checking and correcting (ECC) circuit 16.

The processor 11 controls an overall operation of the controller 10. The processor 11 issues, for example, a command for instructing the NAND memory 20 to execute various operations including a write operation, a read operation, and an erase operation.

The embedded memory 12 is, for example, a semiconductor memory such as a static random access memory (SRAM). The embedded memory 12 is used as a work area of the processor 11. The embedded memory 12 stores firmware for managing the NAND memory 20, various management tables including a plurality of compressed-data tables, and others.

The buffer memory 13 is, for example, a semiconductor memory such as a dynamic random access memory (DRAM) or the like. The buffer memory 13 temporarily stores write data received from the host device 2, read data which the controller 10 receives from the NAND memory 20, and others. Note that the buffer memory 13 may be provided outside the controller 10.

The host interface circuit 14 is connected to the host device 2 through a host bus. The host bus is, for example, a bus operated according to various standards, including PCIe (PCI EXPRESS® (peripheral component interconnect express)), UFS (universal flash storage), SD® interface, SAS (serial attached SCSI (small computer system interface)), SATA (serial ATA (advanced technology attachment)), or NVMe (NVM EXPRESS® (non-volatile memory express)). The host interface circuit 14 is in charge of communication between the controller 10 and the host device 2. The host interface circuit 14 transmits, for example, a command and data received from the host device 2 to each of the processor 11 and the buffer memory 13.

The NAND interface circuit 15 is connected to the NAND memory 20 through the NAND bus. The NAND bus is, for example, a bus operated according to Toggle NAND (Toggle DDR) standard or Open NAND Flash Interface (ONFI) standard. The NAND interface circuit 15 is in charge of communication with the NAND memory 20. The NAND interface circuit 15 transmits a command, an address, and write data to the NAND memory 20 according to an instruction of the processor 11. Further, the NAND interface circuit 15 receives read data from the NAND memory 20.

The ECC circuit 16 performs an error checking and correction process of data stored in the NAND memory 20. More specifically, the ECC circuit 16 generates an error correction code during a write of data, and adds the error correction code to the data being written. The error correction code is, for example, a hard decision decoding code such as a Bose-Chaudhuri-Hocquenghem (BCH) code, a Reed-Solomon (RS) code or the like, or a soft decision decoding code such as a Low-Density Parity-Check (LDPC) code. Further, during a data read process, the ECC circuit 16 decodes the error correction code, and detects whether there is an error bit. When an error bit is detected, the ECC circuit 16 corrects the error by specifying a position of the error bit.

1.1.3 Functional Components of Controller

Figure 2:
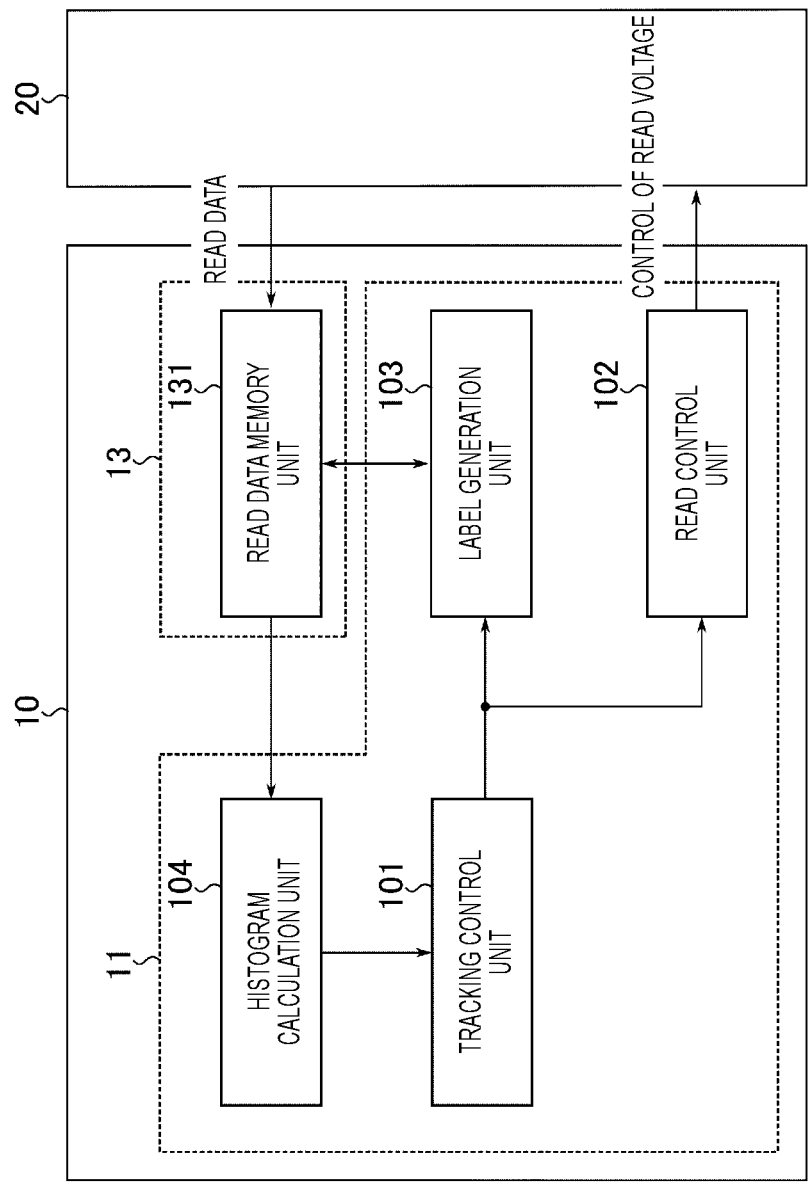
FIG. 2 is a diagram illustrating functional components provided in a controller according to the embodiment.

An example of functional components of the controller 10 according to the embodiment will be described with reference to FIG. 2. FIG. 2 is a diagram illustrating the functional components of the controller according to the embodiment.

The processor 11 includes various functional units such as a tracking control unit 101, a read control unit 102, a label generation unit 103, and a histogram calculation unit 104. The buffer memory 13 includes a read data memory unit 131. Note that the controller 10 may implement the respective functional units such as the tracking control unit 101, the read control unit 102, the label generation unit 103, and the histogram calculation unit 104 as dedicated hardware.

The tracking control unit 101 controls a threshold voltage tracking process to be described later, and estimates an optimal read voltage based on a histogram. The histogram is a distribution diagram representing the number of memory cell transistors (the number of on-cells) of which threshold voltages belong to a plurality of voltage ranges, respectively. More specifically, the tracking control unit 101 controls the read control unit 102 and the label generation unit 103 so as to generate a label allocated to each memory cell transistor. The label is an identifier used for distinguishing a voltage range that includes the threshold voltage of each memory cell transistor. Further, the tracking control unit 101 determines an optimal read voltage by using the number of on-cells corresponding to the label.

The read control unit 102 issues a read command for executing a read operation, to the NAND memory 20. The read control unit 102 issues a plurality of read commands to search for a voltage range that includes the threshold voltage of each memory cell transistor, for example when the label is generated.

The read data memory unit 131 stores data read from a memory cell transistor by the read operation performed on the NAND memory 20. Further, the read data memory unit 131 stores a label allocated to each memory cell transistor.

The label generation unit 103 generates a label to be allocated to each memory cell transistor, using data stored in the read data memory unit 131.

The histogram calculation unit 104 calculates the number of memory cell transistors to which the same label is allocated, based on the label of each memory cell transistor stored in the read data memory unit 131. Then, the histogram calculation unit 104 calculates a histogram representing the distribution of the number of on-cells corresponding to each label.

1.1.4 Configuration of NAND Memory

Figure 3:
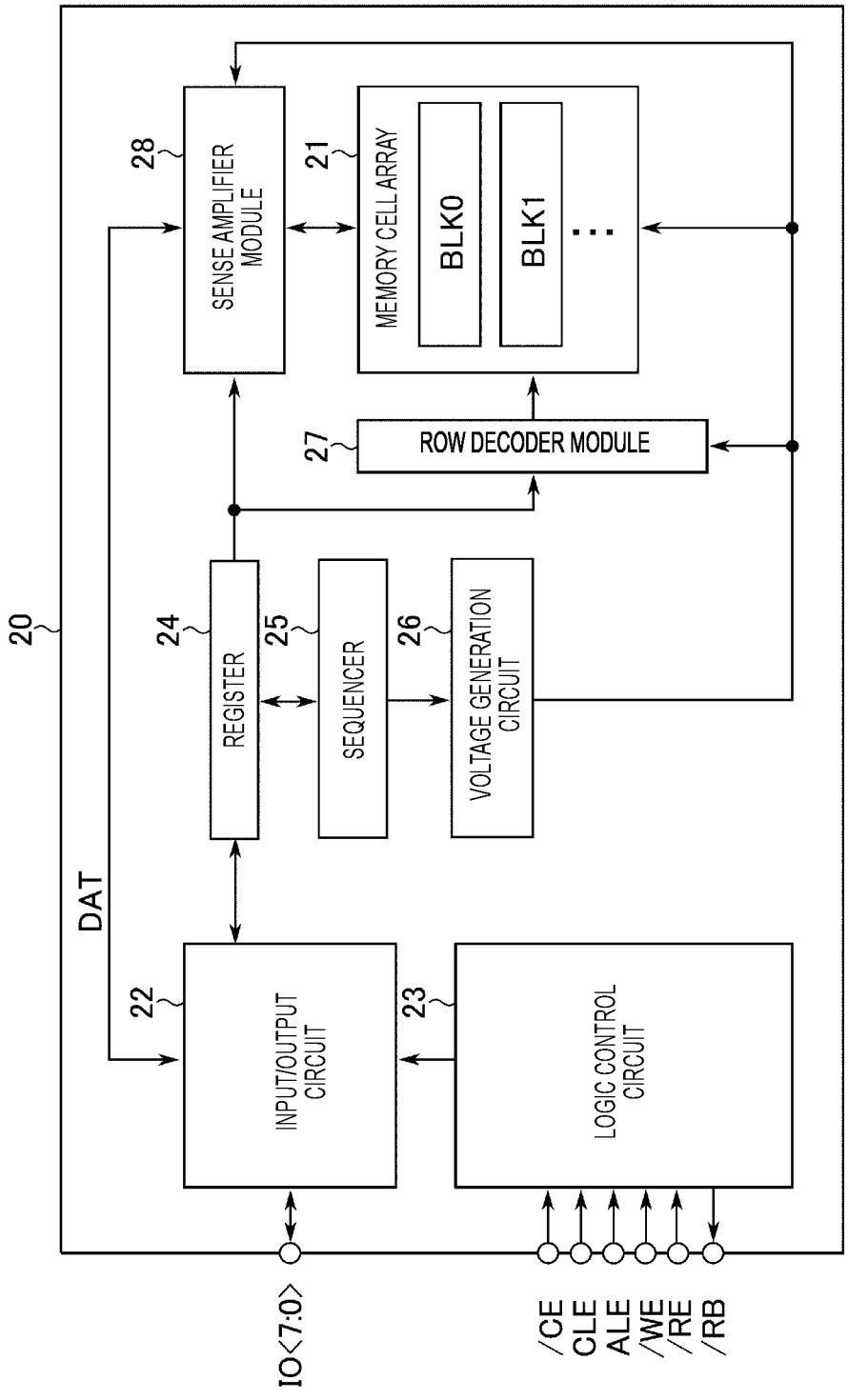
FIG. 3 is a block diagram illustrating an example of a configuration of a NAND memory according to the embodiment.

Next, an example of the configuration of the NAND memory 20 according to the embodiment will be described with reference to FIG. 3. FIG. 3 is a block diagram illustrating an example of the configuration of the NAND memory according to the embodiment.

The NAND memory 20 includes a memory cell array 21, an input/output circuit 22, a logic control circuit 23, a register 24, a sequencer 25, a voltage generation circuit 26, a row decoder module 27, and a sense amplifier module 28.

The memory cell array 21 includes a plurality of blocks BLK (BLK0, BLK1, ... ). Each block BLK is a set of a plurality of memory cell transistors capable of storing data in a non-volatile manner, and is used, for example, as an erase unit of data. Further, a plurality of bit lines and a plurality of word lines are provided in the memory cell array 21. One memory cell transistor is associated with, for example, one bit line and one word line.

The input/output circuit 22 transmits and receives the signal IO<7:0> to and from the controller 10. The input/output circuit 22 transmits the command and the address in the signal IO<7:0> to the register 24. The input/output circuit 22 transmits and receives write data and read data to/from the sense amplifier module 28.

The logic control circuit 23 receives the signals /CE, CLE, ALE, /WE, and /RE from the controller 10. Further, the logic control circuit 23 transmits the signal /RB to the controller 10.

The register 24 stores the command and the address. The register 24 transmits the address to the row decoder module 27 and the sense amplifier module 28, and transmits the command to the sequencer 25.

The sequencer 25 receives the command, and controls the entire NAND memory 20 according to a sequence which is based on the received command.

The voltage generation circuit 26 generates voltage required for the operations such as write, read, erase or the like of data based on an instruction from the sequencer 25. The voltage generation circuit 26 supplies the generated voltage to the memory cell array 21, the row decoder module 27, and the sense amplifier module 28.

The row decoder module 27 receives a row address in the address from the register 24, and selects the block BLK based on the row address. In addition, the voltage from the voltage generation circuit 26 is transmitted to the selected block BLK via the row decoder module 27.

During a data read operation, the sense amplifier module 28 senses data read from a memory cell transistor to the bit line, and transmits the sensed data to the input/output circuit 22. During a data write operation, the sense amplifier module 28 transmits write data through the bit line to the memory cell transistor. Further, the sense amplifier module 28 receives a column address in the address from the register 24, and outputs data of a column based on the column address.

1.1.5 Configuration of Memory Cell Array

Figure 4:
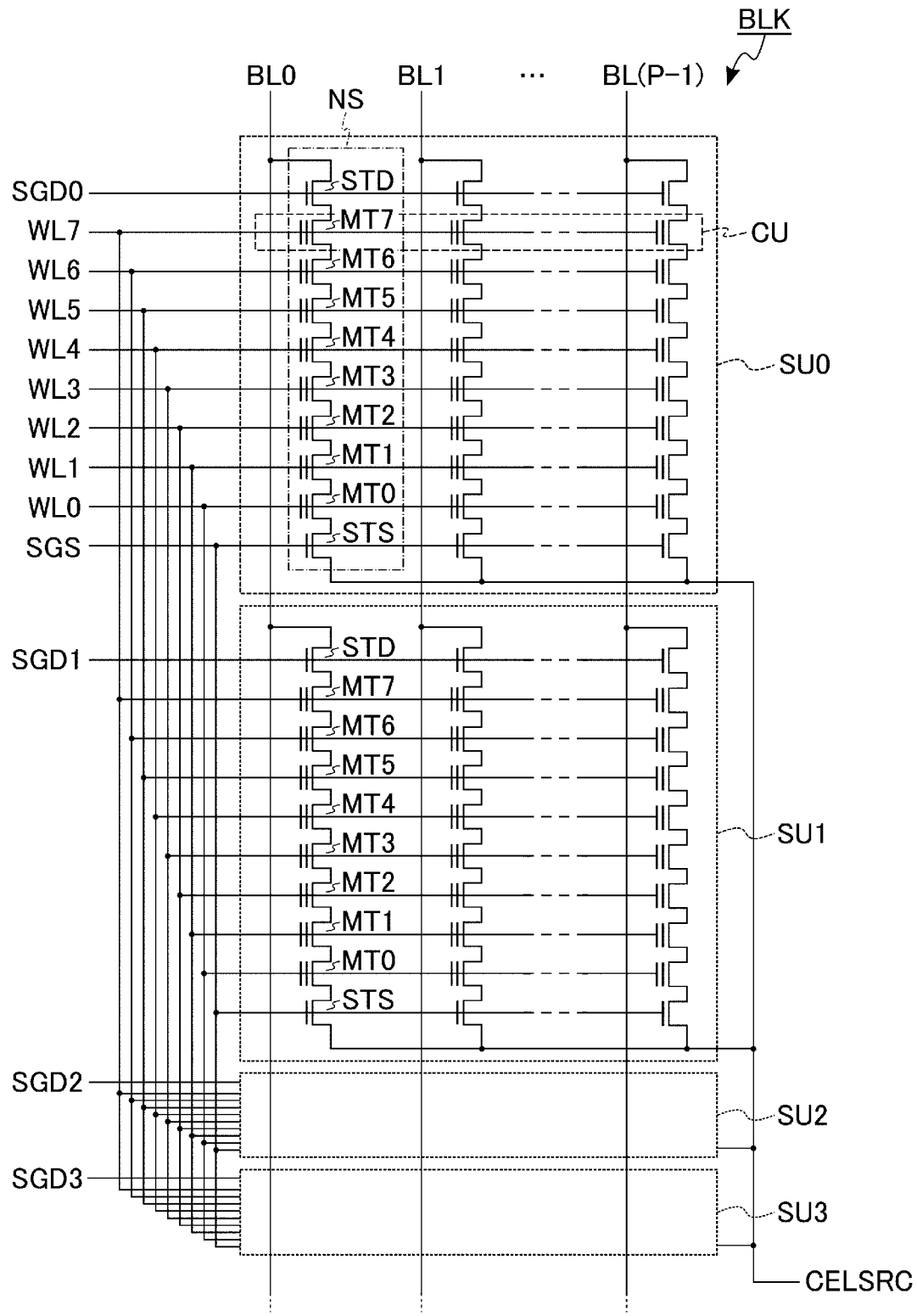
FIG. 4 is a circuit diagram illustrating an example of a configuration of a block in a memory cell array of the NAND memory according to the embodiment.

Next, the configuration of each block BLK in the memory cell array 21 of the NAND memory 20 according to the embodiment will be described with reference to FIG. 4. FIG. 4 is a circuit diagram illustrating an example of the configuration of the block in the memory cell array of the NAND memory according to the embodiment.

The block BLK includes, for example, four string units SU (SU0, SU1, SU2, and SU3). Each string unit SU includes a plurality of NAND strings NS.

Each NAND string NS includes, for example, eight memory cell transistors MT (MT0 to MT7), a select transistor STD, and a select transistor STS. Note that the number of memory cell transistors MT per NAND string NS is not limited to eight. Each memory cell transistor MT includes a stacked gate including a control gate and a charge storage layer. The respective memory cell transistors MT are connected in series between the select transistors STD and STS. Note that, in the following description, the term "connection" also includes a case where another electrically conductive element is interposed.

In a certain block BLK, the gates of the select transistors STD of the string units SU0 to SU3 are connected to select gate lines SGD0 to SGD3, respectively. Further, the gates of the select transistors STS of all the string units SU in the block BLK are commonly connected to a select gate line SGS. The control gates of the memory cell transistors MT0 to MT7 in the same block BLK are connected to word lines WL0 to WL7, respectively. That is, a word line WL of the same address is commonly connected to all of the string units SU in the same block BLK, and the select gate line SGS is commonly connected to all of the string units SU in the same block BLK. Meanwhile, one select gate line SGD is connected to only one of the string units SU in the same block BLK.

Further, among the NAND strings NS arranged in a matrix shape in the memory cell array 21, the other end of the select transistor STD of the NAND string NS in the same row is connected to any one of p bit-lines BL (BL0 to BL(p−1)). The number p is a natural number. In addition, the bit line BL is commonly connected to the NAND strings NS of the same column across the plurality of blocks BLK.

Further, the other end of the select transistor STS is connected to a source line CELSRC. The source line CELSRC is commonly connected to the plurality of NAND strings NS across the plurality of blocks BLK.

As described above, for example, data are collectively erased for the memory cell transistors MT in the same block BLK. In contrast, data may be collectively read and written for the plurality of memory cell transistors MT commonly connected to any one word line WL in any string unit SU of any block BLK. Such a set of memory cell transistors MT sharing the word line WL in one string unit SU will be referred to as, for example, a cell unit CU. That is, the cell unit CU is a set of the memory cell transistors MT in which a write or read operation is collectively executed. The cell unit CU corresponds to, for example, one storage area or a set of a plurality of storage areas. The write or read operation for one cell unit CU is executed for one of the storage areas. The unit of such a storage area will be referred to as a "page".

1.1.6 Threshold Distribution of Memory Cell Transistor

Figure 5:
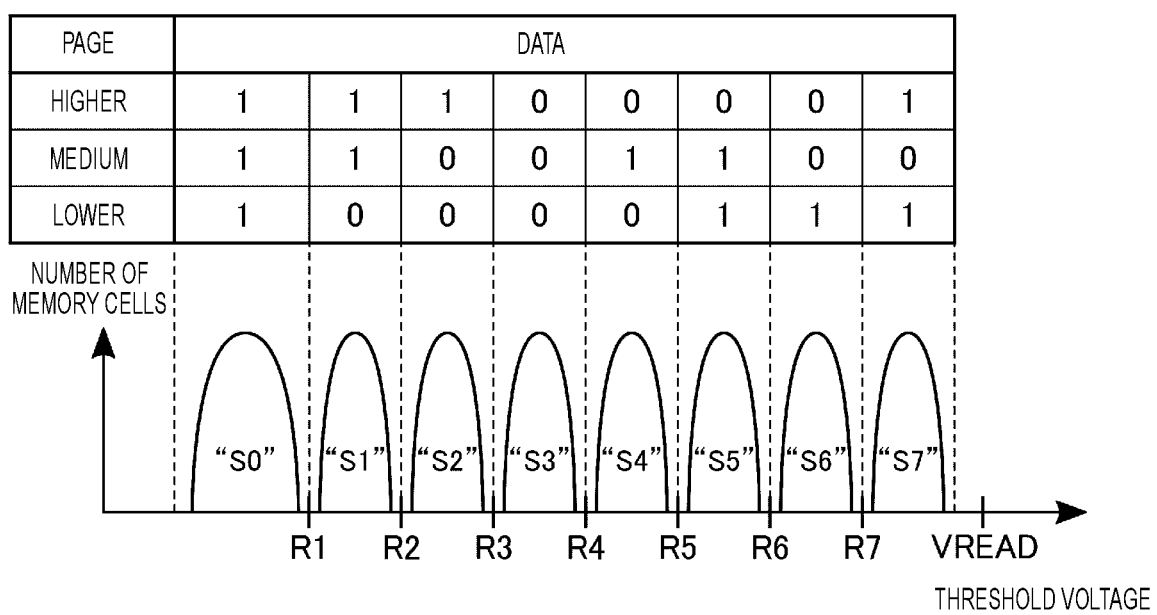
FIG. 5 is a view illustrating a threshold voltage distribution of memory cell transistors in the NAND memory according to the embodiment.

The threshold voltage distribution of the memory cell transistors MT of the NAND memory 20 according to the embodiment will be described with reference to FIG. 5. FIG. 5 is a view illustrating the threshold voltage distribution of the memory cell transistor of the NAND memory according to the embodiment. FIG. 5 illustrates an example of the threshold voltage distribution of the memory cell transistors MT in the NAND memory 20 according to the embodiment. In the threshold voltage distribution illustrated in FIG. 5, the vertical axis corresponds to the number of memory cell transistors MT, and the horizontal axis corresponds to the threshold voltage of the memory cell transistor MT.

As illustrated in FIG. 5, in the NAND memory 20 according to the embodiment, for example, eight threshold voltage distributions are formed by threshold voltages of the plurality of memory cell transistors MT. Hereinafter, the eight threshold voltage distributions will be referred to as an "S0" state, an "S1" state, an "S2" state, an "S3" state, an "S4" state, an "S5" state, an "S6" state, and an "S7" state in an ascending order of the threshold voltage.

The "S0" state corresponds to, for example, an erase state of data. The threshold voltage of the memory cell transistor MT included in the "S0" state is lower than a voltage R1.

The "S1" to "S7" states correspond to a state in which charges are injected into the charge storage layer of the memory cell transistor MT. The threshold voltage of the memory cell transistor MT included in the "S1" state is equal to or higher than the voltage R1 and lower than a voltage R2 (R2>R1). The threshold voltage of the memory cell transistor MT included in the "S2" state is equal to or higher than the voltage R2 and lower than a voltage R3 (R3>R2). The threshold voltage of the memory cell transistor MT included in the "S3" state is equal to or higher than the voltage R3 and lower than a voltage R4 (R4>R3). The threshold voltage of the memory cell transistor MT included in the "S4" state is equal to or higher than the voltage R4 and lower than a voltage R5 (R5>R4). The threshold voltage of the memory cell transistor MT included in the "S5" state is equal to or higher than the voltage R5 and lower than a voltage R6 (R6>R5). The threshold voltage of the memory cell transistor MT included in the "S6" state is equal to or higher than the voltage R6 and lower than a voltage R7 (R7>R6). The threshold voltage of the memory cell transistor MT included in the "S7" state is equal to or higher than the voltage R7 and lower than a voltage VREAD (VREAD>R7). The voltage VREAD is a voltage for turning ON the memory cell transistor MT when applied to the control gate of the memory cell transistor MT, regardless of whether the threshold voltage of the memory cell transistor MT belongs to any of the "S0" state to the "S7" state.

When a voltage is applied to the control gate of the memory cell transistor MT, the memory cell transistor MT is turned ON if the memory cell transistor MT has a threshold voltage lower than the applied voltage. When a voltage is applied to the control gate, the memory cell transistor MT is turned OFF if the memory cell transistor MT has a threshold voltage equal to or higher than the applied voltage.

Different 3-bit data are assigned to the eight threshold voltage distributions of the memory cell transistor MT described above, respectively. An example of the data assigned to the threshold voltage distribution is listed below. The data assigned to each state is represented in an order of "a higher bit, a medium bit, and a lower bit" in association with the corresponding state.

"S0" state: "1, 1, 1" data
"S1" state: "1, 1, 0" data
"S2" state: "1, 0, 0" data
"S3" state: "0, 0, 0" data
"S4" state: "0, 1, 0" data
"S5" state: "0, 1, 1" data
"S6" state: "0, 0, 1" data
"S7" state: "1, 0, 1" data In the above data assignment, 1-page data configured with the lower bits (lower page data) are determined by read operations using the voltages R1 and R5, respectively. The 1-page data configured with the medium bits (medium page data) is determined by read operations using the voltages R2, R4, and R6, respectively. The 1-page data configured with the higher bits (higher page data) are determined by read operations using the voltages R3 and R7, respectively.

1.2 Operation

An operation of the memory system 1 according to the embodiment will be described. Note that, in the descriptions of the memory system 1 according to the embodiment, a case where the read operation is executed using a read voltage of any one of the voltages R1 to R7 will be taken as an example, in order to simplify the description.

1.2.1 Shift Read Operation

Figure 6A:
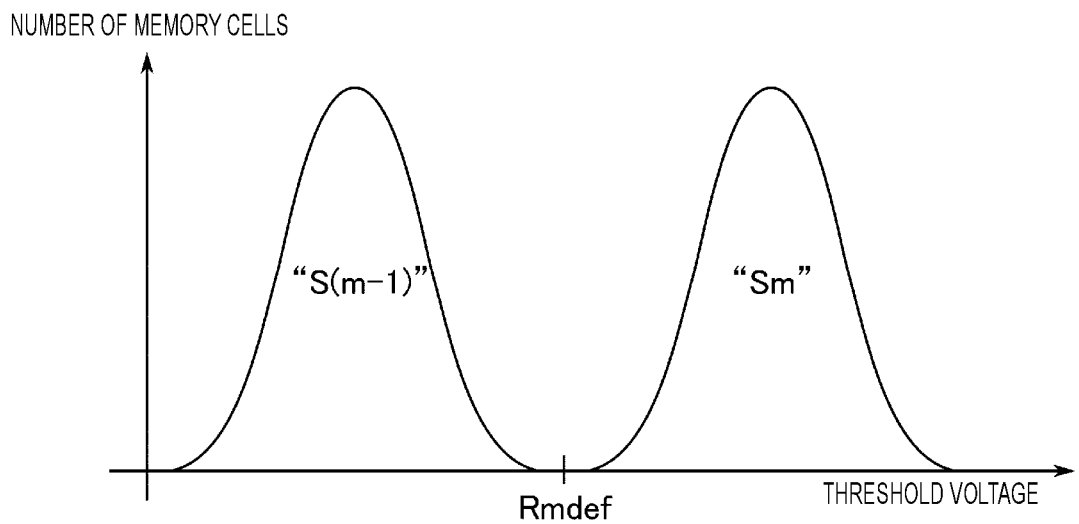
FIGS. 6A and 6B are views illustrating a shift read operation executed in the memory system according to the embodiment.
Figure 6B:
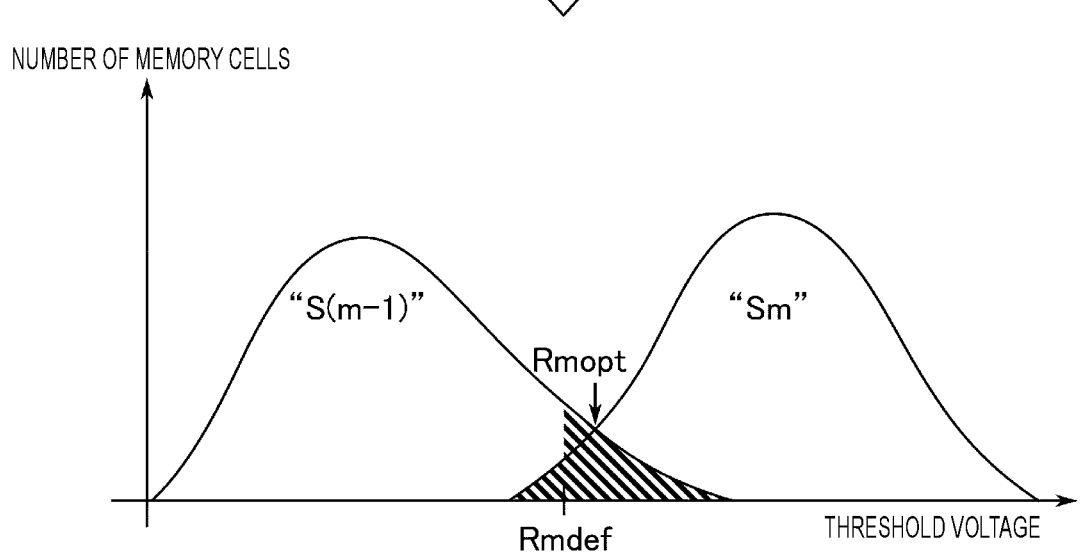

First, a shift read operation executed in the memory system 1 according to the embodiment will be described with reference to FIGS. 6A and 6B. FIGS. 6A and 6B are views illustrating the shift read operation executed in the memory system according to the embodiment. The shift read operation is executed, for example, when data cannot be correctly determined which data is read with a default read voltage.

As illustrated in FIG. 6A, immediately after a write operation, the threshold voltage distribution of a state "S(m−1)" (m represents an integer 1 or more and 7 or less) and that of a state "Sm" are separated from each other. Accordingly, the controller 10 sets a read voltage Rm to a default read voltage Rmdef between the threshold voltage distributions of the states "S(m−1)" and "Sm", so that data can be correctly read.

However, due to factors such as disturb or the like, the threshold voltage of the memory cell transistors MT may fluctuate. As a result, a distribution width of the threshold voltage of each state may be widened, or a mode value (i.e., most frequently appearing value) of the threshold voltage distribution of each state may change. As a result, as illustrated in FIG. 6B, adjacent distributions may overlap with each other. When adjacent distributions overlap with each other, data different from those at the time of the write operation is read from a memory cell transistor MT, which corresponds to the diagonal line portion in FIG. 6B, when the read operation is performed with the read voltage Rmdef. More specifically, in the threshold voltage distribution of the state "S(m−1)", data of the memory cell transistor MT having a threshold voltage equal to or higher than the read voltage Rmdef becomes an error bit. Further, in the threshold voltage distribution of the state "Sm", read data of the memory cell transistor MT having a threshold voltage lower than the read voltage Rmdef becomes an error bit. In addition, when the number of error bits exceeds the number of correctable error bits of the ECC circuit 16, the data cannot be corrected.

When the error bit number (i.e., the number of bit errors) is relatively large, the controller 10 sets a voltage with which the error bit number decreases (e.g., a read voltage Rmopt in FIG. 6B) as a new read voltage Rm. The read voltage Rmopt is, for example, higher than the read voltage Rmdef.

As such, the shift read operation is a read operation performed by setting a voltage obtained by shifting the default read voltage Rmdef by a certain voltage as the read voltage Rm.

1.2.2 Overall Operation

Next, an overall operation including the threshold voltage tracking process of the memory system 1 according to the embodiment will be described.

To minimize the error bit number, it is desirable to perform the shift read operation with the optimal read voltage Rmopt in which the area of the diagonal line portion in FIG. 6B becomes the minimum. In the following description, "opt" will be attached to the end of the optimal read voltage of each state.

Hereinafter, the threshold voltage tracking process which is one of operations for searching for the optimal read voltage Rmopt (R1*opt* to R7*opt*) will be described jointly with an overall operation including the threshold voltage tracking process.

1.2.2.1 Flow of Overall Operation

Figure 7:
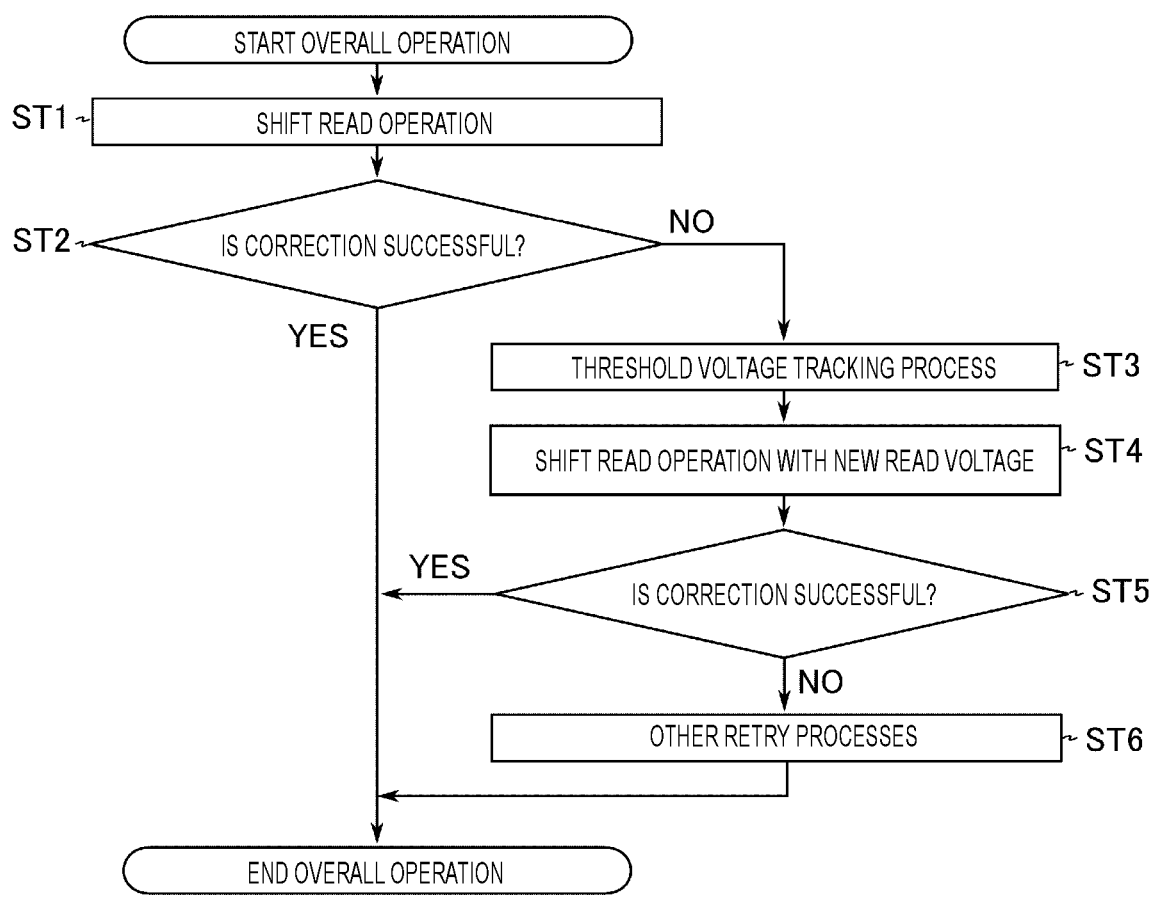
FIG. 7 is a flowchart illustrating a flow of an overall operation of the memory system according to the embodiment.

The flow of the overall operation including the threshold voltage tracking process executed in the memory system 1 according to the embodiment will be described with reference to FIG. 7. FIG. 7 is a flowchart illustrating the flow of the overall operation of the memory system according to the embodiment.

When the error bit number detected in the read operation performed with the default read voltage Rmdef exceeds the number of error-correctable bits, the controller 10 executes the shift read operation using a read voltage Rmasm shifted from the default read voltage Rmdef (ST1). The read control unit 102 issues a read command for executing the read operation using the read voltage Rmasm in the NAND memory 20. The NAND memory 20 executes the read operation (the shift read operation in FIG. 7) based on the read command, and transmits the read data to the controller 10. In the following description, "asm" is attached to the end of the read voltage of each state with respect to the read voltage used for the shift read operation of ST1.

The ECC circuit 16 performs the error detection and error correction processes. In addition, the controller 10 determines whether the error correction is successful (ST2). When it is determined that the error correction is successful (ST2; YES), the controller 10 acquires a status in which the error correction is successful, and terminates the operation. When it is determined that the error correction is unsuccessful (ST2; NO), the process proceeds to ST3.

The controller 10 performs the threshold voltage tracking process to determine the new read voltage Rm with which the error bit number is reduced (ST3). Details of the threshold voltage tracking process will be described later.

The controller 10 executes the shift read operation using the determined new read voltage Rm (ST4). The read control unit 102 issues a read command for executing the shift read operation using the new read voltage Rm in the NAND memory 20. The NAND memory 20 executes the shift read operation based on the read command, and transmits the read data to the controller 10.

The ECC circuit 16 performs the error detection and error correction processes. Then, the controller 10 determines whether the error correction is successful (ST5). When it is determined that the error correction is successful (ST5; YES), the controller 10 acquires the status in which the error correction is successful, and terminates the operation. When it is determined that the error correction is unsuccessful (ST5; NO), the process proceeds to ST6.

When it is determined that the error correction is unsuccessful (ST5; NO), the controller 10 executes other retry processes (ST6).

The overall operation is terminated by the above operation.

1.2.2.2 Threshold Voltage Tracking Process

Figure 8:
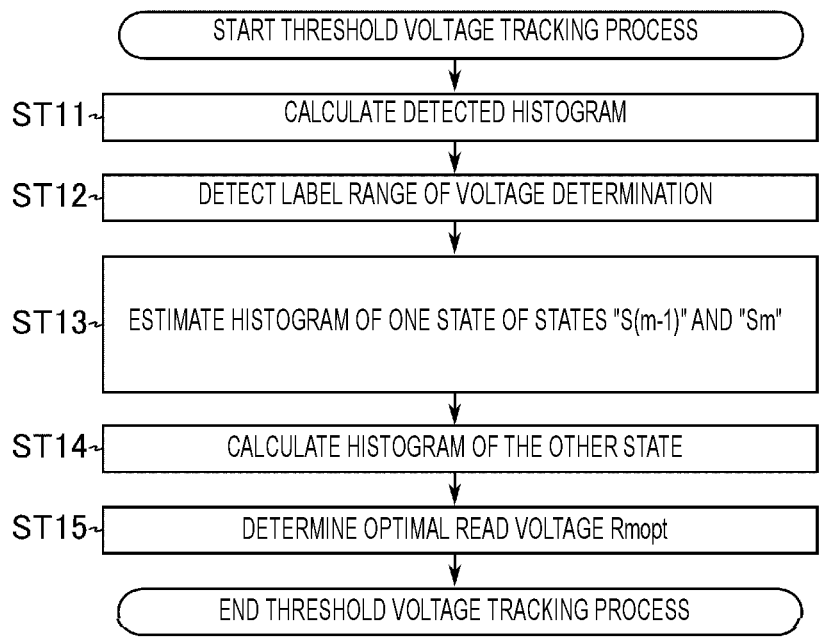
FIG. 8 is a flowchart illustrating a flow of a threshold voltage tracking process executed in the memory system according to the embodiment.

The flow of the threshold voltage tracking process (ST3) executed in the memory system 1 according to the embodiment will be described with reference to FIG. 8. FIG. 8 is a flowchart illustrating the flow of the threshold voltage tracking process executed in the memory system according to the embodiment.

The controller 10 calculates a detected histogram $h_d$ in a valley area of the threshold voltage distributions of the states S(m−1) and "Sm" (ST11). Hereinafter, the process of ST11 will also be referred to as a calculation process of a detected histogram. Here, the valley area is a range of voltages centering on the read voltage Rmasm. The detected histogram $h_d$ is a histogram (e.g., a distribution diagram) of the number of memory cell transistors MT (the number of on-cells) in which the threshold voltage belongs to each of a plurality of voltage ranges included in the valley area. As described above, each voltage range is identified by a label. Details of the calculation process of the detected histogram will be described later.

The tracking control unit 101 detects a range of the label to be used when determining the optimal read voltage Rmopt (hereinafter, simply referred to as a label range of voltage determination) by using the detected histogram $h_d$ (ST12). Hereinafter, the process of ST12 will also be referred to as a detection process of the label range of the voltage determination. Details of the detection process of the label range of the voltage determination will be described later.

The tracking control unit 101 estimates a histogram (referred to herein as a first histogram) corresponding to one of the states "S(m−1)" and "Sm" (ST13). Hereinafter, the process of ST13 will also be referred to as an estimation process of the first histogram. Here, the histogram corresponding to each state is a histogram configured with the memory cell transistors MT which belong to the state immediately after a write operation (i.e., the memory cell transistors MT which are programmed to have the threshold voltage corresponding to the state). Further, in the following description, the memory cell transistor MT which belongs to each state immediately after a write operation will simply be referred to as the memory cell transistor MT which belongs to the state.

As illustrated in FIG. 6B, some memory cell transistors MT among the plurality of memory cell transistors MT which belongs to the state "S(m−1)" may have a threshold voltage higher than the default read voltage Rmdef due to the disturb or the like. In the embodiment, the tracking control unit 101 executes the fitting of the detected histogram $h_d$ regarding a low voltage-side range in the detected label range of the voltage determination, to estimate a histogram $h_{(m−1)}$ corresponding to the state "S(m−1)". Details of the fitting will be described later. Here, the low voltage-side range is a range of a side including a minimum voltage in a voltage range corresponding to the label range of the voltage determination. Further, in the following description, a range contiguous to the low voltage-side range and including the maximum voltage in the voltage range corresponding to the label range of the voltage determination will be referred to as a high voltage-side range.

Here, a ratio of A which is the number of memory cell transistors MT which belong to the state "S(m−1)" and have a certain threshold voltage, and B which is the number of memory cell transistors MT which belong to the state "Sm" and have the same certain threshold voltage will be referred to as an overlap value in the threshold voltage. It is noted that the overlap value does not exceed 1. That is, when A B, the overlap value is B/A. When A<B, the overlap value is A/B. In the case of A=B, the overlap value becomes the maximum. Further, an average value of the overlap values in a certain range of threshold voltages will be referred to as an overlap of the respective threshold voltage distributions of the states "Sm" and "S(m−1)". Further, in the following description, the overlap of the respective threshold voltage distributions of the states "Sm" and "S (m−1)" will also be simply referred to as the overlap of the threshold voltage distributions.

In the embodiment, it is assumed that the overlap of the threshold voltage distributions is smaller in the low voltage-side range than that in the high voltage-side range. In the embodiment, the first histogram is the histogram $h_{(m−1)}$.

Referring back to FIG. 8, the tracking control unit 101 calculates a histogram (referred to herein as a second histogram) corresponding to the other state of the states "S(m−1)" and "Sm" based on the estimated histogram $h_{(m−1)}$ and the detected histogram $h_d$ (ST14). Hereinafter, the process of ST14 will also be referred to as a calculation process of the second histogram. In the embodiment, the tracking control unit 101 calculates a histogram $h_m$ corresponding to the state "Sm". That is, the second histogram in the embodiment is the histogram $h_m$.

In addition, the tracking control unit 101 determines the optimal read voltage Rmopt as the new read voltage Rm, by using the histograms $h_{(m−1)}$ and $h_m$ (ST15). Hereinafter, the process of ST15 will also be referred to as a determination process of the optimal read voltage.

With the operation described above, the threshold voltage tracking process is terminated.

1.2.2.2.1 Calculation Process of Detected Histogram

Figure 9:
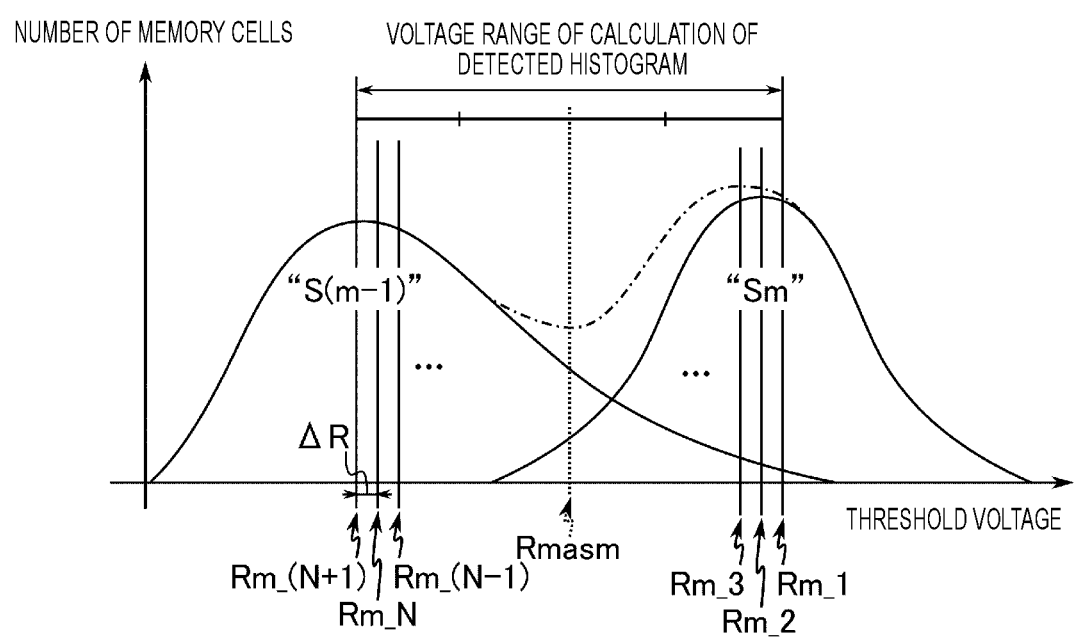
FIG. 9 is a view illustrating an outline of a calculation process of a detected histogram executed in the memory system according to the embodiment.

An outline of the calculation process (ST11) of the detected histogram executed in the memory system 1 according to the embodiment will be described with reference to FIG. 9. FIG. 9 is a view illustrating an outline of the calculation process of a detected histogram executed in the memory system according to the embodiment.

In the calculation process of the detected histogram, the controller 10 calculates the histogram of the number of on-cells corresponding to a threshold voltage distribution (represented by an alternate long-and-short dash line in FIG. 9) in which the respective threshold voltage distributions of the states "S(m−1)" and "Sm" overlap with each other.

Specifically, the tracking control unit 101 sets a range which is higher than a voltage Rm_(N+1) (<Rmasm) and equal to or lower than a voltage Rm_1 (>Rmasm) (referred to as a voltage range of calculation of the detected histogram), centering on the read voltage Rmasm used in the shift read operation ST1, as a voltage range sufficiently including a valley area between two states. The "N" is a positive integer. The voltage range of the calculation of the detected histogram is wider than, for example, the voltage range corresponding to the label range of the voltage determination.

The tracking control unit 101 divides the voltage range of the calculation of the detected histogram into continuous N voltage ranges which each have a voltage range ΔR. That is, the tracking control unit 101 divides the voltage range of the calculation of the detected histogram into N voltage ranges including a range which is higher than a voltage Rm_(N+1) and equal to or lower than a voltage Rm_N, a range which is higher than the voltage Rm_N and equal to or lower than a voltage Rm_(N−1), . . . , a range which is higher than a voltage Rm_3 and equal to or lower than a voltage Rm_2, and a range which is higher than the voltage Rm_2 and equal to or lower than a voltage Rm_1. Here, Rm_N=Rm_(N+1)+ΔR, Rm_(N−1)=Rm_N+ΔR, Rm_2=Rm_3+ΔR, and Rm_1=Rm_2+ΔR.

The controller 10 executes a plurality of shift read operations with the respective voltages Rm_(N+1), Rm_N, . . . , Rm_2, and Rm_1. In addition, the label generation unit 103 detects, based on data read by the plurality of shift read operations, to which the threshold voltage of each memory cell transistor MT belongs in (N+2) voltage ranges, that is, in a voltage range among the N voltage ranges, in a voltage range which is equal to or lower than the voltage Rm_(N+1), and in a voltage range which is higher than the voltage Rm_1. In addition, the label generation unit 103 generates the label of each memory cell transistor MT based on the detection result.

The histogram calculation unit 104 calculates the number of on-cells in each of the (N+2) voltage ranges based on the generated label of each memory cell transistor MT.

Hereinafter, the calculation process of the detected histogram will be described in more detail.

(Flow of Calculation Process of Detected Histogram)

Figure 10:
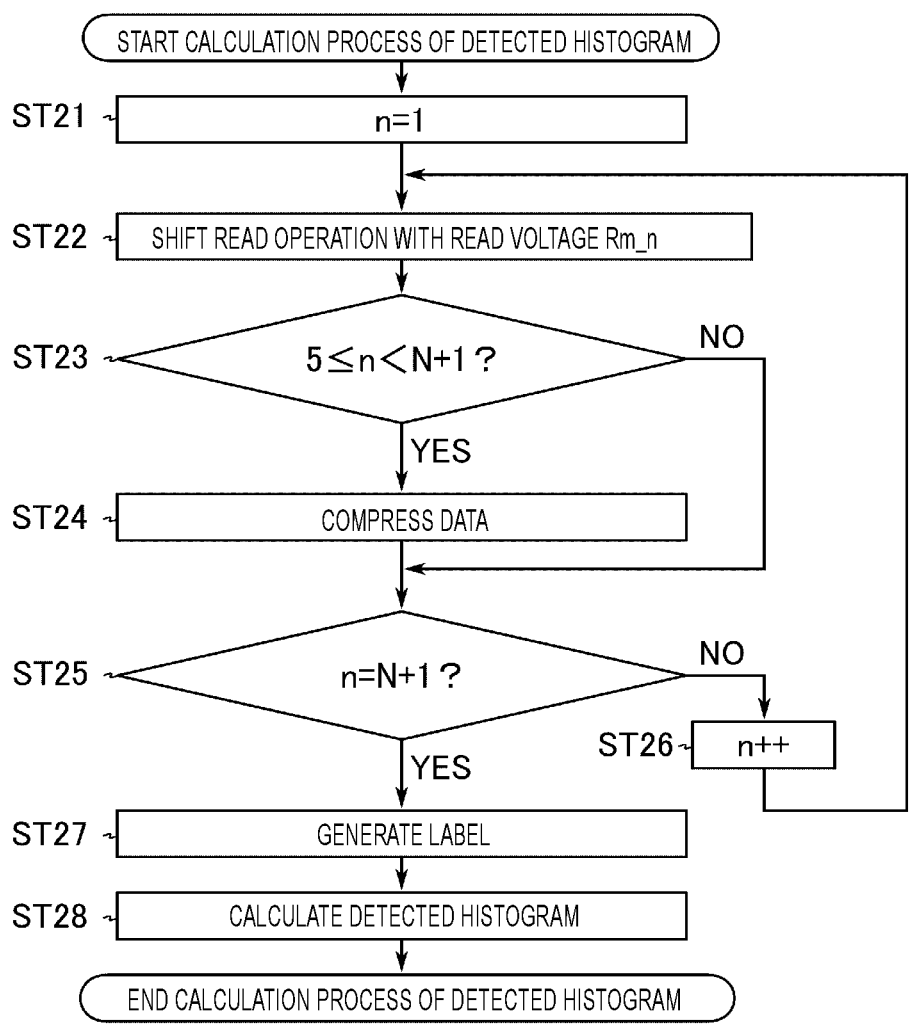
FIG. 10 is a flowchart illustrating a flow of the calculation process of the detected histogram executed in the memory system according to the embodiment.

The flow of the calculation process of the detected histogram executed in the memory system 1 according to the embodiment will be described with reference to FIG. 10. FIG. 10 is a flowchart illustrating the flow of the calculation process of the detected histogram executed in the memory system according to the embodiment.

In ST21, the tracking control unit 101 sets a variable "n" to 1 (n=1). Here, "n" is an integer which is equal to or more than 1 and equal to or less than (N+1), and is a variable used for a loop process in the calculation process of the detected histogram.

The controller 10 performs the shift read operation using the read voltage Rm_n (ST22). The read control unit 102 issues a read command for executing the shift read operation using the read voltage Rm_n in the NAND memory 20. The NAND memory 20 executes the shift read operation based on the read command, and transmits 1-bit read data per memory cell transistor MT to the controller 10. The controller 10 stores the read data, for example, in the embedded memory 12.

The tracking control unit 101 determines whether the variable "n" is equal to or larger than 5 and smaller than (N+1) (ST23). When it is determined that the variable "n" is equal to or larger than 5 and smaller than (N+1) (ST23; YES), the process proceeds to ST24. When it is determined that the variable "n" is equal to or larger than (N+1) or smaller than 5 P (ST23; NO), the process proceeds to ST25.

The label generation unit 103 performs a compression of data based on the read data in a plurality of (5 times or more) shift read operations executed using a read voltage of Rm_1 or more and Rm_n or less (ST24). Note that, the process of ST24 is optional and so the label generation unit 103 may not be performing the process of ST24.

The tracking control unit 101 determines whether the variable "n" is (N+1) (ST25). When it is determined that the variable "n" is (N+1) (ST25; YES), the process proceeds to ST27. When it is determined that the variable "n" is less than (N+1) (ST25; NO), the process proceeds to ST26.

The tracking control unit 101 increments the variable "n" (ST26), and the process proceeds to ST22. As described above, the controller 10 repeats the processes of ST22 to ST26 until the tracking control unit 101 determines that the variable "n" is (N+1) (ST25; YES).

The label generation unit 103 generates the label corresponding to each memory cell transistor MT, based on (N+1)-bit read data of each memory cell transistor MT obtained by the loop process of ST22 to ST26 (ST27). Details of the label generation will be described later.

The histogram calculation unit 104 calculates the detected histogram $h_d$ by using the generated label (ST28). Details of the calculated result of the detected histogram $h_d$ will be described later.

With the operation described above, the calculation process of the detected histogram $h_d$ is terminated.

Further, the label generation unit 103 may compress (N+1)-bit read data obtained by (N+1) read operations into 5 bit-width data, by executing a plurality of times the compression process of the data (ST24) in each loop process of ST22 to ST26. The label generation unit 103 compresses the (N+1)-bit read data into the 5 bit-width data by using (N−4) compressed-data tables stored in, for example, the embedded memory 12. The (N−4) compressed-data tables correspond to a fifth loop process (n=5) to an Nth loop process (n=N), respectively. Each compressed-data table is a table that associates the 5 bit-width data in the loop process with compressed 4 bit-width data corresponding to the data.

More specifically, in the fifth loop process, the label generation unit 103 compresses read data (5 bit-width data) in the first to fifth loop processes into 4 bit-width data by using the compressed-data table corresponding to the fifth loop process. Similarly, in an nth loop process, the label generation unit 103 compresses 4 bit-width data compressed in an (n−1)th loop process and read data in the nth loop process, by using the compressed-data table corresponding to the nth loop process, into 4 bit-width data. Note that, the label generation unit 103 does not execute the compression process of data in the last (N+1)th loop process (n=(N+1)). That is, in the (N+1)th loop process, the label generation unit 103 obtains the 5 bit-width data from the 4 bit-width data compressed in the Nth loop process and the read data in the (N+1)th loop process.

By the sequential compression of data based on the loop process, the label generation unit 103 may compress the (N+1)-bit read data into the 5 bit-width data. More specifically, the label generation unit 103 compresses N-bit read data into 4 bit-width data, and adds the 4 bit-width data and the read data in the last (N+1)th loop process (n=(N+1)), thereby making the (N+1)-bit read data into the 5 bit-width data.

(Calculation of Histogram)

Figure 11:
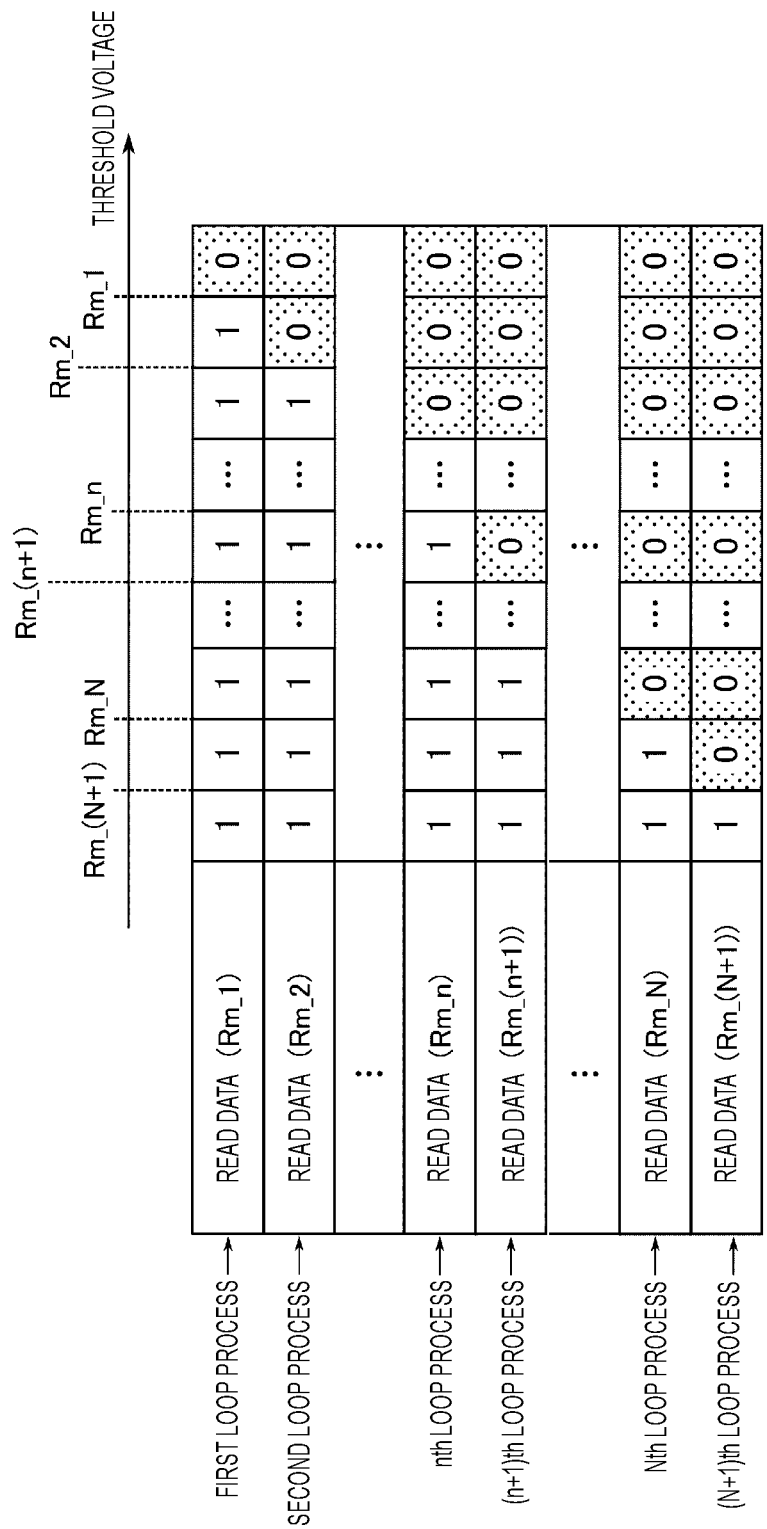
FIG. 11 is a view illustrating a generation of a label using read data executed in the memory system according to the embodiment.

The generation of the label used when the detected histogram $h_d$ is calculated (ST27) will be described in more detail with reference to FIG. 11. FIG. 11 is a view illustrating the generation of the label using the read data executed in the memory system according to the embodiment.

In the table illustrated in FIG. 11, in each row, the read data which may be read from the memory cell transistor MT in the loop process corresponding to the relevant row is arranged. The respective read data in a first loop process, a second loop process, . . . , an Nth loop process, and an (N+1)th loop process are arranged in this order in a row direction. Further, in each column, the read data of the memory cell transistor MT having the threshold voltage included in a voltage range corresponding to the same column is arranged. The read data of the memory cell transistor MT having the threshold voltages included in a voltage range which is equal to or lower than the voltage Rm_(N+1), a voltage range which is higher than the voltage Rm_(N+1) and equal to or lower than the voltage Rm_N, . . . , a voltage range which is higher than the voltage Rm_2 and equal to or lower than the voltage Rm_1, and a voltage range which is higher than the voltage Rm_1, respectively, are arranged in this order in the column direction.

In the first loop process, the read data (Rm_1) becomes data "1" when the threshold voltage of the memory cell transistor MT is equal to or lower than the voltage Rm_1, and data "0" when the threshold voltage of the memory cell transistor MT is higher than the voltage Rm_1.

Further, in the second loop process, the read data (Rm_2) becomes data "1" when the threshold voltage of the memory cell transistor MT is equal to or lower than the voltage Rm_2, and data "0" when the threshold voltage of the memory cell transistor MT is higher than the voltage Rm_2.

Similarly, in the nth loop process, the read data (Rm_n) becomes data "1" when the threshold voltage of the memory cell transistor MT is equal to or lower than the voltage Rm_n, and data "0" when the threshold voltage of the memory cell transistor MT is higher than the voltage Rm_n. In the (n+1)th loop process, the read data (Rm_(n+1)) becomes data "1" when the threshold voltage of the memory cell transistor MT is equal to or lower than the voltage (Rm_(n+1)), and data "0" when the threshold voltage of the memory cell transistor MT is higher than the voltage (Rm_(n+1)).

As described above, in the voltage range (Rm_(N+1) to Rm_1) of the calculation of the detected histogram, when the threshold voltage of the memory cell transistor MT is higher than the voltage Rm_(n+1) and equal to or lower than the voltage Rm_n, the read data becomes data "1" in the first loop process to the nth loop process, and the read data becomes data "0" in the (n+1)th loop process to the (N+1)th loop process. As such, when the threshold voltage of the memory cell transistor MT is in the voltage range of the calculation of the detected histogram, it is detected that the read data which become data "1" in the previous loop process changes to data "0" in a certain loop process among the (N+1) loop processes.

Further, when the threshold voltage of the memory cell transistor MT is equal to or lower than the voltage Rm_(N+1), the read data becomes data "1" in all of the loop processes.

Further, when the threshold voltage of the memory cell transistor MT is higher than the voltage Rm_1, the read data becomes data "0" in all of the loop processes.

From the above, the label generation unit 103 may detect in which voltage range of the (N+2) voltage ranges the threshold voltage of the memory cell transistor MT is included, based on the read data (Rm_1) to the read data (Rm_(N+1)). The label generation unit 103 generates the label corresponding to the detected voltage range, as the label of the memory cell transistor MT. Labels corresponding to the (N+2) voltage ranges, respectively, will be described later.

Figure 12:
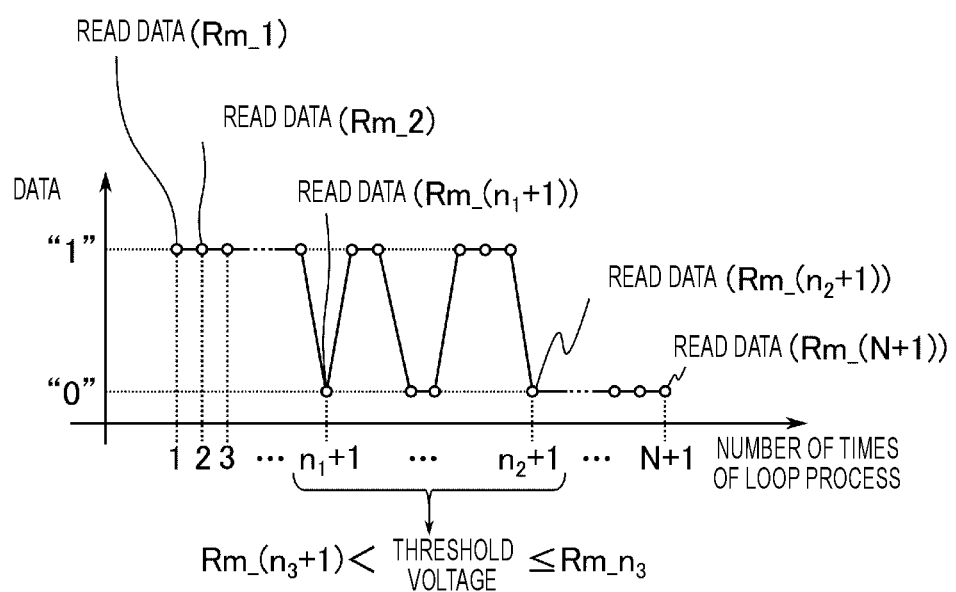
FIG. 12 is a view illustrating an example of a case where read data from a memory cell transistor shows a plurality of changes during loop processes according to the embodiment.

Further, when the threshold voltage of the memory cell transistor MT is in the voltage range of the calculation of the detected histogram, the read data from each memory cell transistor MT obtained by the loop processes of ST22 to ST26 may show a plurality of changes (a change from data "1" to data "0" and a change from data "0" to data "1" as illustrated in FIG. 12) due to noise caused by the read operation as in the example illustrated in FIG. 12. FIG. 12 is a view illustrating an example of a case where the read data from the memory cell transistor MT shows a plurality of changes in the loop processes according to the embodiment.

In this case, the label generation unit 103 estimates a true change of the read data based on, for example, the loop process number ($n_1$+1) at which the read data initially represents data "0", and the loop process number ($n_2$+1) at which the read data changes from data "1" to data "0" last. Here, $n_1$ is an integer which is equal to or more than 1 and equal to or less than (N−2). The $n_2$ is an integer which is equal to or more than 3 and equal to or less than N. More specifically, for example, the label generation unit 103 estimates that the read data is data "1" in the first loop process to an $n_3$th loop process, and the read data is data "0" in an ($n_3$+1)th loop process to the (N+1)th loop process. Here, $n_3$ is the maximum integer which is equal to or less than the additive average value (i.e., ($n_1$+$n_2$)/2) of $n_1$ and $n_2$. As a result, the label generation unit 103 detects that the threshold voltage of the memory cell transistor MT is higher than a voltage Rm_($n_3$+1) and equal to or lower than a voltage Rm_$n_3$.

Figure 13:
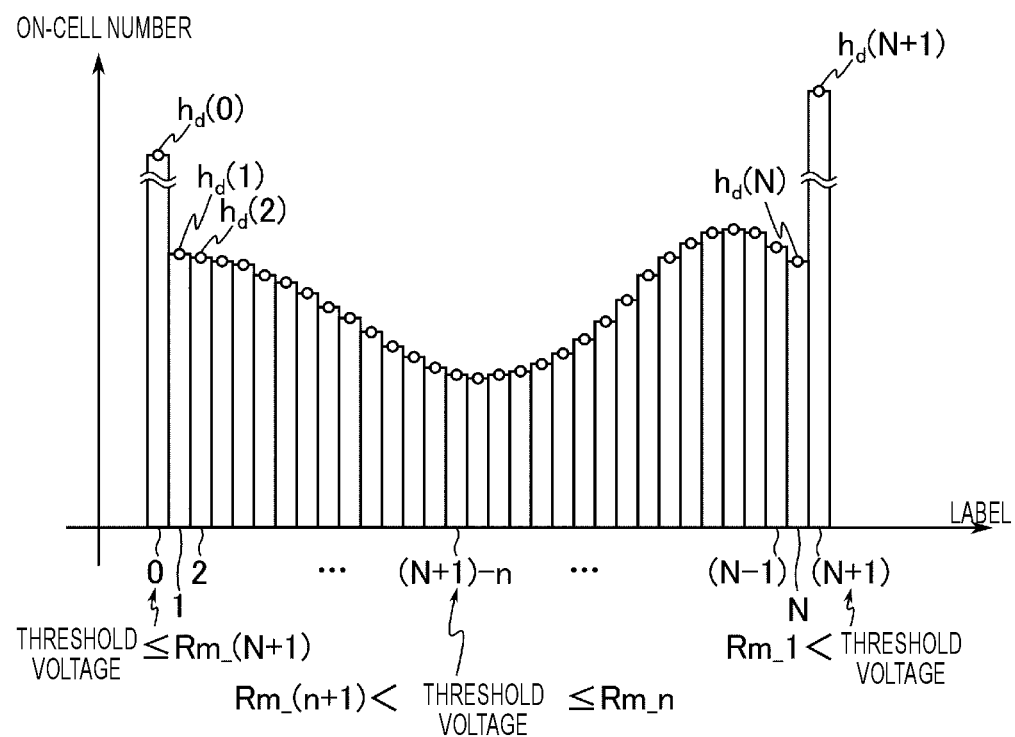
FIG. 13 is a view illustrating a detected histogram calculated by the calculation process executed in the memory system according to the embodiment.

Based on the range of the threshold voltage of each memory cell transistor MT detected as described above, the histogram calculation unit 104 calculates the histogram (detected histogram) $h_d$ of the number of on-cells for a plurality of labels corresponding to the (N+2) voltage ranges illustrated in FIG. 13, respectively. FIG. 13 is a view illustrating the detected histogram generated by the calculation process executed in the memory system according to the embodiment.

Note that, in FIG. 13 and the following description, a label corresponding to the memory cell transistor MT of which the threshold voltage is equal to or lower than the voltage Rm_(N+1) is set to 0, a label corresponding to the memory cell transistor MT of which the threshold voltage is higher than the voltage Rm_(n+1) and equal to or lower than voltage Rm_n is set to ((N+1)−n), and a label corresponding to the memory cell transistor MT of which the threshold voltage is higher than the voltage Rm_1 is set to (N+1). That is, a label "i" (i is an integer which is equal to or more than 0 and equal to or less than (N+1)) is set so that the voltage range of the threshold voltage corresponding to the label "i" becomes a high voltage range with the increase of the label "i".

Further, in the following description, "(i)" is attached to the end of a value of the number of on-cells (and a value of the function) in the label "i". For example, the value of the number of on-cells in the label "i" will be referred to as an on-cell number $h_d(i)$.

In an example of the detected histogram $h_d$ illustrated in FIG. 13, the number of on-cells in the label "0" is $h_d(0)$. That is, the number of memory cell transistors MT of which the threshold voltage is equal to or lower than the voltage Rm_(N+1) is $h_d(0)$. The number of on-cells in the label "1" is $h_d(1)$. That is, the number of memory cell transistors MT of which the threshold voltage is higher than the voltage Rm_(N+1) and equal to or lower than the voltage Rm_N is $h_d(1)$. The number of on-cells in the label "2" is $h_d(2)$. That is, the number of memory cell transistors MT of which the threshold voltage is higher than the voltage Rm_N and equal to or lower than the voltage Rm_(N−1) is $h_d(2)$. The number of on-cells in the label "N" is $h_d(N)$. That is, the number of memory cell transistors MT of which the threshold voltage is higher than the voltage Rm_2 and equal to or lower than the voltage Rm_1 is $h_d(N)$. The number on-cells in the label "(N+1)" is $h_d(N+1)$. That is, the number of memory cell transistors MT of which the threshold voltage is higher than the voltage Rm_1 is $h_d(N+1)$.

1.2.2.2.2 Detection of Label Range of Voltage Determination

Figure 14:
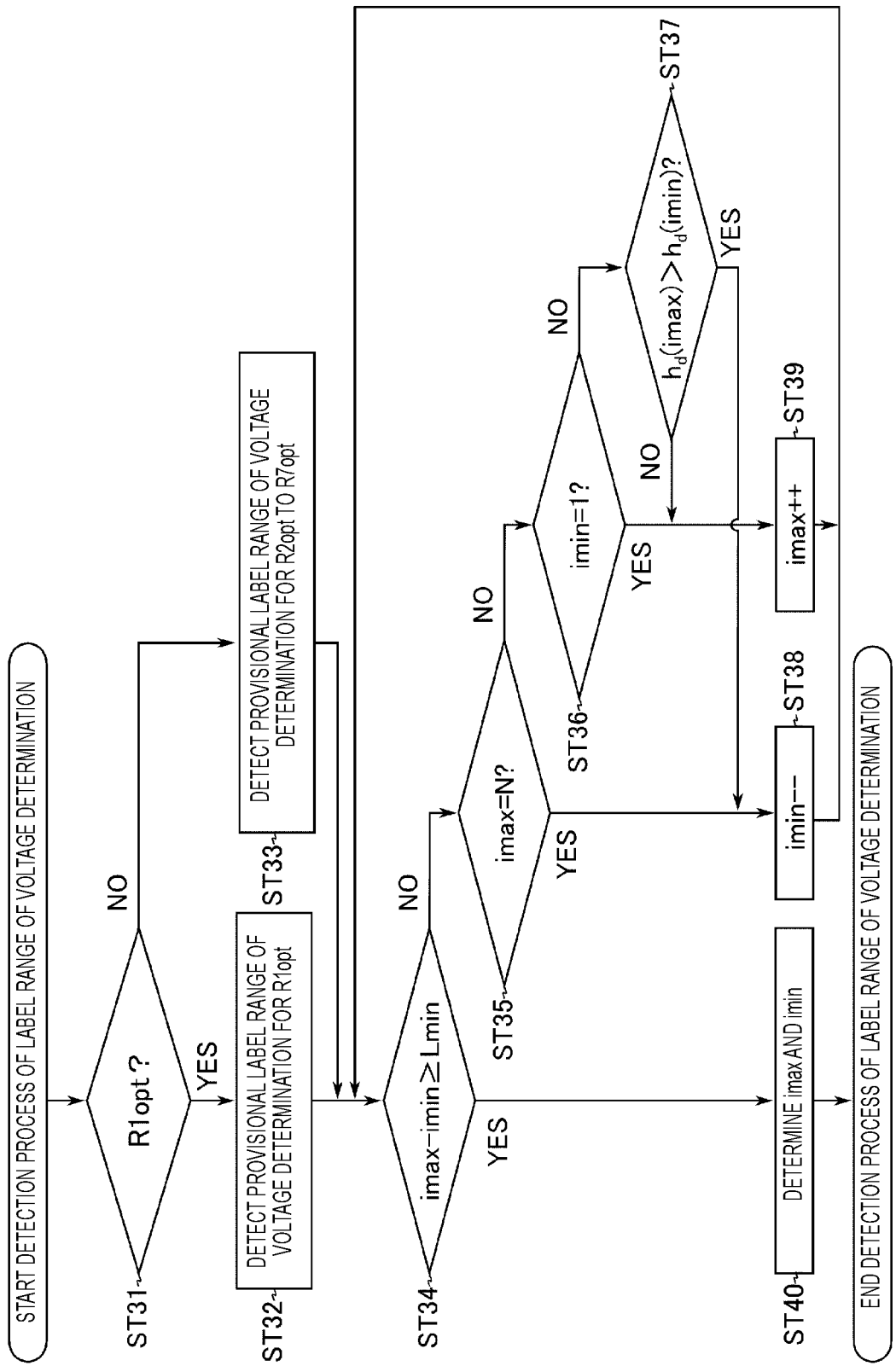
FIG. 14 is a flowchart illustrating an overall flow of a detection process of a label range of voltage determination executed in the memory system according to the embodiment.

The overall flow of the detection process of the label range of the voltage determination (ST12) executed in the memory system 1 according to the embodiment will be described with reference to FIG. 14. FIG. 14 is a flowchart illustrating the overall flow of the detection process of the label range of the voltage determination executed in the memory system according to the embodiment.

In the detection process of the label range of the voltage determination, the controller 10 determines a maximum label imax and a minimum label imin included in the label range of the voltage determination.

In the detection process of the label range of the voltage determination, the controller 10 first detects a provisional label range of the voltage determination according to the optimal read voltage Rmopt to be determined. In addition, the controller 10 sets the provisional label range of the voltage determination as the label range of the voltage determination, when the provisional label range of the voltage determination has a sufficient width to execute the processes of ST13 to ST15. In addition, the controller 10 sets a label range wider than the provisional label range of the voltage determination as the label range of the voltage determination, when the provisional label range of the voltage determination is too narrow to execute the processes of ST13 to ST15. Hereinafter, the overall flow of the detection process of the label range of the voltage determination will be described in more detail.

The tracking control unit 101 determines whether the optimal read voltage to be determined is the read voltage R1opt (ST31). When it is determined that the optimal read voltage to be determined is the read voltage R1opt (ST31; YES), the process proceeds to ST32. When it is determined that the optimal read voltage to be determined is the voltages R2opt to R7opt (ST31; NO), the process proceeds to ST33.

The tracking control unit 101 detects the provisional label range of the voltage determination for the read voltage R1opt (ST32). Here, the provisional label range of the voltage determination for the read voltage R1opt is a label range of provisionally detected voltage determination for the read voltage R1opt. Hereinafter, the process of ST32 will be referred to as a detection process of the provisional label range of the voltage determination for the read voltage R1opt. Then, the process proceeds to ST34. Details of the detection process of the provisional label range of the voltage determination for the read voltage R1opt will be described later.

The tracking control unit 101 detects the provisional label ranges of the voltage determination for the read voltages R2opt to R7opt (ST33). Here, the provisional label ranges of the voltage determination for the read voltages R2opt to R7opt are label ranges of provisionally detected voltage determination for the read voltages R2opt to R7opt, respectively. Hereinafter, the process of ST33 will be referred to as a detection process of the provisional label ranges of the voltage determination for the read voltages R2opt to R7opt. Then, the process proceeds to ST34.

The tracking control unit 101 determines whether a difference (imax−imin) between the maximum label imax and the minimum label imin included in the provisional label range of the voltage determination is equal to or more than Lmin which is a predetermined lower limit value of the label range of the voltage determination (ST34). When it is determined that the difference (imax−imin) is equal to or more than the lower limit value Lmin (ST34; YES), the process proceeds to ST40. When it is determined that the difference (imax−imin) is smaller than the lower limit value Lmin (ST34; NO), i.e., when the provisional label range of the voltage determination is overly narrow, the process proceeds to ST35. The lower limit value Lmin corresponds to, for example, the number of labels required for executing the processes of ST13 to ST15.

When the difference (imax−imin) is smaller than the lower limit value Lmin (ST34; NO), the tracking control unit 101 determines whether the maximum label imax is N (ST35). When it is determined that the maximum label imax is N (ST35; YES), i.e., when the maximum voltage corresponding to the provisional label range of the voltage determination is equal to the maximum voltage of the voltage range of the calculation of the detected histogram, the process proceeds to ST38. When it is determined that the maximum label imax is not N (ST35; NO), the process proceeds to ST36.

The tracking control unit 101 determines whether the minimum label imin is 1 (ST36). When it is determined that the minimum label imin is 1 (ST36; YES), i.e., when the minimum voltage corresponding to the provisional label range of the voltage determination is equal to the minimum voltage of the voltage range of the calculation of the detected histogram, the process proceeds to ST39. When it is determined that the minimum label imin is not 1 (ST36; NO), the process proceeds to ST37.

The tracking control unit 101 determines whether the on-cell number $h_d(imax)$ is larger than the on-cell number $h_d(imin)$ (ST37). When it is determined that the on-cell number $h_d(imax)$ is larger than the on-cell number $h_d(imin)$ (ST37; YES), i.e., when the number of on-cells corresponding to the maximum label of the provisional label range of the voltage determination is larger than the number of on-cells corresponding to the minimum label of the provisional label range of the voltage determination, the process proceeds to ST38. When it is determined that the on-cell number $h_d(imax)$ is equal to or smaller than the on-cell number $h_d(imin)$ (ST37; NO), the process proceeds to ST39.

In ST38, the tracking control unit 101 decrements the minimum label imin (imin=imin−1), and the process proceeds to ST34. That is, when the maximum voltage corresponding to the provisional label range of the voltage determination is equal to the maximum voltage of the voltage range of the calculation of the detected histogram (ST35; YES), the tracking control unit 101 decrements the minimum label imin, so as to extend the provisional label range of the voltage determination. Further, when the maximum voltage and the minimum voltage corresponding to the provisional label range of the voltage determination are not equal to the maximum voltage and the minimum voltage of the voltage range of the calculation of the detected histogram, respectively (ST35; NO and ST36; NO), and when the number of on-cells corresponding to the maximum label of the provisional label range of the voltage determination is larger than the number of on-cells corresponding to the minimum label of the provisional label range of the voltage determination (ST37; YES), the tracking control unit 101 decrements the minimum label imin, so as to extend the provisional label range of the voltage determination.

In ST39, the tracking control unit 101 increments the maximum label imax (imax=imax+1), and the process proceeds to ST34. That is, when the maximum voltage corresponding to the provisional label range of the voltage determination is not equal to the maximum voltage of the voltage range of the calculation of the detected histogram (ST35; YES), and when the minimum voltage corresponding to the provisional label range of the voltage determination is equal to the minimum voltage of the voltage range of the calculation of the detected histogram (ST36; YES), the tracking control unit 101 increments the maximum value imax so as to extend the provisional label range of the voltage determination. That is, the tracking control unit 101 extends the label range corresponding to the smaller of the numbers of on-cells respectively corresponding to the maximum label and the minimum label, so as to extend the provisional label range of the voltage determination (ST37, ST38, and ST39).

As described above, the tracking control unit 101 repeats ST34 to ST39 until it is determined in ST34 that the difference (imax−imin) is equal to or larger than the lower limit value Lmin. That is, the tracking control unit 101 extends the provisional label range of the voltage determination until it is determined that the label range of the voltage determination has a width equal to or larger than the lower limit value Lmin.

When the difference (imax−imin) is equal to or larger than the predetermined lower limit value Lmin of the label range of the voltage determination (ST34; NO), the tracking control unit 101 determines the maximum label imax and the minimum label imin in the label range of the voltage determination (ST40).

In this way, the detection process of the label range of the voltage determination is terminated.

(Detection Process of Provisional Label Range of Voltage Determination for Read Voltage R1*opt*)

Figure 15:
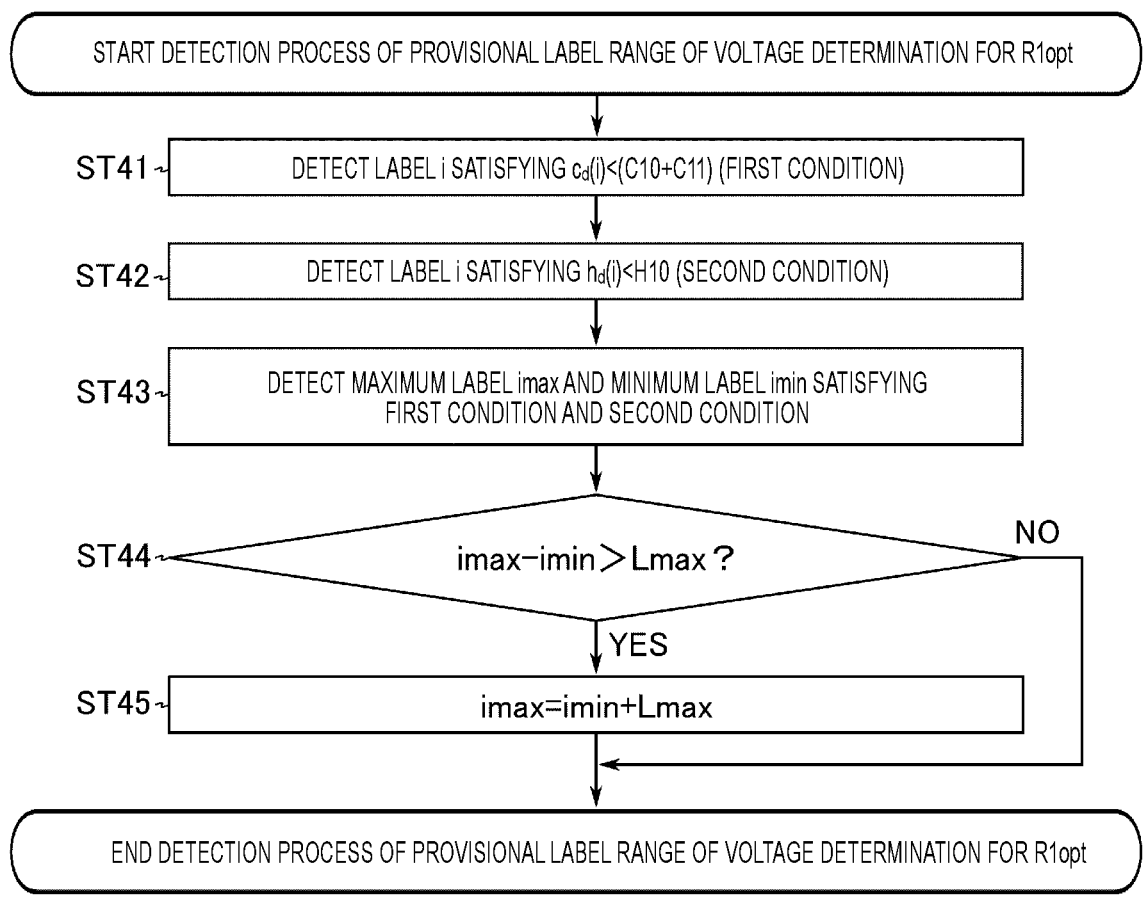
FIG. 15 is a flowchart illustrating a flow of the detection process of a provisional label range of the voltage determination executed in the memory system according to the embodiment.

The flow of the detection process of the provisional label range of the voltage determination for the read voltage R1*opt* (ST32) will be described with reference to FIG. 15. FIG. 15 is a flowchart illustrating the flow of the detection process of the provisional label range of the voltage determination for the read voltage R1*opt* executed in the memory system according to the embodiment.

In the detection process of the provisional label range of the voltage determination for the read voltage R1*opt*, the controller 10 detects the provisional label range of the voltage determination, so that the on-cell number $h_d(i)$ is smaller than a predetermined reference value, and a proportion of the memory cell transistors MT which belong to the state "S1" among the memory cell transistors MT having the threshold voltage in the voltage range corresponding to the provisional label range of the voltage determination does not become overly high. By the process, the controller 10 provisionally detects the label range of the voltage determination to be used when the optimal read voltage R1*opt* is determined.

The tracking control unit 101 detects the label "i" satisfying a first condition (ST41). In the first condition, a cumulative value $c_d(i)$ of the numbers of on-cells in the detected histogram $h_d$ is smaller than the sum of a constant C10 and a constant C11 ($c_d(i)$<C10+C11). Here, the cumulative value $c_d(i)$ of the number of on-cells in the detected histogram $h_d$ is the sum of the on-cell numbers $h_d(0)$ to $h_d(i)$. Further, the constant C10 is an expectation value of the number of memory cell transistors MT included in one state. Further, the constant C11 is an adjustment value for detecting the label range of the voltage determination for the read voltage R1*opt*. By the process of ST41, the tracking control unit 101 detects the range of label "i" so that the proportion of the memory cell transistors MT which belong to the state "S1" among the memory cell transistors MT having the threshold voltage in the voltage range corresponding to the provisional label range of the voltage determination does not become overly high.

The tracking control unit 101 detects the label "i" satisfying a second condition (ST42). In the second condition, the on-cell number $h_d(i)$ is smaller than a constant H10 ($h_d(i)$<H10). The constant H10 is a reference value of the on-cell number $h_d(i)$ for detecting the label range of the voltage determination for the read voltage R1*opt*.

The tracking control unit 101 detects the maximum label imax and the minimum label imin among the labels "i" satisfying the first condition and the second condition (ST43).

The tracking control unit 101 determines whether the difference (imax−imin) is larger than an upper limit value Lmax of the label range of the voltage determination (ST44). When it is determined that the difference (imax−imin) is larger than the upper limit value Lmax (ST44; YES), the process proceeds to ST45. When it is determined that the difference (imax−imin) is equal to or smaller than the upper limit value Lmax (ST44; NO), the tracking control unit 101 terminates the detection process of the provisional label range of the voltage determination for the read voltage R1*opt*.

The tracking control unit 101 sets the label imax as a value obtained by adding the upper limit value Lmax to the label imin (ST45). That is, the tracking control unit 101 adjusts the maximum label imax such that the difference (imax−imin) becomes equal to the upper limit value Lmax when the difference (imax−imin) is larger than the upper limit value Lmax (ST44; YES).

Figure 16:
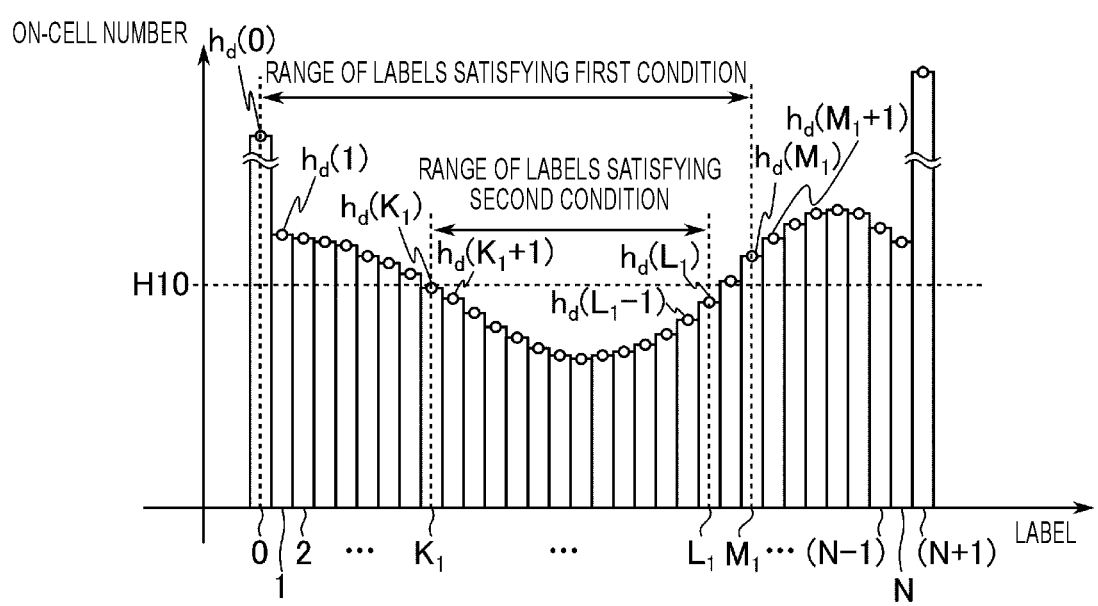
FIG. 16 is a view illustrating the provisional label range of the voltage determination detected in the memory system according to the embodiment.

As described above, the provisional label range of the voltage determination for the read voltage R1*opt* is detected as illustrated in FIG. 16. FIG. 16 is a view illustrating the provisional label range of the voltage determination for the read voltage R1*opt* detected in the memory system according to the embodiment.

In an example of the detected histogram $h_d$ illustrated in FIG. 16, the number of on-cells in the label "0" is $h_d(0)$. The number of on-cells in the label "1" is $h_d(1)$. The number of on-cells in the label "$M_1$" is $h_d(M_1)$. The number of on-cells in the label "$(M_1+1)$" is $h_d(M_1+1)$. The sum of the on-cell numbers $h_d(0)$ to $h_d(M_1)$ is smaller than a constant C10+C11. The sum of the on-cell numbers $h_d(0)$ to $h_d(M_1+1)$ is equal to or larger than the constant C10+C11. That is, the labels 0 to $M_1$ satisfy the first condition.

Further, the number of on-cells in the label "$K_1$" is $h_d(K_1)$. The number of on-cells in the label "$(K_1+1)$" is $h_d(K_1+1)$. The number of on-cells in the label "$(L_1-1)$" is $h_d(L_1-1)$. The number of on-cells in the label "$L_1$" is $h_d(L_1)$. All of the on-cell numbers $h_d(K_1)$ to $h_d(L_1)$ are smaller than the constant H10. That is, all of the labels $K_1$ to $L_1$ satisfy the second condition. Further, all of the labels $K_1$ to $L_1$ satisfy both the first condition and the second condition. Accordingly, the tracking control unit 101 detects the range of the labels $K_1$ to $L_1$ as the provisional label range of the voltage determination for the read voltage R1opt.

(Detection Process of Provisional Label Range of Voltage Determination for Read Voltages R2opt to R7opt)

Figure 17:
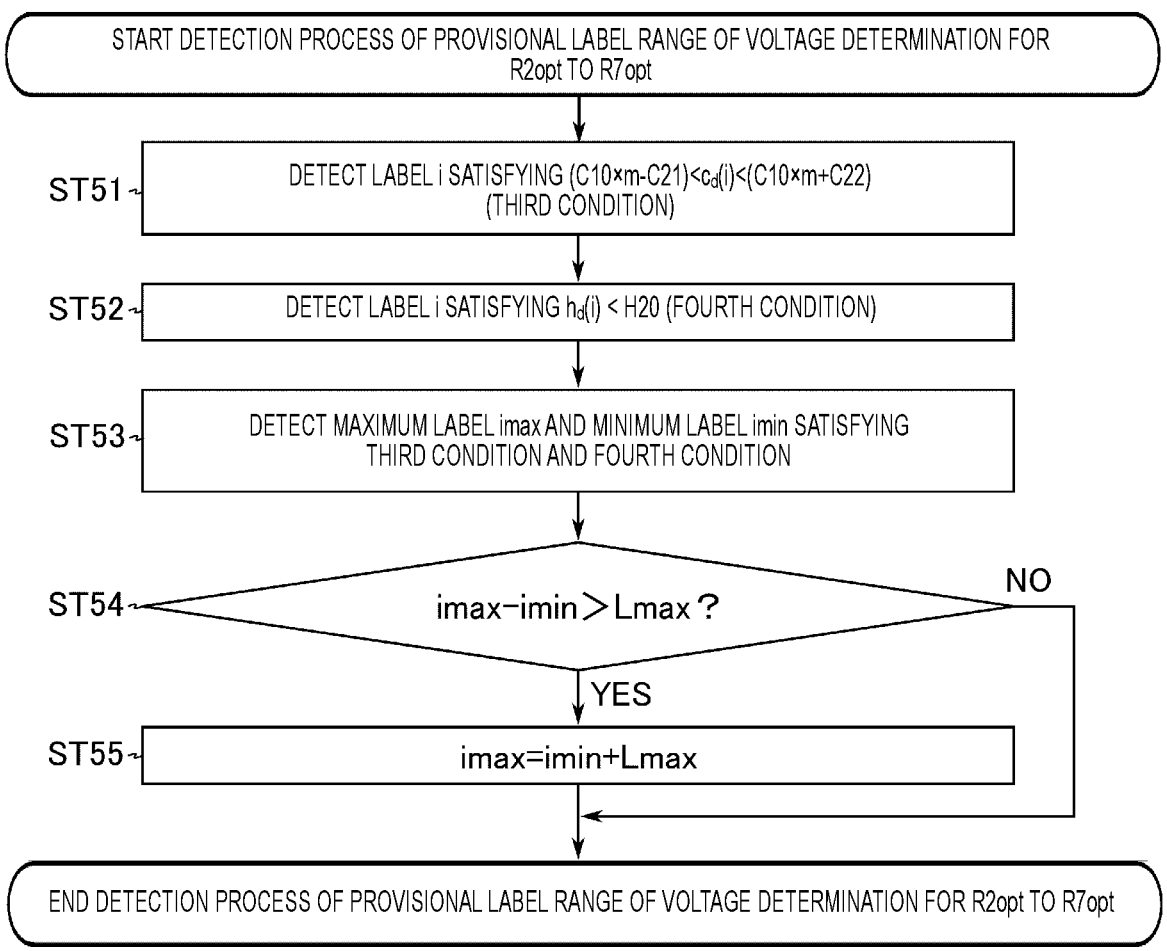
FIG. 17 is a flowchart illustrating another flow of the detection process of the provisional label range of the voltage determination executed in the memory system according to the embodiment.

The flow of the detection process of the provisional label range of the voltage determination for the read voltages R2opt to R7opt (ST33) will be described with reference to FIG. 17. FIG. 17 is a flowchart illustrating the flow of the detection process of the provisional label range of the voltage determination for the read voltages R2opt to R7opt executed in the memory system according to the embodiment. Hereinafter, a case of detecting the provisional label range of the voltage determination for the read voltage Rmopt (i.e., any one of R2opt to R7opt) will be described.

In the detection process of the provisional label range of the voltage determination for the read voltages R2opt to R7opt, the tracking control unit 101 detects the provisional label range of the voltage determination in which the on-cell number $h_d(i)$ is smaller than a predetermined reference value, and the cumulative value $c_d(i)$ of the numbers of on-cells is included in a predetermined range. By this process, the tracking control unit 101 provisionally detects the label range of the voltage determination to be used when the optimal read voltages R2opt to R7opt are determined.

The tracking control unit 101 detects the label "i" satisfying a third condition (ST51). In the third condition, the cumulative value $c_d(i)$ of the numbers of on-cells in the detected histogram $h_d$ is larger than a value obtained by subtracting a constant C21 from a multiplication (C10×m) of the constant C10 and a state number "m", and smaller than a value obtained by adding a constant C22 to the multiplication (C10×m) (C10×m−C21<$c_d(i)$<C10×m+C22). The constants C21 and C22 are adjustment values for detecting the label range of the voltage determination for the read voltages R2opt to R7opt. By this process, the tracking control unit 101 detects the range of the label "i" in which the cumulative value $c_d(i)$ of the numbers of on-cells is included in a predetermined range.

The tracking control unit 101 detects the label "i" satisfying a fourth condition (ST52). In the fourth condition, the on-cell number $h_d(i)$ is smaller than a constant H20 ($h_d(i)$<H20). The constant $H_2O$ is a reference value of the on-cell number $h_d(i)$ for detecting the label range of the voltage determination for the read voltages R2opt to R7opt.

The tracking control unit 101 detects the maximum label imax and the minimum label imin among the labels "i" satisfying the third condition and the fourth condition (ST53).

The tracking control unit 101 determines whether the difference (imax−imin) is larger than the upper limit value Lmax of the label range of the voltage determination (ST54).

When it is determined that the difference (imax−imin) is larger than the upper limit value Lmax (ST54; YES), the process proceeds to ST55. When it is determined that the difference (imax−imin) is equal to or smaller than the upper limit value Lmax (ST54; NO), the tracking control unit 101 terminates the detection process of the provisional label range of the voltage determination for the read voltages R2opt to R7opt.

The tracking control unit 101 sets the label imax as a value acquired by adding the upper limit value Lmax to the label imin (ST55). That is, the tracking control unit 101 adjusts the maximum label imax, such that the difference (imax−imin) becomes equal to the upper limit value Lmax when the difference (imax−imin) is larger than the upper limit value Lmax (ST54; YES).

Figure 18:
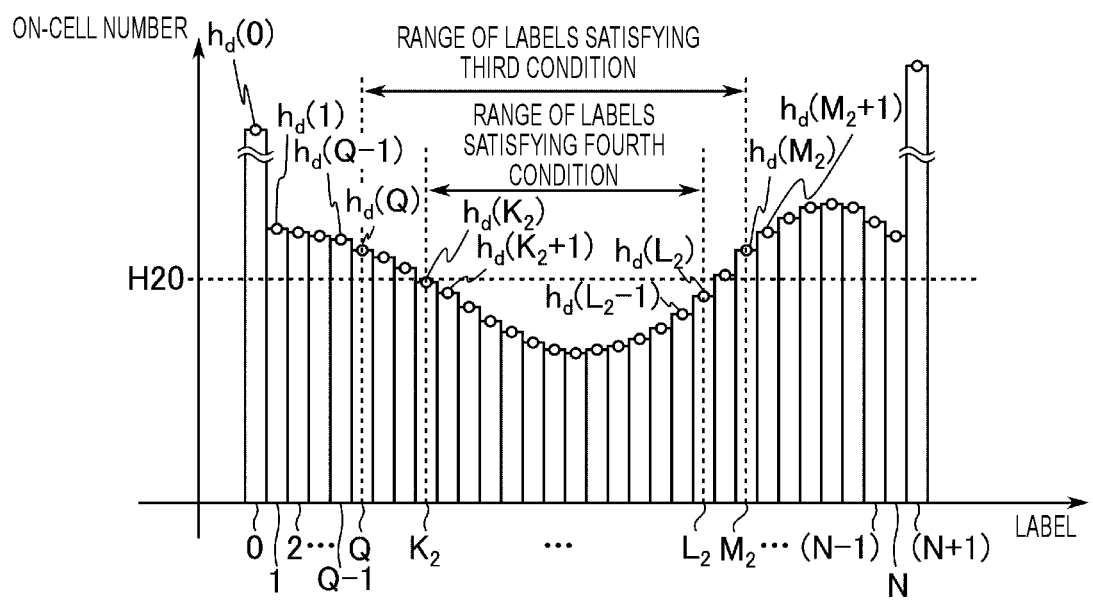
FIG. 18 is a view illustrating the provisional label range of the voltage determination detected in the memory system according to the embodiment.

As described above, the provisional label range of the voltage determination for the read voltages R2opt to R7opt is detected as illustrated in FIG. 18. FIG. 18 is a view illustrating the provisional label range of the voltage determination for the read voltages R2opt to R7opt detected in the memory system according to the embodiment.

In an example of the detected histogram $h_d$ illustrated in FIG. 18, the number of on-cells in the label "0" is $h_d(0)$. The number of on-cells in the label "1" is $h_d(1)$. The number of on-cells in the label "(Q−1)" is $h_d(Q-1)$. The number of on-cells in the label "Q" is $h_d(Q)$. The number of on-cells in the label "$M_2$" is $h_d(M_2)$. The number of on-cells in the label "$(M_2+1)$" is $h_d(M_2+1)$. The sum of the on-cell numbers $h_d(0)$ to $h_d(M_2)$ is larger than a constant (C10×m−C21) and smaller than a constant (C10×m+C22). The sum of the on-cell numbers $h_d(0)$ to $h_d(M_2+1)$ is equal to or larger than the constant (C10×m+C22). The sum of the on-cell numbers $h_d(0)$ to $h_d(Q)$ is larger than the constant (C10×m−C21) and smaller than the constant (C10×m+C22). The sum of the on-cell numbers $h_d(0)$ to $h_d(Q-1)$ is equal to or smaller than the constant (C10×m−C21). That is, the labels Q to $M_2$ satisfy the third condition.

Further, the number of on-cells in the label "$K_2$" is $h_d(K_2)$. The number of on-cells in the label "$(K_2+1)$" is $h_d(K_2+1)$. The number of on-cells in the label "$(L_2-1)$" is $h_d(L_2-1)$. The number of on-cells in the label "$L_2$" is $h_d(L_2)$. All of the on-cell numbers $h_d(K_2)$ to $h_d(L_2)$ are smaller than the constant H20. That is, all of the labels $K_2$ to $L_2$ satisfy the fourth condition. Further, all of the labels $K_2$ to $L_2$ satisfy both the third condition and the fourth condition. Accordingly, the tracking control unit 101 detects the range of the labels $K_2$ to $L_2$ as the provisional label range of the voltage determination for the read voltages R2opt to R7opt.

1.2.2.2.3 Estimation Process of First Histogram

Figure 19:
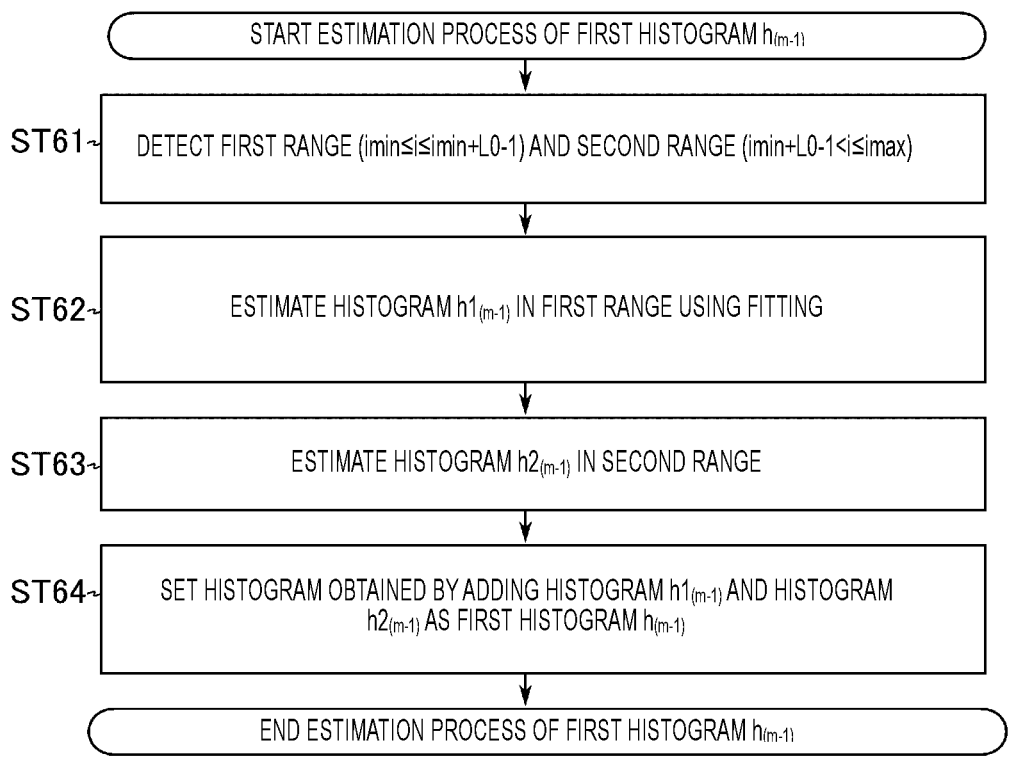
FIG. 19 is a flowchart illustrating an overall flow of an estimation process of a first histogram executed in the memory system according to the embodiment.

The overall flow of the estimation process of the first histogram (histogram $h_{(m-1)}$) (ST13) executed in the memory system 1 according to the embodiment will be described with reference to FIG. 19. FIG. 19 is a flowchart illustrating the overall flow of the estimation process of the first histogram executed in the memory system according to the embodiment.

The controller 10 detects a first range and a second range included in the label range of the voltage determination, by using the maximum label imax and the minimum label imin determined in ST40, and a constant L0 determined by experiment (e.g., L0=6; a larger L0 providing a better accuracy for estimating the distribution but at the cost of consuming a larger memory area) (ST61). Further, L0 is an integer which is larger than 0 and smaller than (imax−imin). The first range is a range of a label corresponding to a low voltage-side range, in which the fitting is to be executed in ST13. The first range is a range which is equal to or larger than the label imin and equal to or smaller than a label (imin+L0−1). The second range is a range of a label corresponding to a high voltage-side range, which is contiguous to the low voltage-side range and includes a label corresponding to the optimal read voltage Rmopt. The second range is a range which is equal to or larger than the label (imin+L0−1) and equal to or smaller than the label imax.

The tracking control unit 101 estimates a histogram $h1_{(m−1)}$ in the first range (ST62). The tracking control unit 101 regards that the overlap of the threshold voltage distributions is small in the low voltage-side range. The tracking control unit 101 estimates the histogram $h1_{(m−1)}$ in the first range, based on the detected histogram $h_d$ in the first range. Details of the estimation of the histogram $h1_{(m−1)}$ will be described later.

The tracking control unit 101 estimates a histogram $h2_{(m−1)}$ in the second range by using the estimated histogram $h1_{(m−1)}$ (ST63). Details of the estimation of the histogram $h2_{(m−1)}$ will be described later.

The tracking control unit 101 sets a histogram obtained by adding the estimated histogram $h1_{(m−1)}$ and the estimated histogram $h2_{(m−1)}$ as a first histogram $h_{(m−1)}$ (ST64).

With the operation described above, the estimation process of the first histogram $h_{(m−1)}$ in the label range of the voltage determination is terminated.

(Estimation Process of Histogram in First Range)

Figure 20:
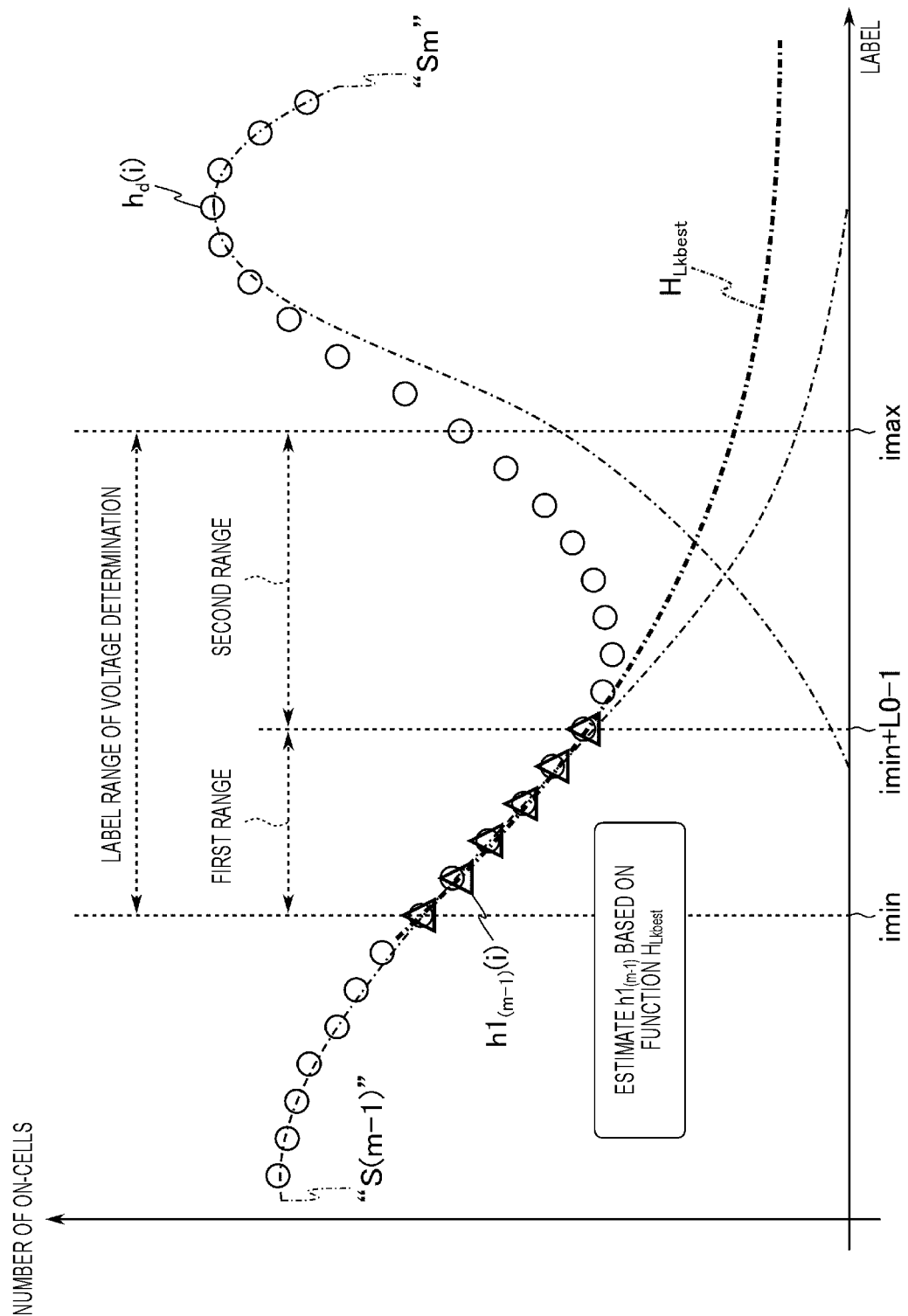
FIG. 20 is a schematic view of an estimation process of a histogram in a first range executed in the memory system according to the embodiment.

An outline of the estimation process of the histogram $h1_{(m−1)}$ in the first range (ST62) will be described in detail with reference to FIG. 20. FIG. 20 is a schematic view of the estimation process of the histogram in the first range executed in the memory system according to the embodiment.

The tracking control unit 101 detects a distribution function $H_{Lkbest}$ that reproduces an on-cell number $h1_{(m−1)}(i)$ (represented by "Δ" in FIG. 20) of the histogram $h1_{(m−1)}$ in the first range, among on-cell numbers $h_d(i)$ (represented by "○" in FIG. 20) of the detected histogram $h_d$ by executing a fitting using a least square method.

In addition, the tracking control unit 101 estimates the on-cell number $h1_{(m−1)}(i)$ of the histogram $h1_{(m−1)}$ in the first range based on the obtained distribution function $H_{Lkbest}$.

Hereinafter, the estimation process of the histogram $h1_{(m−1)}$ in the first range will be described in more detail.

The tracking control unit 101 prepares F1 candidate distribution functions $H_{LK}$ (i.e., $H_{L1}$ to $H_{LF1}$) capable of reproducing the on-cell number $h1_{(m−1)}(i)$. Here, F1 is an integer larger than 1. Further, "k" is an integer equal to or larger than 1 and equal to or smaller than F1. A candidate distribution function $H_{Lk}$ in the embodiment is represented by formula (1) below.

[Formula 1]

$$H_{Lk} = a_L \times V_{Lk} \quad (1)$$

A value $a_L$ in the formula (1) is a constant. A function $V_{Lk}$ in the formula (1) is represented by formula (2) below.

[Formula 2]

$$V_{Lk} = \frac{e^{\rho k i_1}}{\sqrt{\sum_{i_2=1}^{L0} e^{2\rho k i_2}}} \quad (2)$$

In the formula (2) and the following description, a label $i_1$ (>0) is equal to (−i+imin+L0) (i.e., $i_1$—i+imin+L0). A label $i_2$ is an integer equal to or larger than 1 and equal to or smaller than L0. A value "p" is a constant. Further, formulas (1) and (2) described above are distribution functions generated by using a probability density function of a Laplace distribution.

The tracking control unit 101 detects a candidate distribution function $H_{Lk}$ in which a square error $SE_{Lk}$ (i.e., $SE_{L1}$ to $SE_{LF1}$) between the detected histogram $h_d$ and the candidate distribution function $H_{Lk}$ in the first range becomes the minimum among the F1 candidate distribution functions $H_{Lk}$.

Here, the square error $SE_{Lk}$ in the first range is the sum of a square of a difference between the on-cell number $h_d(i)$ and a value $H_{Lk}(i_1)$ of a candidate distribution function in the label $i_1$ corresponding to the label i. The square error $SE_{Lk}$ is a function which depends on "k", and is represented by formula (3) below.

[Formula 3]

$$SE_{Lk} = \sum_{i=imin}^{imin+L0-1} (h_d(i) - H_{Lk}(i_1))^2 = C_L - 2a_L \times e_{Lk} \quad (3)$$

A value $C_L$ in the formula (3) is represented by formula (4) below. That is, the value $C_L$ is a constant which is calculated by using the on-cell number $h_d(i)$ and does not depend on the distribution function $H_{Lk}$. Further, the value $C_L$ is a constant that is set to satisfy formula (5).

[Formula 4]

$$C_L = \sum_{i=imin}^{imin+L0-1} h_d(i)^2 + a_L^2 \sum_{i=imin}^{imin+L0-1} V_{Lk}(i_1)^2 \quad (4)$$

[Formula 5]

$$\sum_{i=imin}^{imin+L0-1} V_{Lk}(i_1)^2 \approx 1 \quad (5)$$

A function $e_{Lk}$ in the formula (3) is a function which is represented by formula (6) below and depends on the function $V_{Lk}$.

[Formula 6]

$$e_{Lk} = \sum_{i=imin}^{imin+L0-1} h_d(i) \times V_{Lk}(i_1) \quad (6)$$

From the above, the tracking control unit 101 searches for a distribution function $H_{Lk}$ in which the value $e_{Lk}$ of the function for the square error $SE_{Lk}$ becomes the maximum, to detect the distribution function $H_{Lk}$ in which the square error $SE_{Lk}$ in the first range becomes the minimum. The tracking control unit 101 sets "k" corresponding to the searched distribution function $H_{Lk}$ as kbest.

In addition, the tracking control unit 101 estimates the on-cell number $h1_{(m−1)}(i)$ in the first range based on the searched distribution function $H_{Lkbest}$.

(Flow of Estimation Process of Histogram in First Range)

Figure 21:
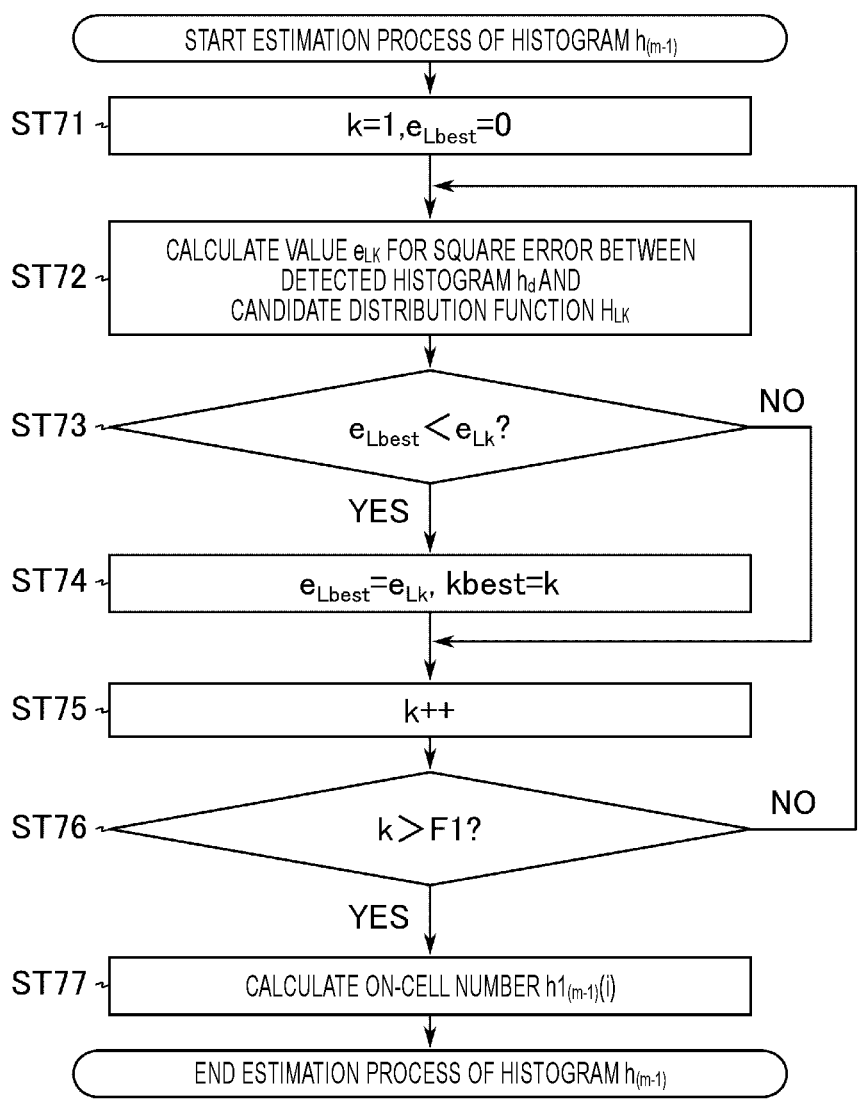
FIG. 21 is a flowchart illustrating a flow of estimation process of the histogram in the first range executed in the memory system according to the embodiment.

The flow of the estimation process of the histogram $h1_{(m−1)}$ in the first range (ST62) will be described in detail with reference to FIG. 21. FIG. 21 is a flowchart illustrating the flow of the estimation process of the histogram in the first range executed in the memory system according to the embodiment.

In ST71, the tracking control unit 101 sets a variable "k" to 1, and sets a value of an evaluation value $e_{Lbest}$ of the square error to 0 (k=1 and $e_{Lbest}$=0).

The tracking control unit 101 calculates the value $e_{Lk}$ for the square error between the detected histogram $h_d$ and the candidate distribution function $H_{Lk}$ (ST72).

The tracking control unit 101 determines whether the calculated value $e_{Lk}$ is larger than the evaluation value $e_{Lbest}$ (ST73). When it is determined that the calculated value $e_{Lk}$ is larger than the evaluation value $e_{Lbest}$ (ST73; YES), the process proceeds to ST74. When it is determined that the calculated value $e_{Lk}$ is equal to or smaller than the evaluation value $e_{Lbest}$ (ST73; NO), the process proceeds to ST75.

In ST74, the tracking control unit 101 sets the value of the evaluation value $e_{Lbest}$ to the calculated value $e_{Lk}$ ($e_{Lbest}$=$e_{Lk}$), and sets kbest to the variable "k" (kbest=k).

In ST75, the tracking control unit 101 increments the variable "k" (k=k+1), and the process proceeds to ST76.

The tracking control unit 101 determines whether the variable "k" is larger than F1 which is the number of candidates (ST76). When it is determined that the variable "k" is larger than F1 which is the number of candidates (ST76; YES), the process proceeds to ST77. When it is determined that the variable "k" is equal to or smaller than F1 which is the number of candidates (ST76; NO), the process proceeds to ST72. As described above, the tracking control unit 101 repeats ST72 to ST76 until it is determined that the variable "k" is larger than F1 which is the number of candidates in ST76. As a result, the tracking control unit 101 sets a variable "k" in which the square error $SE_{Lk}$ becomes the minimum and the value $e_{Lk}$ becomes the maximum, to kbest.

In ST77, the tracking control unit 101 estimates the on-cell number $h1_{(m-1)}$ (i) in the first range, by using the candidate distribution function $H_{Lkbest}$ corresponding to kbest. More specifically, the tracking control unit 101 estimates the distribution function value $H_{Lkbest}$(i) as the on-cell number $h1_{(m-1)}$(i) in the first range.

As described above, the estimation process of the histogram $h1_{(m-1)}$ in the first range is terminated.

(Estimation Process of Histogram in Second Range)

Figure 22:
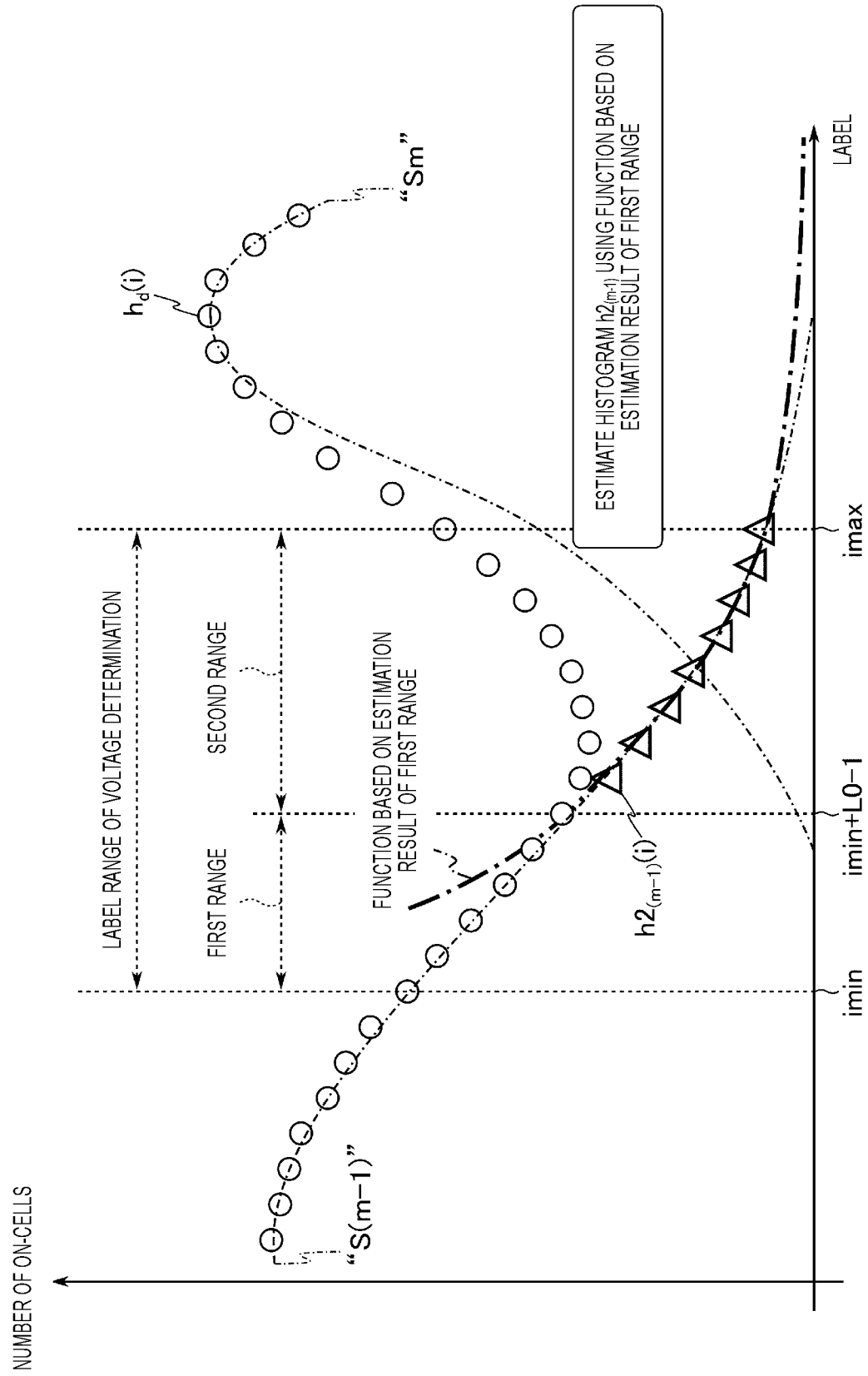
FIG. 22 is a schematic view of an estimation process of a histogram in a second range executed in the memory system according to the embodiment.

An estimation process of the histogram $h2_{(m-1)}$ in the second range (ST63) will be described in detail with reference to FIG. 22. FIG. 22 is a schematic view illustrating the estimation process of the histogram in the second range executed in the memory system according to the embodiment.

In the estimation process of the histogram $h2_{(m-1)}$ in the second range, the tracking control unit 101 estimates the on-cell number $h2_{(m-1)}$ (i) (represented by "Δ" in FIG. 22) in the second range by using a function (represented by a "function based on an estimation result of the first range" in FIG. 22 and the following description) represented by formula (7) below, which uses the on-cell number $h1_{(m-1)}$ (imin+L0−1) in the first range.

[Formula 7]

$$h2_{(m-1)}(i) = h1_{(m-1)}(imin+L0-1) \times B_{LKbest}^{(i-(imin+L0-1))} \quad (7)$$

A value $B_{Lkbest}$ in the formula (7) is a constant determined to correspond to the distribution function $H_{Lkbest}$.

Figure 23:
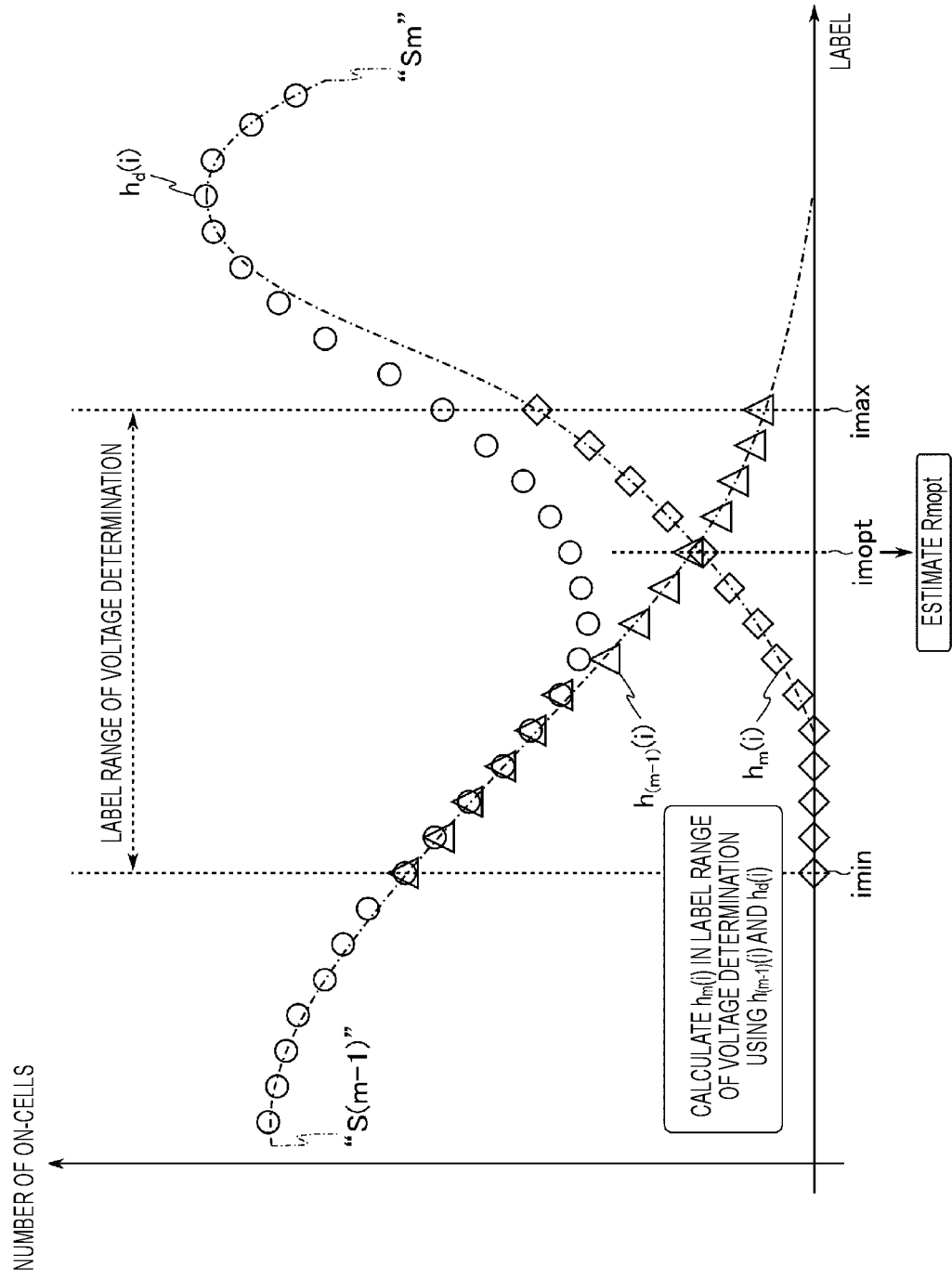
FIG. 23 is a schematic view of a calculation process of a second histogram and a determination process of an optimal read voltage executed in the memory system according to the embodiment.

1.2.2.2.4 Calculation Process of Second Histogram and Determination Process of Optimal Read Voltage Outlines of the calculation process of the second histogram (histogram $h_m$) (ST14) and the determination process of the optimal read voltage Rmopt (ST15) will be described with reference to FIG. 23. FIG. 23 is a schematic view of the calculation process of the second histogram and the determination process of the optimal read voltage executed in the memory system according to the embodiment.

In the calculation process of the histogram $h_m$ (ST14), the tracking control unit 101 calculates the on-cell number $h_m$(i) (represented by "O" in FIG. 23) of the second histogram in the label range of the voltage determination based on the on-cell number $h_d$(i) (represented by "O" in FIG. 23) of the detected histogram and the estimated on-cell number $h_{(m-1)}$ (i) (represented by "Δ" in FIG. 23) of the first histogram.

In the determination process of the optimal read voltage Rmopt (ST15), the tracking control unit 101 calculates a label imopt corresponding to an intersection of the threshold voltage distribution of the state "Sm" and the threshold voltage distribution of the state "S(m−1)" by using the estimated first histogram $h_{(m-1)}$ and the calculated second histogram $h_m$. Further, the tracking control unit 101 determines the optimal read voltage Rmopt based on the calculated label imopt.

(Flow of Calculation Process of Second Histogram and Determination Process of Optimal Read Voltage)

Figure 24:
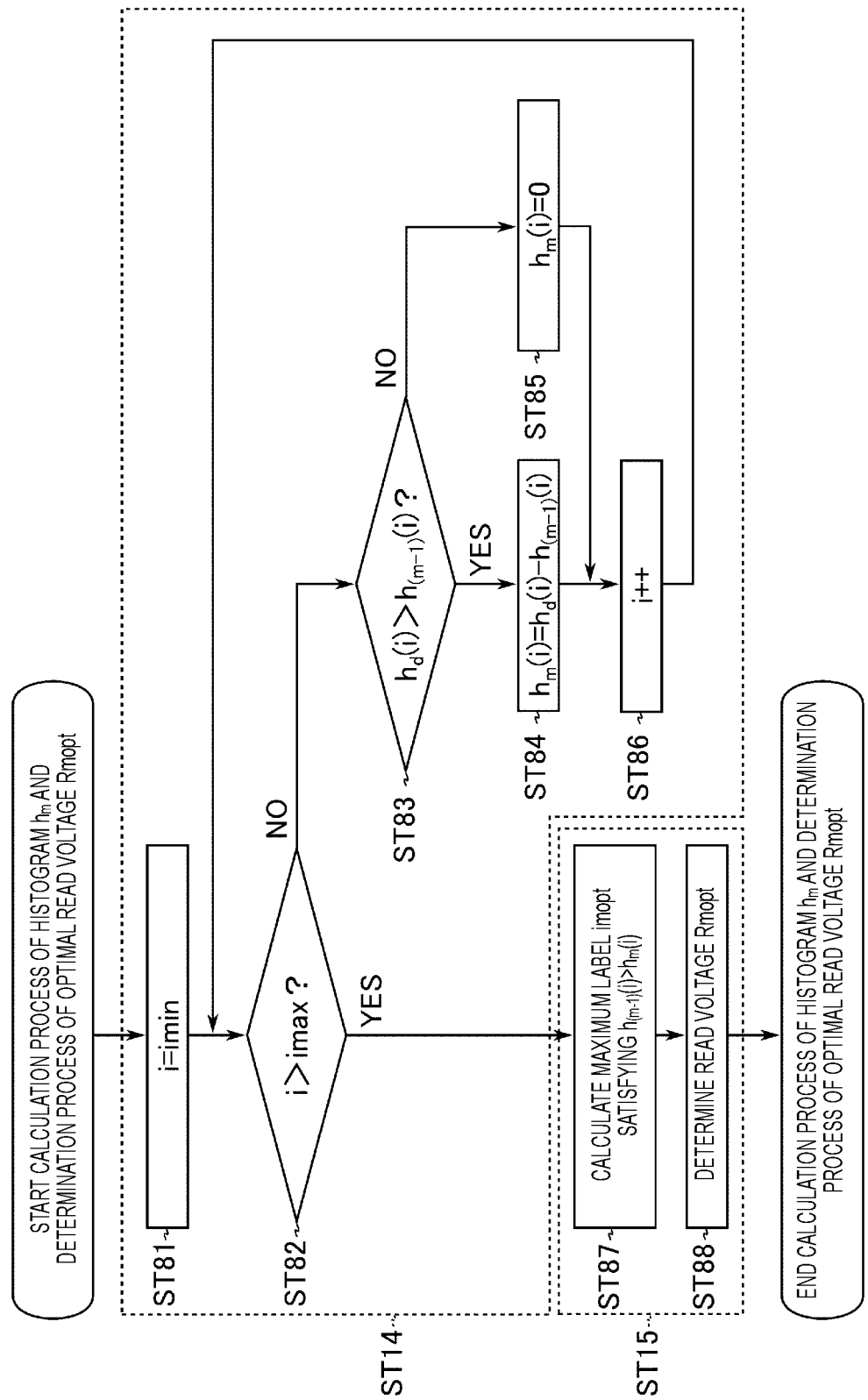
FIG. 24 is a flowchart illustrating the calculation process of the second histogram and the determination process of the optimal read voltage executed in the memory system according to the embodiment.

The flow of the calculation process of the second histogram (histogram $h_m$) and the determination process of the optimal read voltage Rmopt executed in the memory system 1 according to the embodiment will be described with reference to FIG. 24. FIG. 24 is a flowchart illustrating the calculation process of the second histogram and the determination process of the optimal read voltage executed in the memory system according to the embodiment.

In ST81, the tracking control unit 101 sets the label "i" to imin (i=imin).

The tracking control unit 101 determines whether the label "i" is larger than the label imax (ST82). When it is determined that the label "i" is larger than the label imax (ST82; YES), the process proceeds to ST87. When it is determined that the label "i" is equal to or smaller than the label imax (ST82; NO), the process proceeds to ST83.

The tracking control unit 101 determines whether the on-cell number $h_d$(i) is larger than the on-cell number $h_{(m-1)}$(i) (ST83). When it is determined that the on-cell number $h_d$(i) is larger than the on-cell number $h_{(m-1)}$ (i) (ST83; YES), the process proceeds to ST84. When it is determined that the on-cell number $h_d$(i) is equal to or smaller than the on-cell number $h_{(m-1)}$ (i) (ST83; NO), the process proceeds to ST85.

When the on-cell number $h_d$(i) is larger than the on-cell number $h_{(m-1)}$ (i) (ST83; YES), the tracking control unit 101 sets a value obtained by subtracting the on-cell number (i) from the on-cell number $h_d$(i) as the on-cell number $h_m$(i) (ST84). That is, when the on-cell number $h_d$(i) of the detected histogram $h_d$ is larger than the estimated on-cell number $h_{(m-1)}$ (i) of the first histogram, the tracking control unit 101 regards a difference thereof as the on-cell number $h_m$ (i) of the histogram $h_m$. Then, the process proceeds to ST86.

When the on-cell number $h_d$(i) is equal to or smaller than the on-cell number $h_{(m-1)}$ (i) (ST83; NO), the control unit 101 sets the on-cell number $h_m$(i) to 0 (ST85). That is, when the on-cell number $h_d$(i) of the detected histogram $h_d$ is equal to or smaller than the estimated on-cell number $h_{(m-1)}$ (i) of the first histogram, the tracking control unit 101 regards the on-cell number $h_m$(i) of the histogram $h_m$ as 0. Then, the process proceeds to ST86.

The tracking control unit 101 increments the label "i" (ST86), and the process proceeds to ST82. As described above, the tracking control unit 101 repeats ST82 to ST86 until it is determined that the label "i" is larger than the label imax (ST82; YES). That is, with respect to the label "i" which is equal to or larger than imin and equal to or smaller than imax, the on-cell number $h_m(i)$ is calculated by the processes of ST83 to ST85. As a result, the tracking control unit 101 calculates the histogram $h_m$ in the label range of the voltage determination based on the detected histogram $h_d$ and the histogram $h_{(m-1)}$ (ST14).

The tracking control unit 101 calculates the maximum label "i" among labels "i" in which the on-cell number $h_{(m-1)}(i)$ is larger than the on-cell number $h_m(i)$ (i.e., $h_{(m-1)}(i) > h_m(i)$) as the label imopt (ST87).

The tracking control unit 101 determines the optimal read voltage Rmopt based on the calculated label imopt (ST88). More specifically, for example, the tracking control unit 101 sets a voltage of the center of the range of the read voltage corresponding to the label imopt, i.e., (Rm_(N−imopt+2)+ Rm_(N−imopt+1))/2 as the voltage Rmopt.

As described above, the tracking control unit 101 executes the determination process of the optimal read voltages R1opt to R7opt (ST15) for the read voltages R1 to R7, respectively, by ST87 and ST88.

1.3 Effects of Embodiment

According to the embodiment, the reliability of the memory system 1 can be enhanced. The effects of the embodiment will be described below.

In the memory system 1 according to the embodiment, the controller 10 determines the optimal read voltage Rmopt by executing the threshold voltage tracking process for the plurality of memory cell transistors MT. The controller 10 calculates the detected histogram $h_d$ corresponding to the valley area of the respective threshold voltage distributions of the states "Sm" and "S(m−1)" when determining the optimal read voltage Rmopt. The controller 10 estimates the histogram $h1_{(m-1)}$ in the first range by using the fitting of the calculated detected histogram $h_d$. The controller 10 estimates the histogram $h2_{(m-1)}$ in the second range, based on the estimated on-cell number $h1_{(m-1)}$ (imin+L0−1) of the histogram in the first range. The controller 10 estimates the first histogram $h_{(m-1)}$ based on the histogram $h1_{(m-1)}$ and the histogram $h2_{(m-1)}$. The controller 10 calculates the second histogram $h_m$ based on a difference between the detected histogram $h_d$ and the first histogram $h_{(m-1)}$. The controller 10 determines the optimal read voltage Rmopt based on the first histogram $h_{(m-1)}$ and the second histogram $h_m$. As a result, the controller 10 can reduce a difference of a read voltage from the optimal read voltage Rmopt caused by the overlap of the threshold voltage distributions, when determining the optimal read voltage Rmopt. As a result, the memory system 1 can prevent an increase in the error bit number. Thus, the memory system 1 according to the embodiment can enhance the reliability thereof.

Comparative Example 1

As a method for reducing the error bit number in a memory system according to Comparative Example 1, for example, a method of setting a voltage neighboring from a voltage (minimum voltage) with which the number of on-cells in the valley area of the threshold voltage distributions becomes the minimum value, as a new read voltage is used. However, for example, when the threshold voltage distribution of the state "S(m−1)" is asymmetric by spread on a high-voltage side, the overlap of the threshold voltage distributions increases at the state "Sm" side in the valley area of the threshold voltage distributions. As a result, a difference between the optimal read voltage and the minimum voltage increases. Accordingly, even though the minimum voltage is used as the read voltage, it may become difficult to reduce the error bit number.

Comparative Example 2

With respect to a memory system according to Comparative Example 2, as a method for reducing the error bit number when a difference between an optimal read voltage and a minimum voltage increases, a method of determining a read voltage by using a slope based on a valley area of a detected histogram is used. More specifically, a controller of the memory system according to Comparative Example 2 determines a new read voltage based on an intersection of a slope based on a high voltage-side portion in the valley area of the detected histogram and a slope based on a low voltage-side portion in the valley area of the detected histogram. Further, the controller of the memory system according to Comparative Example 2 determines a voltage in which either slope becomes a value around a minimum value in the valley area of the detected histogram, as the new read voltage. However, when the overlap of threshold voltage distributions is large, a difference between the determined new read voltage and the optimal read voltage may increase even by such a method. As a result, it may become difficult to reduce the error bit number even by such a method.

According to the embodiment, the controller 10 estimates a first histogram $h_{(m-1)}$ of the state "S(m−1)" in a label range of voltage determination by using a detected histogram $h_d$ of a voltage range. Further, the controller 10 calculates a second histogram $h_m$ of the state "Sm" based on the detected histogram $h_d$ and the estimated first histogram $h_{(m-1)}$. As a result, the controller 10 determines an optimal read voltage Rmopt based on the estimated first histogram $h_{(m-1)}$ and the calculated second histogram $h_m$. Accordingly, the controller 10 can reduce the difference of the read voltage from the optimal read voltage Rmopt caused by the overlap of the threshold voltage distributions.

2. Modification

Various modifications of the embodiment are possible.

Hereinafter, a memory system according to a modification will be described. Note that, since a configuration of the memory system according to the modification is substantially equivalent to the configuration of the memory system according to the embodiment, descriptions thereof will be omitted. Hereinafter, an operation of the memory system according to the modification will be described focusing on the differences from the operation of the memory system according to the embodiment. With the memory system according to the modification as well, the same effects as those of the embodiment are achieved.

2.1 First Modification

In the embodiment, the tracking control unit 101 estimates the histogram $h_{(m-1)}$ of the state "$S_{(m-1)}$" in the estimation process of the first histogram (ST13). However, the present disclosure is not limited thereto. The tracking control unit 101 may estimate the histogram $h_m$ of the state "Sm" according to the shape of the threshold voltage distribution in the estimation process of the first histogram (ST13).

Hereinafter, descriptions will be made on the operation of the memory system 1 when the overlap of the threshold voltage distributions of the respective states "Sm" and "S(m−1)" increases in the low voltage-side range, as compared with the high voltage-side range, by spread of the threshold voltage distribution of the state "Sm" in the low voltage-side lower.

(Detection Process of Label Range of Voltage Determination)

The tracking control unit 101 according to the first modification detects a label range corresponding to the high voltage-side voltage range in the process of the detection of the label range of the voltage determination (ST12). Further, the tracking control unit 101 detects a label range corresponding to the low voltage-side range, which is contiguous to the high voltage-side range and includes a label corresponding to the optimal read voltage Rmopt. The process of the detection of the label range of the voltage determination according to the first modification (ST12) is substantially equivalent to the process of the detection of the label range of the voltage determination according to the embodiment (ST12), except for the process of the detection of a provisional label range of the voltage determination for the optimal read voltage R1opt (ST32) and the process of the detection of a provisional label range of the voltage determination for the optimal read voltages R2opt to R7opt (ST33). Hereinafter, the process of the detection of the provisional label range of the voltage determination for the optimal read voltage R1opt (ST32) and the process of the detection of the provisional label range of the voltage determination for the optimal read voltages R2opt to R7opt (ST33) will be primarily described, and other descriptions will be omitted. Further, as described above, in the modification, it is assumed that the overlap of the threshold voltage distributions is larger in the low voltage-side range than in the high voltage-side range. Note that, in the following description of the first modification, the label range corresponding to the high voltage-side range will also be referred to as a third range. Further, the label range corresponding to the low voltage-side range will also be referred to as a fourth range.

(Detection Process of Provisional Label Range of Voltage Determination for Read Voltage R1opt)

Figure 25:
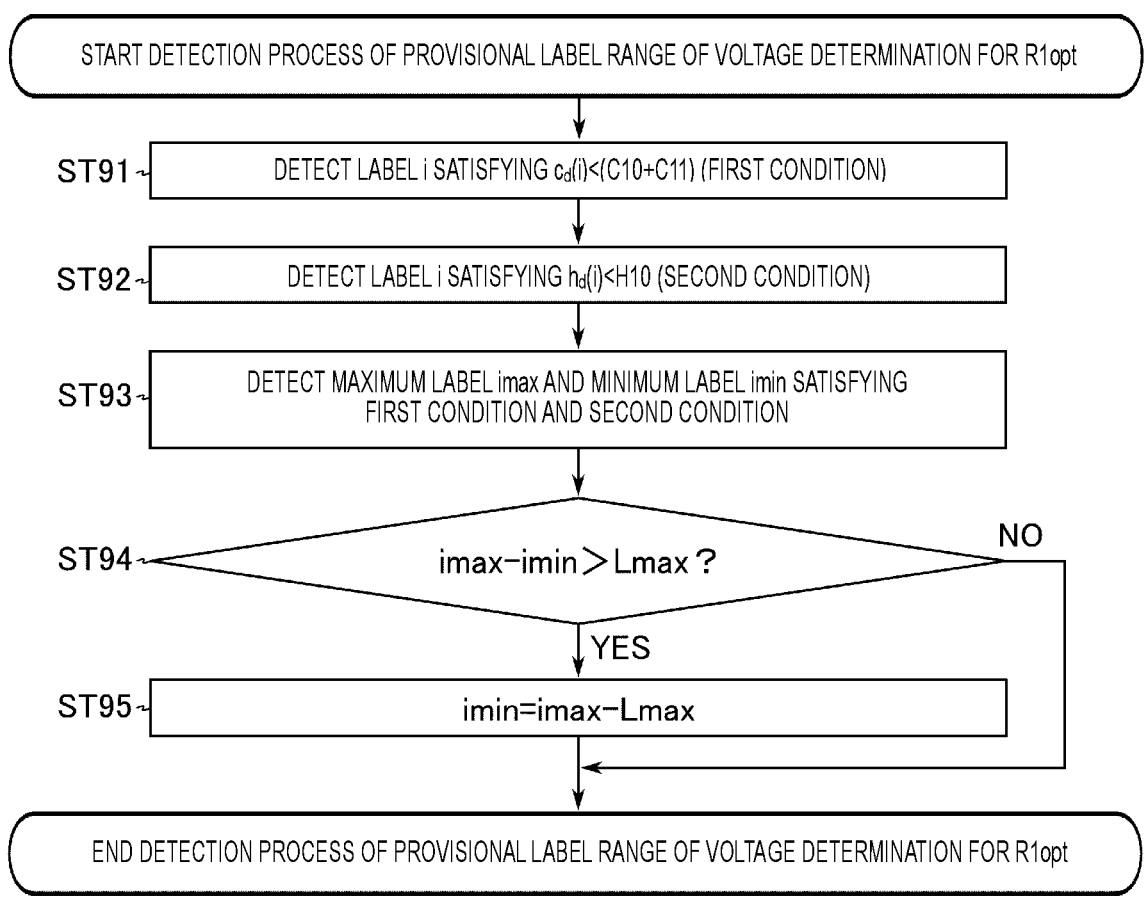
FIG. 25 is a flowchart illustrating a flow of a detection process of a provisional label range of voltage determination executed in a memory system according to a first modification.

The flow of the detection process of the provisional label range of the voltage determination for the read voltage R1opt (ST32) will be described with reference to FIG. 25. FIG. 25 is a flowchart illustrating the flow of the detection process of a provisional label range of the voltage determination for the read voltage R1opt executed in the memory system according to the first modification.

Since ST91 to ST94 in the first modification are substantially the same as ST41 to ST44 in the embodiment, descriptions thereof will be omitted. Hereinafter, ST95 in the first modification will be described.

The tracking control unit 101 sets the label imin to a value obtained by subtracting the upper limit value Lmax from the label imax (ST95). That is, the tracking control unit 101 adjusts the minimum label imin such that the difference (imax−imin) is equal to the upper limit value Lmax when the difference (imax−imin) is larger than the upper limit value Lmax (ST94; YES).

As described above, the provisional label range of the voltage determination for the read voltage R1opt is detected.

(Detection Process of Provisional Label Range of Voltage Determination for Read Voltages R2opt to R7opt)

Figure 26:
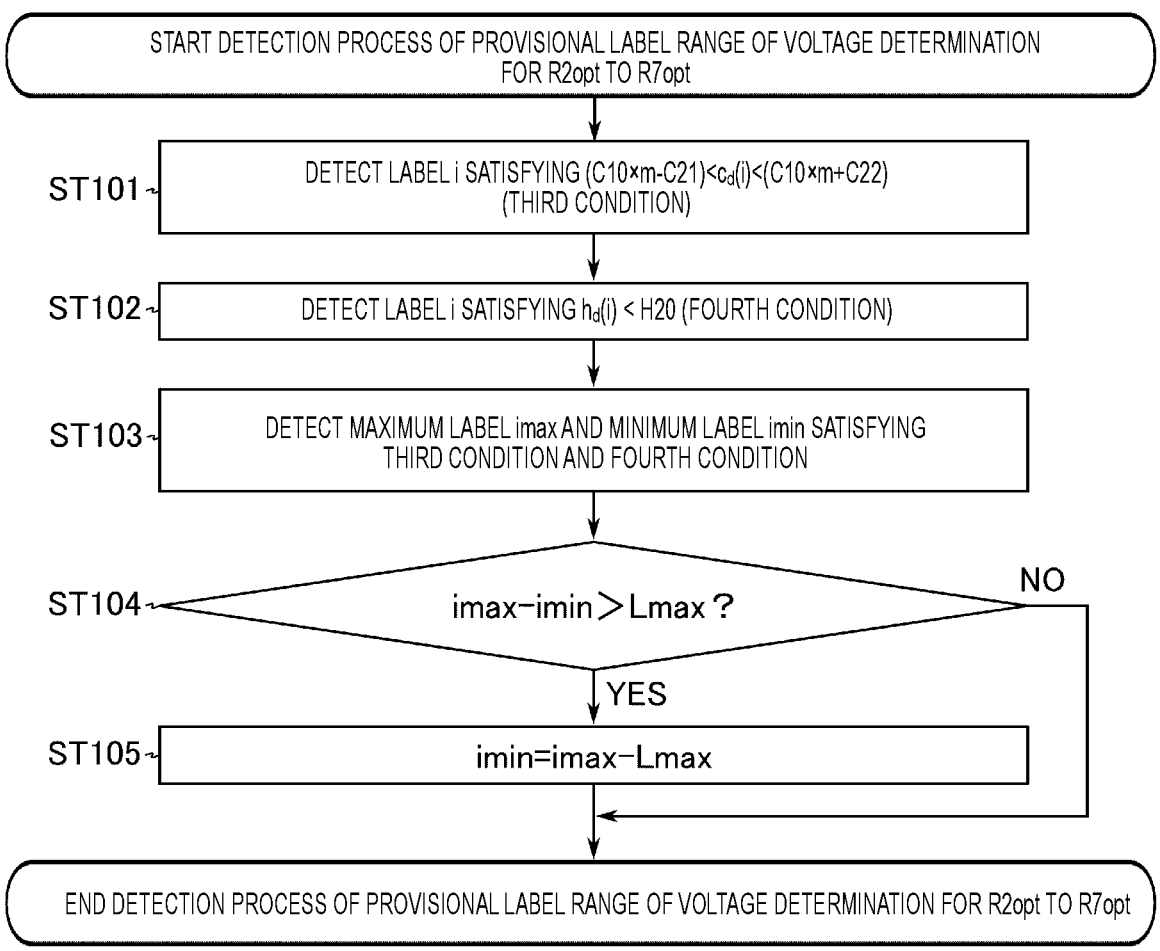
FIG. 26 is a flowchart illustrating a flow of the detection process of the provisional label range of the voltage determination executed in the memory system according to the first modification.

The flow of the detection process of the provisional label range of the voltage determination for the read voltages R2opt to R7opt (ST33) will be described with reference to FIG. 26. FIG. 26 is a flowchart illustrating the flow of the detection process of the provisional label range of the voltage determination for the read voltages R2opt to R7opt executed in the memory system according to the first modification. Hereinafter, a case of detecting the provisional label range of the voltage determination for the read voltage Rmopt (R2opt to R7opt) will be described.

Since ST101 to ST104 in the first modification are substantially the same as ST51 to ST54 in the embodiment, descriptions thereof will be omitted. Hereinafter, ST105 in the first modification will be described.

The tracking control unit 101 sets the label imin to a value obtained by subtracting the upper limit value Lmax from the label imax (ST105). That is, the tracking control unit 101 adjusts the minimum label imin such that the difference (imax−imin) is equal to the upper limit value Lmax when the difference (imax−imin) is larger than the upper limit value Lmax (ST104; YES).

As described above, the provisional label range of the voltage determination for the read voltages R2opt to R7opt is detected.

(Estimation Process of First Histogram)

The tracking control unit 101 according to the first modification estimates the histogram $h_m$ during the estimation process of the first histogram (ST13). That is, the first histogram in the first modification is the histogram $h_m$.

Further, the tracking control unit 101 according to the first modification calculates the histogram $h_{(m-1)}$ based on the estimated histogram $h_m$ and the detected histogram $h_d$ during the calculation process of the second histogram (ST14). That is, the second histogram in the first modification is the histogram $h_{(m-1)}$.

2.1.1 Estimation Process of First Histogram

Figure 27:
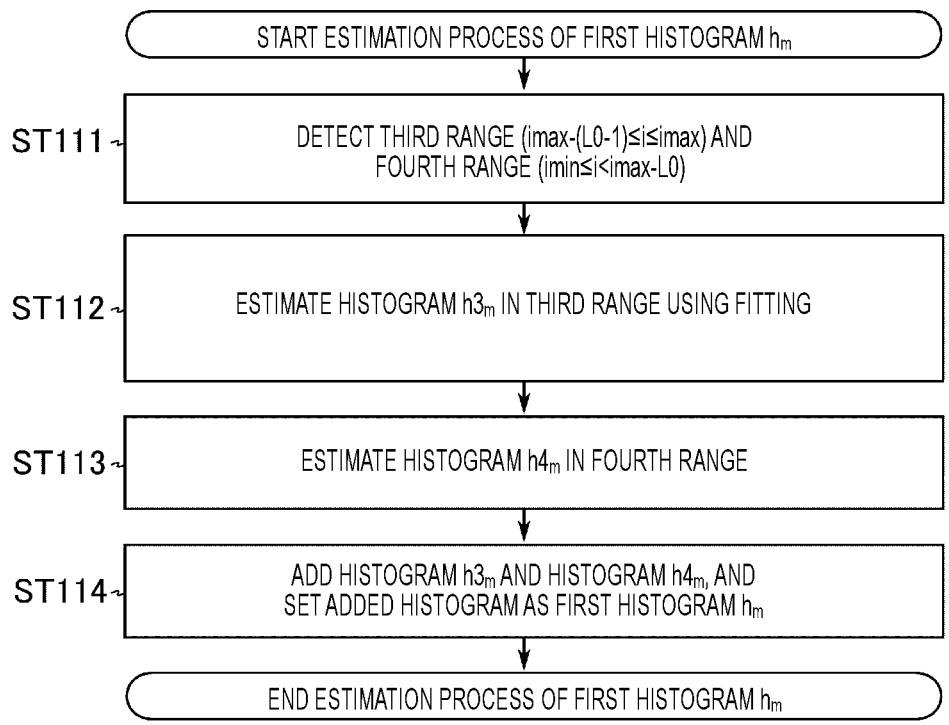
FIG. 27 is a flowchart illustrating an overall flow of an estimation process of a first histogram executed in the memory system according to the first modification.

The overall flow of the estimation process of the first histogram (histogram $h_m$) (ST13) executed in the memory system 1 according to the first modification will be described with reference to FIG. 27. FIG. 27 is a flowchart illustrating the overall flow of the estimation process of the first histogram executed in the memory system according to the first modification.

The controller 10 detects a third range and a fourth range included in the label range of the voltage determination, by using the maximum label imax and the minimum label imin determined in ST40, and the constant L0 (ST111). The third range is a range of labels corresponding to the high voltage-side range, in which the fitting is to be executed in ST13 of the first modification. The third range is a range which is equal to or larger than a label (imax−(L0−1)) and equal to or smaller than the label imax. The fourth range is a range of labels corresponding to a low voltage-side range, which is contiguous to the high voltage-side range and includes a label corresponding to the optimal read voltage Rmopt. The fourth range is a range which is equal to or larger than the label imin and smaller than the label (imax−(L0−1)).

The tracking control unit 101 estimates a histogram $h3_m$ in the third range (ST112). The tracking control unit 101 regards that the overlap of the threshold voltage distributions is small in the high voltage-side range. The tracking control unit 101 estimates the histogram $h3_m$ in the third range, based on the detected histogram $h_d$ in the third range. Details of the estimation of the histogram $h3_m$ will be described later.

The tracking control unit 101 estimates a histogram $h4_m$ in the fourth range, by using the estimated histogram $h3_m$ (ST113). Details of the estimation of the histogram $h4_m$ will be described later.

The tracking control unit 101 sets a histogram obtained by adding the estimated histogram $h3_m$ and the estimated histogram $h4_m$ as the first histogram $h_m$ (ST114).

With the operation described above, the estimation process of the first histogram $h_m$ in the label range of the voltage determination is terminated.

2.1.2 Estimation Process of Histogram in Third Range

Figure 28:
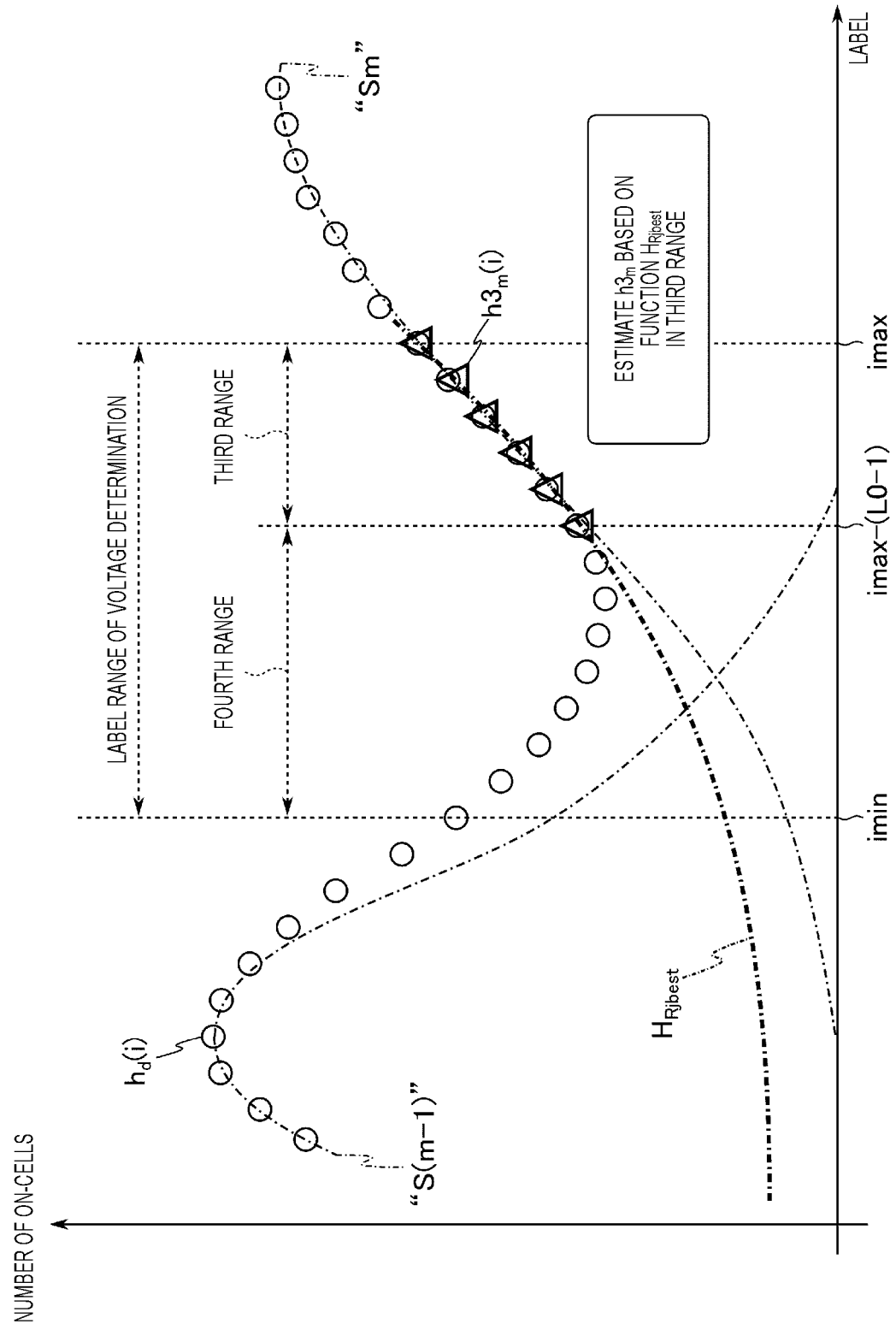
FIG. 28 is a schematic view of an estimation process of a histogram in a third range executed in the memory system according to the first modification.

An outline of the estimation process of the histogram $h3_m$ in the third range (ST112) will be described in detail with reference to FIG. 28. FIG. 28 is a schematic view of the estimation process of a histogram in a third range executed in the memory system according to the first modification.

The tracking control unit 101 detects a distribution function $H_{Rjbest}$ that reproduces an on-cell number $h3_m$ (i) (represented by "Δ" in FIG. 28) of the histogram $h3_m$ in the third range among on-cell numbers $h_d(i)$ (represented by "o" in FIG. 28) of the detected histogram ha by executing a fitting using the least square method.

Then, the tracking control unit 101 estimates the on-cell number $h3_m(i)$ of the histogram $h3_m$ in the third range, based on the acquired distribution function $H_{Rjbest}$.

Hereinafter, the estimation process of the histogram $h3_m$ in the third range will be described in more detail.

The tracking control unit 101 prepares F2 candidate distribution functions $H_{Rj}$ (i.e., $H_{R1}$ to $H_{RF2}$) capable of reproducing the on-cell number $h3_m(i)$. Here, F2 is an integer larger than 1. Further, j is an integer equal to or larger than 1 and equal to or smaller than F2. The candidate distribution functions $H_{Rj}$ in the first modification is represented by formula (8) below.

[Formula 8]

$$H_{Rj} = a_R \times V_{Rj} \quad (8)$$

A value $a_R$ in the formula (8) is a constant. A function $V_{Rj}$ in the formula (8) is represented by formula (9) below.

[Formula 9]

$$V_{Rj} = \frac{e^{\rho j i_3}}{\sqrt{\sum_{i_4=1}^{L0} e^{2\rho j i_4}}} \quad (9)$$

In the formula (9) and the following description, a label $i_3$ (>0) is equal to (i−imax+L0) (i.e., $i_3$=i−imax+L0). A label $i_4$ is an integer equal to or larger than 1 and equal to or smaller than L0. A value "p" is a constant. Further, the formulas (8) and (9) described above are distribution functions generated by using a probability density function of a Laplace distribution.

The tracking control unit 101 detects a candidate distribution function $H_{Rj}$ in which a square error $SE_{Rj}$ (i.e., SER1 to $SE_{RF2}$) between the detected histogram ha and the candidate distribution function $H_{Rj}$ in the third range becomes the minimum among the F2 candidate distribution functions $H_{Rj}$. Here, the square error $SE_{Rj}$ in the third range is the sum of a square of a difference between the on-cell number $h_d(i)$ and a value H ($i_3$) of a candidate distribution function in the label $i_3$ corresponding to the label "i". The square error $SE_{Rj}$ is a function which depends on "j", and is represented by formula (10) below.

[Formula 10]

$$SE_{Rj} = \sum_{i=imax-(L0-1)}^{imax} (h_d(i) - H_{Rj}(i_3))^2 = C_R - 2a_R \times e_{Rj} \quad (10)$$

A value $C_R$ in the formula (10) is represented by formula (11) below. That is, the value $C_R$ is a constant which is calculated by using the on-cell number $h_d(i)$ and does not depend on the distribution function $H_{Rj}$. Further, the value $C_R$ is a constant that is set to satisfy formula (12).

[Formula 11]

$$C_R = \sum_{i=imax-(L0-1)}^{imax} h_d(i)^2 + a_R^2 \sum_{i=imax-(L0-1)}^{imax} V_{Rj}(i_3)^2 \quad (11)$$

[Formula 12]

$$\sum_{i=imax-(L0-1)}^{imax} V_{Rj}(i_3)^2 \approx 1 \quad (12)$$

A function $e_{Rj}$ in the formula (10) is a function which is represented by formula (13) below and depends on the function $V_{Rj}$.

[Formula 13]

$$e_{Rj} = \sum_{i=imax-(L0-1)}^{imax} h_d(i) \times V_{Rj}(i_3) \quad (13)$$

From the above, the tracking control unit 101 searches for a distribution function $H_{Rj}$ in which the value $e_{Rj}$ of the function for the square error $SE_{Rj}$ becomes the maximum, to detect the distribution function $H_{Rj}$ in which the square error $SE_{Rj}$ in the third range becomes the minimum. The tracking control unit 101 sets "j" corresponding to the searched distribution function $H_{Rj}$ as jbest.

Then, the tracking control unit 101 estimates the on-cell number $h3_m(i)$ in the third range, based on the searched distribution function $H_{Rjbest}$.

2.1.2.1 Flow of Estimation Process of Histogram in Third Range

Figure 29:
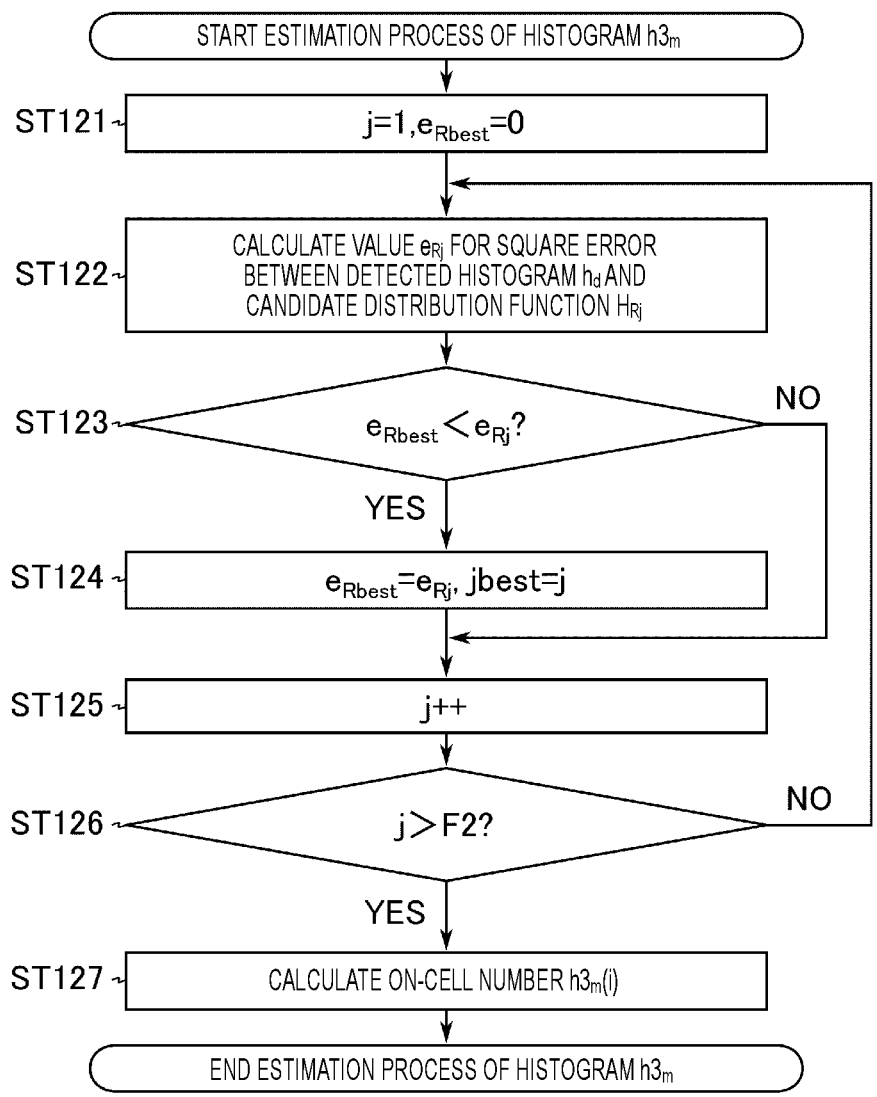
FIG. 29 is a flowchart illustrating a flow of the estimation process of the histogram in the third range executed in the memory system according to the first modification.

The flow of the estimation process of the histogram $h3_m$ in the third range (ST112) will be described with reference to FIG. 29. FIG. 29 is a flowchart illustrating the flow of the estimation process of the histogram in the third range executed in the memory system according to the first modification.

In ST121, the tracking control unit 101 sets a variable "j" to 1, and sets a value of an evaluation value $e_{Rbest}$ of the square error to 0 (j=1, and $e_{Rbest}$=0).

The tracking control unit 101 calculates the value $e_{Rj}$ for the square error between the detected histogram $h_d$ and the candidate distribution function $H_{Rj}$ (ST122).

The tracking control unit 101 determines whether the calculated value $e_{Rj}$ is larger than the evaluation value $e_{Rbest}$ (ST123). When it is determined that the calculated value $e_{Rj}$ is larger than the evaluation value $e_{Rbest}$ (ST123; YES), the process proceeds to ST124. When it is determined that the calculated value $e_{Rj}$ is equal to or smaller than the evaluation value $e_{Rbest}$ (ST123; NO), the process proceeds to ST125.

In ST124, the tracking control unit 101 sets the value of the evaluation value $e_{Rbest}$ to the calculated value $e_{Rj}$ $e_{Rbest}$=$e_{Rj}$), and sets jbest to the variable "j" (jbest=j).

In ST125, the tracking control unit 101 increments the variable "j" (j=j+1), and the process proceeds to ST126.

The tracking control unit 101 determines whether the variable "j" is larger than F2 which is the number of candidates (ST126). When it is determined that the variable "j" is larger than F2 which is the number of candidates (ST126; YES), the process proceeds to ST127. When it is determined that the variable "j" is equal or smaller than F2 which is the number of candidates (ST126; NO), the process proceeds to ST122. As described above, the tracking control unit 101 repeats ST122 to ST126 until it is determined that the variable "j" is larger than F2 which is the number of candidates in ST126. As a result, the tracking control unit 101 sets a variable "j" in which the square error SER becomes the minimum and the value $e_{Rj}$ becomes the maximum, to jbest.

In ST127, the tracking control unit 101 estimates the on-cell number $h3_m(i)$ in the third range, by using the candidate distribution function $H_{Rjbest}$ corresponding to jbest. More specifically, the tracking control unit 101 estimates the distribution function value $H_{Rjbest}(i)$ as the on-cell number $h3_m(i)$ in the third range.

As described above, the estimation of the histogram $h3_m$ in the third range is terminated.

2.1.3 Estimation Process of Histogram in Fourth Range

Figure 30:
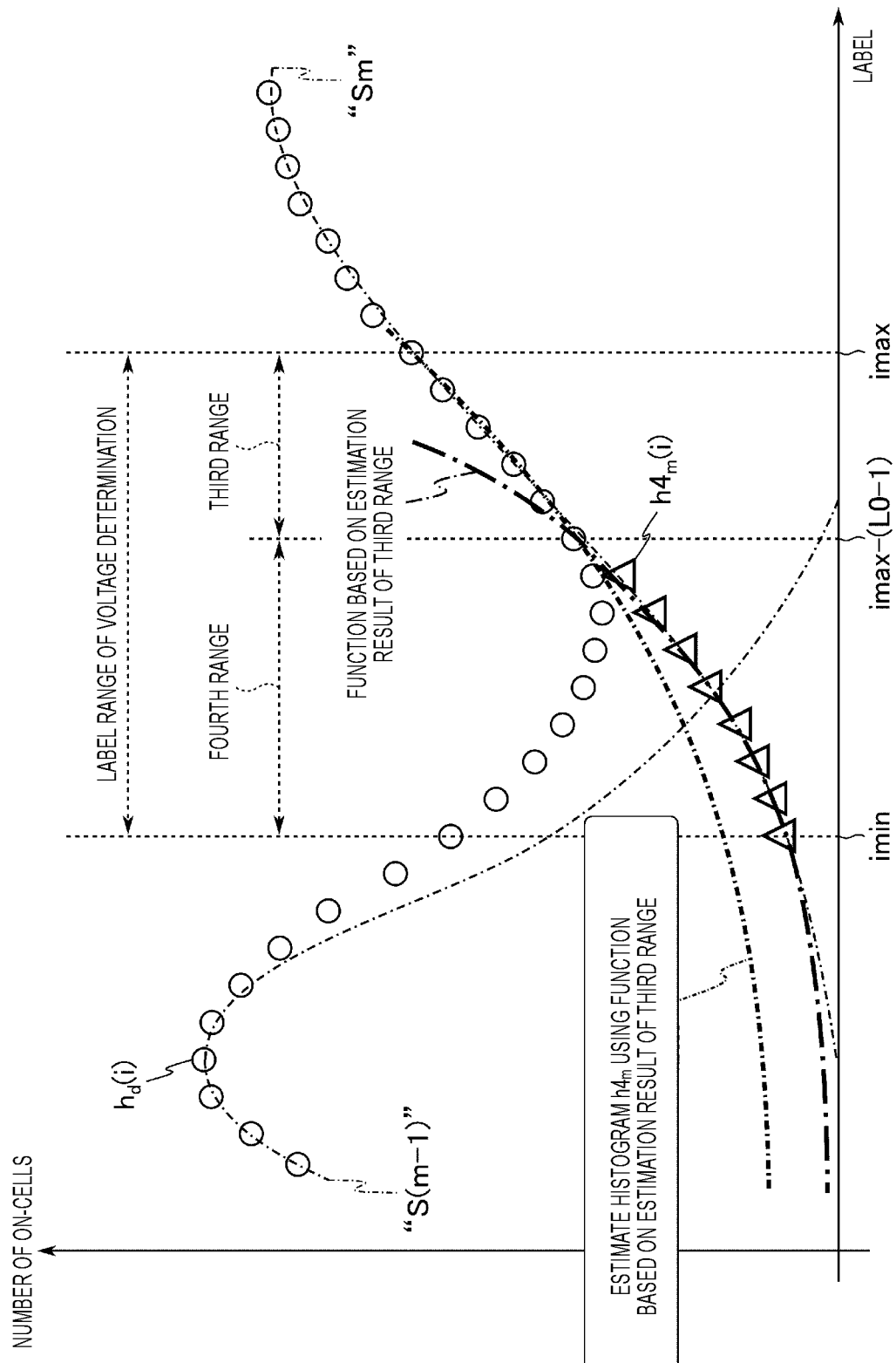
FIG. 30 is a schematic view of an estimation process of a histogram in a fourth range executed in the memory system according to the first modification.

The estimation process of the histogram $h4_m$ in the fourth range (ST113) will be described in detail with reference to FIG. 30. FIG. 30 is a schematic view of the estimation process of the histogram in the fourth range executed in the memory system according to the first modification.

In the estimation process of the histogram $h4_m$ in the fourth range, the tracking control unit 101 estimates the on-cell number $h4_m(i)$ (represented by "Δ" in FIG. 30) in the fourth range, by using a function (represented by a "function based on an estimation result of the third range" in FIG. 30 and the following description) represented by formula (14) below, which uses the on-cell number $h3_m(imax-(L0-1))$ in the third range.

[Formula 14]

$$h4_m(i) = h3_m(imax-L0+1) \times B_{Rjbest}^{((imax-L0+1)-i)} \quad (14)$$

A value $B_{Rjbest}$ in the formula (14) is a constant determined to correspond to the distribution function $H_{Rjbest}$.

Figure 31:
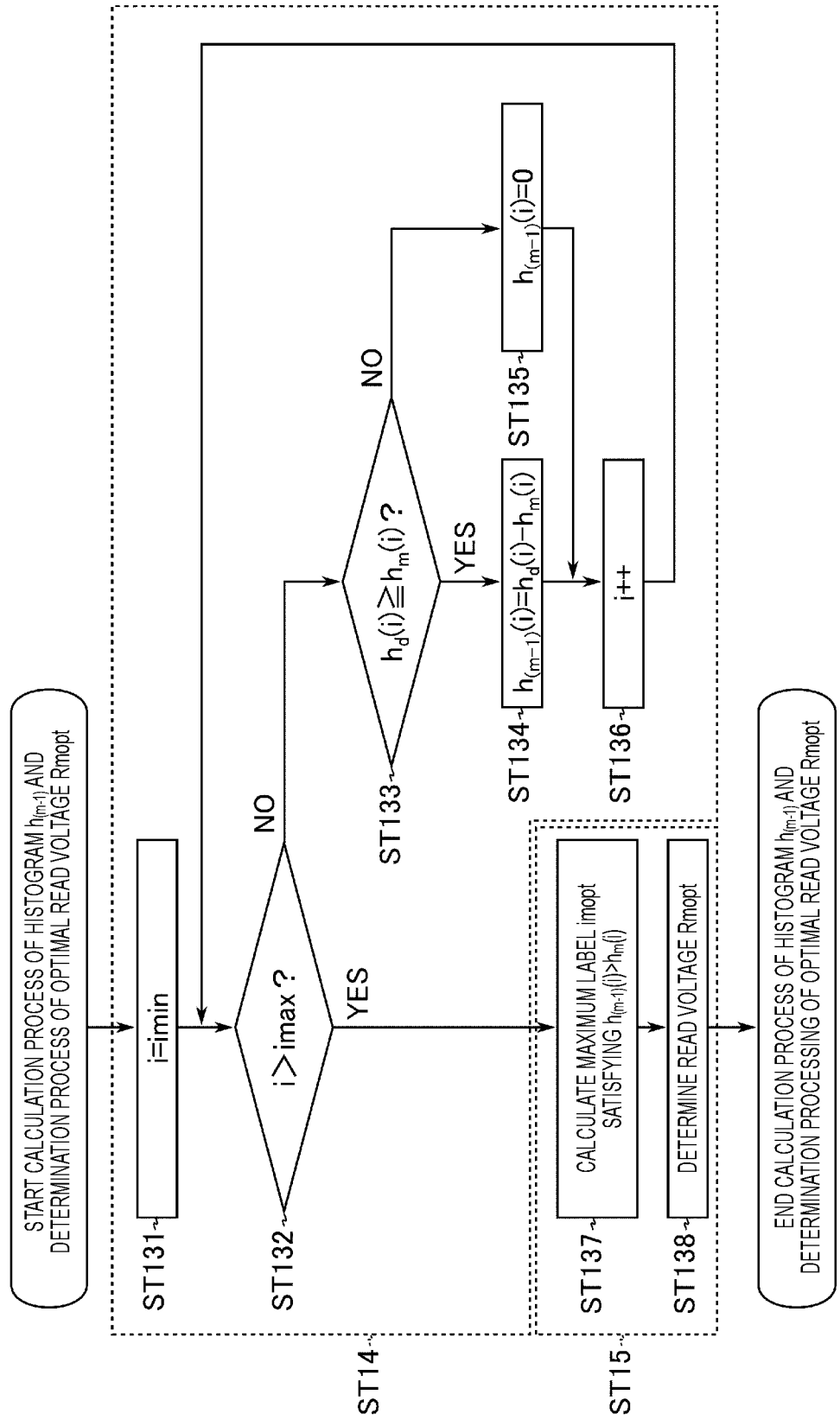
FIG. 31 is a flowchart illustrating a calculation process of a second histogram and a determination process of an optimal read voltage executed in the memory system according to the first modification.

2.1.4 Calculation Process of Second Histogram and Determination Process of Optimal Read Voltage The flow of the calculation process of the second histogram (histogram $h_{(m-1)}$) and the determination process of the optimal read voltage Rmopt executed in the memory system 1 according to the first modification will be described with reference to FIG. 31. FIG. 31 is a flowchart illustrating the calculation process of the second histogram and the determination process of the optimal read voltage executed in the memory system according to the first modification.

In ST131, the tracking control unit 101 sets the label "i" to imin (i=imin).

The tracking control unit 101 determines whether the label "i" is larger than the label imax (ST132). When it is determined that the label "i" is larger than the label imax (ST132; YES), the process proceeds to ST137. When it is determined that the label "i" is equal to or smaller than the label imax (ST132; NO), the process proceeds to ST133.

The tracking control unit 101 determines whether the on-cell number $h_d(i)$ is equal to or larger than the on-cell number $h_m(i)$ (ST133). When it is determined that the on-cell number $h_d(i)$ is equal to or larger than the on-cell number $h_m(i)$ (ST133; YES), the process proceeds to ST134.

When it is determined that the on-cell number $h_d(i)$ is smaller than the on-cell number $h_m(i)$ (ST133; NO), the process proceeds to ST135.

When the on-cell number $h_d(i)$ is equal to or larger than the on-cell number $h_m(i)$ (ST133; YES), the tracking control unit 101 sets a value obtained by subtracting the on-cell number $h_m(i)$ from the on-cell number $h_d(i)$ as the on-cell number $h_{(m-1)}(i)$ (ST134). That is, when the on-cell number $h_d(i)$ of the detected histogram $h_d$ is equal to or larger than the estimated on-cell number $h_m(i)$ of the first histogram, the tracking control unit 101 regards a difference thereof as the on-cell number $h_{(m-1)}(i)$ of the histogram $h_{(m-1)}$. Then, the process proceeds to ST136.

When the on-cell number $h_d(i)$ is smaller than the on-cell number $h_m(i)$ (ST133; NO), the tracking control unit 101 sets the on-cell number $h_{(m-1)}(i)$ to 0 (ST135). That is, when the on-cell number $h_d(i)$ of the detected histogram $h_d$ is smaller than the estimated on-cell number $h_m(i)$ of the first histogram, the tracking control unit 101 regards the on-cell number $h_{(m-1)}(i)$ of the histogram $h_{(m-1)}$ as 0. Then, the process proceeds to ST136.

ST136 to ST138 are substantially the same as ST86 to ST88 in the embodiment.

With the operation described above, the optimal read voltage Rmopt is determined.

According to the memory system 1 of the first modification, even when the overlap of the threshold voltage distribution increases in the low voltage-side portion of the valley area of the threshold voltage distributions of the states "S(m-1)" and "Sm" by the spread of the threshold voltage distribution of the state "Sm" in the low voltage-side, the optimal read voltage Rmopt can be determined.

2.2 Second Modification

In the embodiment, the tracking control unit 101 determines the optimal read voltage R1opt in the threshold voltage tracking process. However, the present disclosure is not limited thereto. When the overlap of the respective threshold voltage distributions of the states "S0" and "S1" is large, the histogram $h_{(m-1)}$ (or histogram $h_m$) cannot be estimated with high precision by the fitting of the detected histogram $h_d$. In this case, the controller 10 cannot determine the optimal read voltage R1opt based on estimation of the histogram $h_{(m-1)}$ (or histogram $h_m$). More specifically, the tracking control unit 101 may perform a process of determining whether or not to determine the optimal read voltage R1opt.

Hereinafter, an operation executed in a memory system 1 according to the second modification will be described focusing on the differences from the operation of the memory system 1 according to the embodiment.

2.2.1 Threshold Voltage Tracking Process

Figure 32:
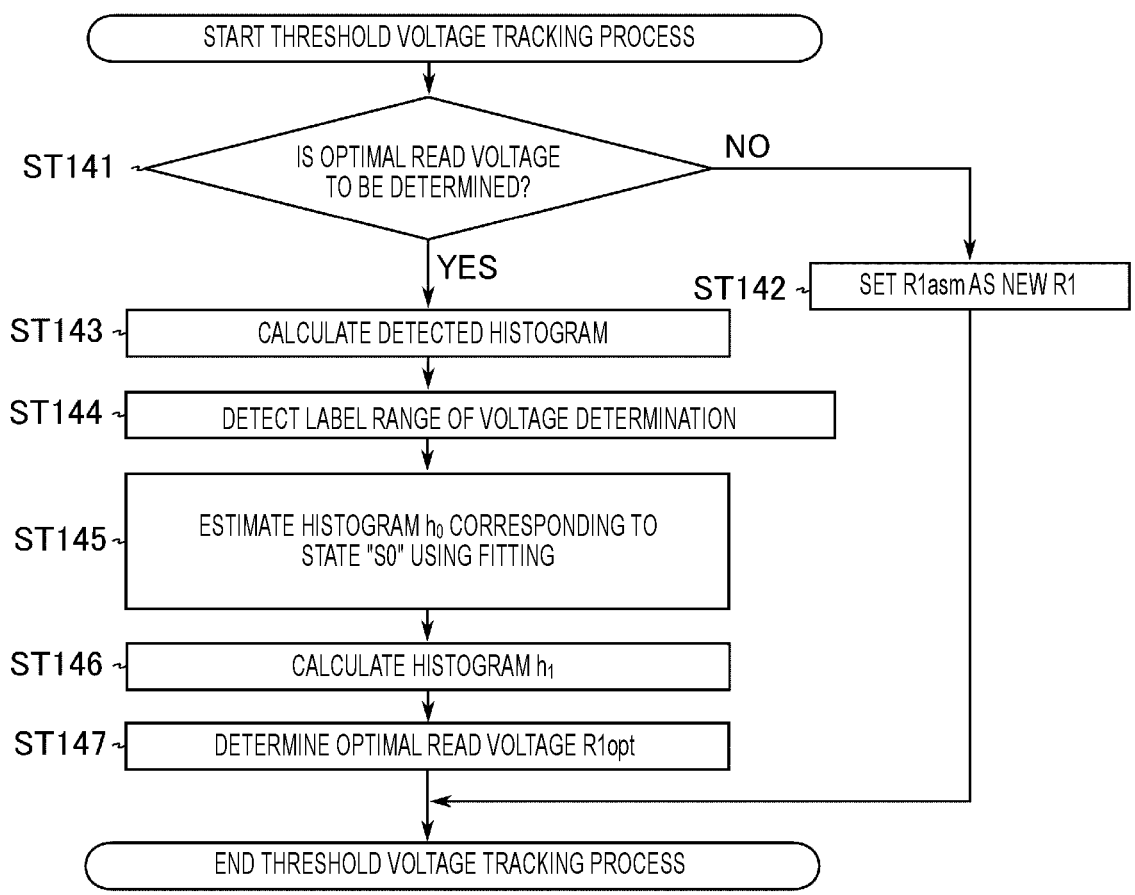
FIG. 32 is a flowchart illustrating a flow of a threshold voltage tracking process executed in a memory system according to a second modification.

The flow of the threshold voltage tracking process executed in the memory system 1 according to the second modification will be described with reference to FIG. 32. FIG. 32 is a flowchart illustrating the flow of the threshold voltage tracking process executed in the memory system according to the second modification.

The controller 10 determines whether or not to determine the optimal read voltage R1opt (ST141). When the controller 10 determines to determine the optimal read voltage R1opt (ST141; YES), the process proceeds to ST143. When the controller 10 determines not to determine the optimal read voltage R1opt (ST141; NO), the process proceeds to ST142. The controller 10 determines whether or not to determine the optimal read voltage R1opt, based on whether the label range of the voltage determination, including a range in which the overlap of the respective threshold voltage distributions of the states "S0" and "S1" is small can be detected. Details of the determination of whether or not to determine the optimal read voltage R1$opt$ will be described later.

The tracking control unit 101 determines, for example, the read voltage R1$asm$ as a new read voltage R1 (ST142).

ST143 to ST147 are the same as ST11 to ST15 according to the embodiment, respectively.

As described above, in the memory system 1 according to the second modification, the new read voltage R1 is determined separately in a case of determining the optimal read voltage R1$opt$ and a case of not determining the optimal read voltage R1$opt$.

2.2.2 Determination of Whether or not to Determine Optimal Read Voltage R1$opt$

Figure 33A:
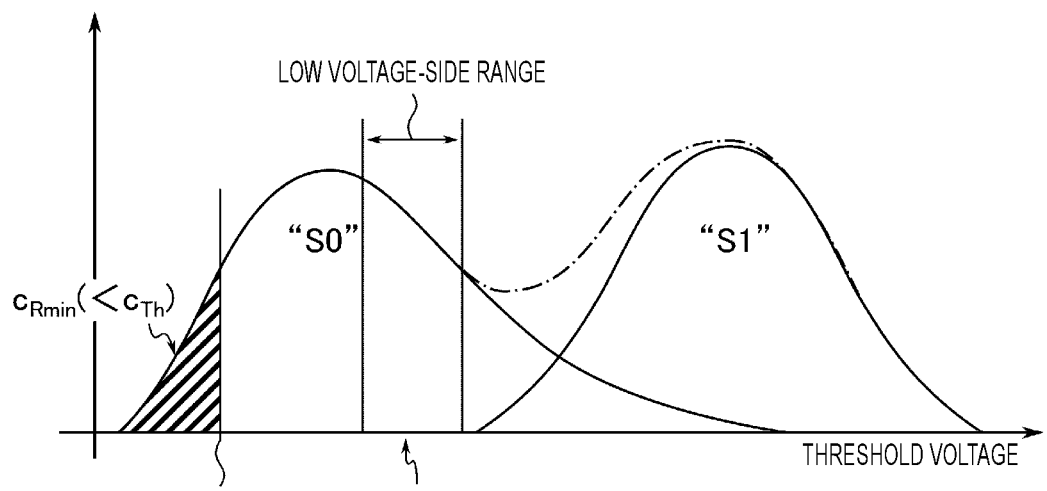
FIGS. 33A and 33B are schematic views illustrating a determination of whether or not to determine an optimal read voltage executed in the memory system according to the second modification.
Figure 33B:
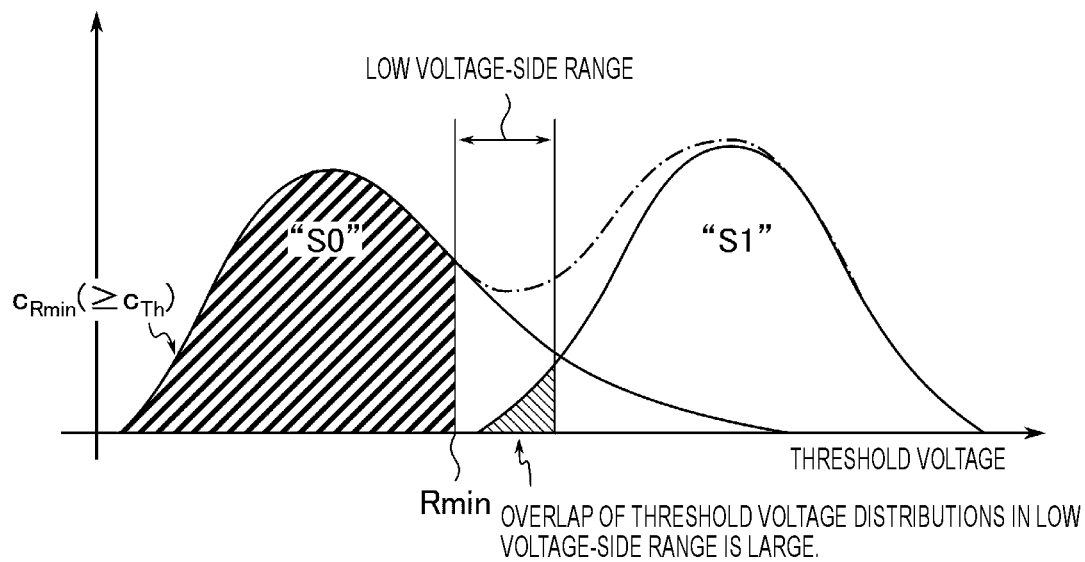

Next, the determination of whether or not to determine the optimal read voltage R1$opt$ (ST141) will be described with reference to FIGS. 33A and 33B. FIGS. 33A and 33B are schematic views illustrating the determination of whether or not to determine an optimal read voltage executed in the memory system according to the second modification.

As illustrated in FIG. 33A, when $c_{Rmin}$ which is the number of memory cell transistors MT is smaller than a reference value $c_{Th}$, the overlap of the respective threshold voltage distributions of the states "S0" and "S1" in the low voltage-side range may be small (almost zero in an example illustrated in FIG. 33A). Here, the number of memory cell transistors MT $c_{Rmin}$ is the number of memory cell transistors MT having a threshold voltage equal to or lower than a minimum read voltage Rmin that can be for executing a read operation. Hereinafter, the minimum read voltage Rmin that can be for executing the read operation will also be simply referred to as a lower limit voltage Rmin. The number of memory cell transistors MT $c_{Rmin}$ is the number of memory cell transistors MT which become the ON state when the read operation is performed with the lower limit voltage Rmin. Meanwhile, as illustrated in FIG. 33B, when the number of memory cell transistors MT $c_{Rmin}$ is equal to or larger than the reference value $c_{Th}$, the overlap of the respective threshold voltage distributions of the states "S0" and "S1" in the low voltage-side range may be large. A relationship between the threshold voltage distribution and the number of memory cell transistors MT $c_{Rmin}$, which are illustrated in FIGS. 33A and 33B may be proven by, for example, the characteristics evaluation of the NAND memory 20.

The tracking control unit 101 compares the number of memory cell transistors MT $c_{Rmin}$ and the reference value $c_{Th}$. As illustrated in FIG. 33A, when the number of memory cell transistors MT option, is smaller than the reference value $c_{Th}$, the tracking control unit 101 determines to determine the optimal read voltage R1$opt$. As illustrated in FIG. 33B, when the number of memory cell transistors MT $c_{Rmin}$ is equal to or larger than the reference value $c_{Th}$, the tracking control unit 101 determines not to determine the optimal read voltage R1$opt$.

Comparative Example 3

As illustrated in FIG. 33B, when the number of memory cell transistors MT $c_{Rmin}$ is equal to or larger than the reference value $c_{Th}$, the overlap of the respective threshold voltage distributions in the low voltage-side range may be large. That is, the voltage range in which a controller performs the fitting at the time of determining the optimal read voltage R1$opt$ becomes a voltage range in which the overlap of the threshold voltage distributions is large. Even in this case as well, the controller of a memory system according to Comparative Example 3 tries to determine the optimal read voltage R1$opt$. However, in this case, the controller cannot appropriately perform the fitting of the detected histogram. As a result, the difference between a new read voltage determined by using the fitting and a true optimal read voltage may become larger than the difference between the read voltage R1$asm$ and the true optimal read voltage. Accordingly, the error bit number may increase.

According to the second modification, when the lower limit voltage Rmin is close to a valley position of the threshold voltage distributions of the states "S0" and "S1", the tracking control unit 101 sets the read voltage R1$asm$ as a new read voltage Rm, instead of determining the optimal read voltage R1$opt$. As a result, the memory system 1 according to the second modification can prevent the increase in the error bit number, which is caused from the determination of the optimal read voltage R1$opt$ based on the detected histogram $h_d$ of the voltage range in which the overlap of the threshold voltage distributions is large.

Note that, the controller 10 may determine the optimal read voltages R2$opt$ to R7$opt$ by the similar operation to that of the embodiment with respect to the read voltages R2 to R7, respectively, in the threshold voltage tracking process.

2.3 Third Modification

In the second modification, the tracking control unit 101 compares the number of memory cell transistors MT $c_{Rmin}$ having the threshold voltage equal to or lower than the lower limit voltage Rmin with the reference value $c_{Th}$, and determines whether or not to determine the optimal read voltage R1$opt$. However, the present disclosure is not limited thereto. The tracking control unit 101 may determine whether or not to determine the optimal read voltage R1$opt$, based on the shape of the detected histogram $h_d$.

Hereinafter, the operation executed in the memory system 1 according to the third modification will be described focusing on the differences from the operation of the memory system according to the second modification.

2.3.1 Threshold Voltage Tracking Process

Figure 34:
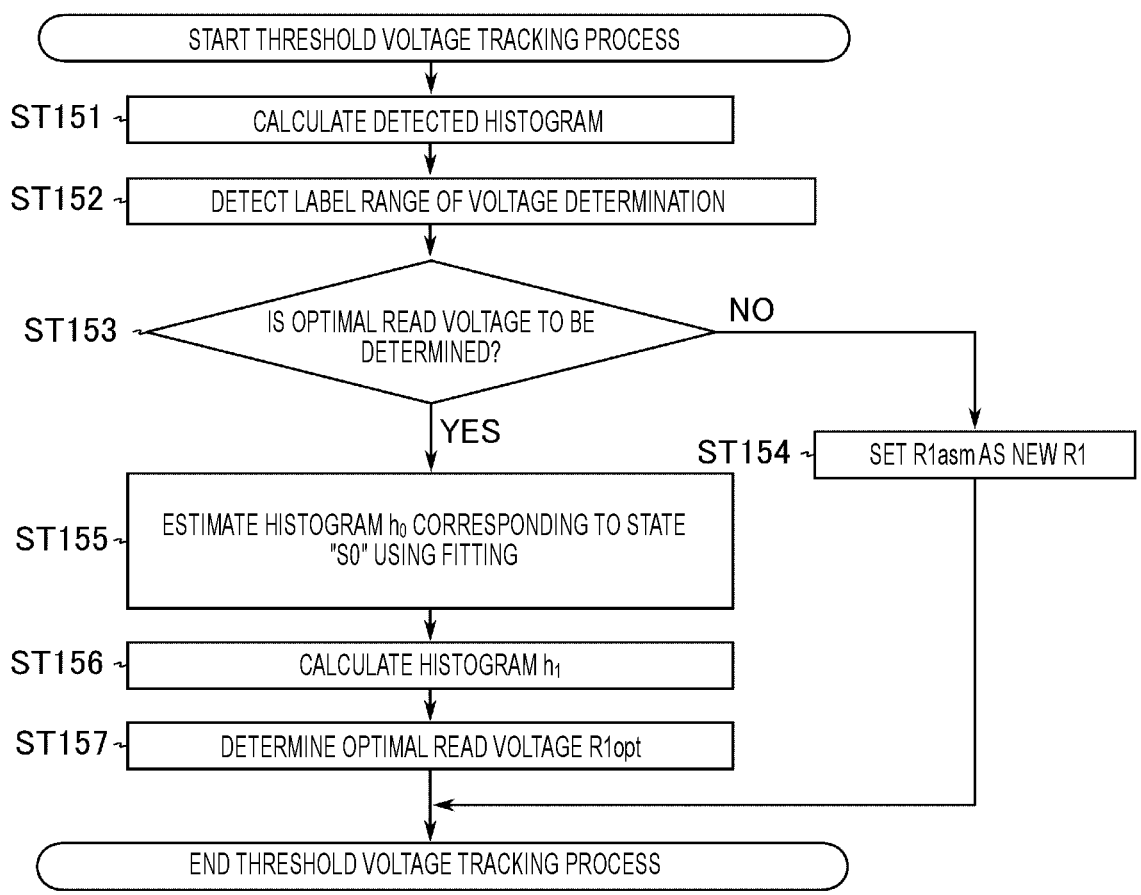
FIG. 34 is a flowchart illustrating a flow of a threshold voltage tracking process executed in a memory system according to a third modification.

The flow of the threshold voltage tracking process executed in the memory system 1 according to the third modification will be described with reference to FIG. 34. FIG. 34 is a flowchart illustrating the flow of the threshold voltage tracking process executed in the memory system according to the third modification.

The tracking control unit 101 performs the calculation of the detected histogram (ST151) and the detection process of the label range of the voltage determination (ST152), similarly to ST11 and ST12 of the operation of the memory system according to the embodiment.

Then, the tracking control unit 101 determines whether or not to determine the optimal read voltage R1$opt$ (ST153). When the tracking control unit 101 determines to determine the optimal read voltage R1$opt$ (ST153; YES), the process proceeds to ST155. When the tracking control unit 101 determines not to determine the optimal read voltage R1$opt$ (ST153; NO), the process proceeds to ST154. The tracking control unit 101 determines whether or not to determine the optimal read voltage R1$opt$, based on the shape of the detected histogram $h_d$ in the first range. Details of the determination of whether or not to determine the optimal read voltage R1$opt$ will be described later.

ST154 to ST157 are the same as ST142, and ST145 to ST147 according to the second modification, respectively.

2.3.2 Determination of Whether or not to Determine Optimal Read Voltage

Figure 35:
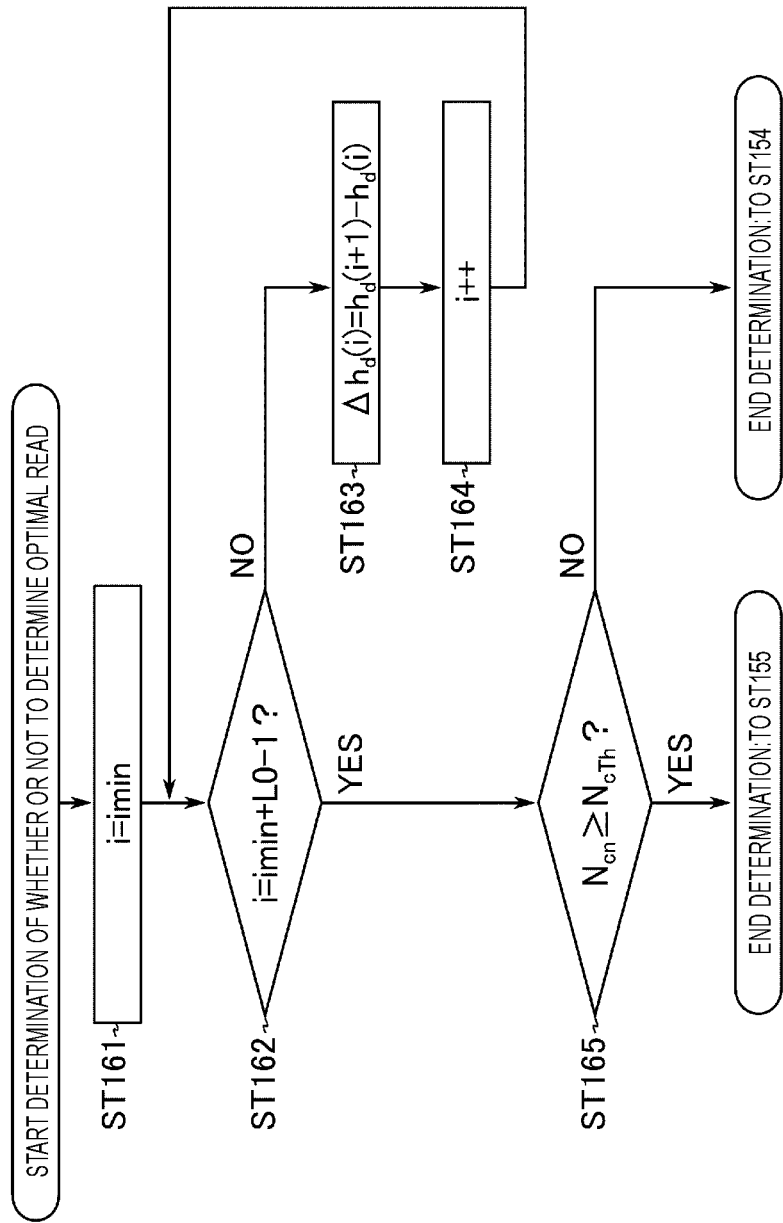
FIG. 35 is a flowchart illustrating a determination of whether or not to determine an optimal read voltage executed in the memory system according to the third modification.
Figure 36A:
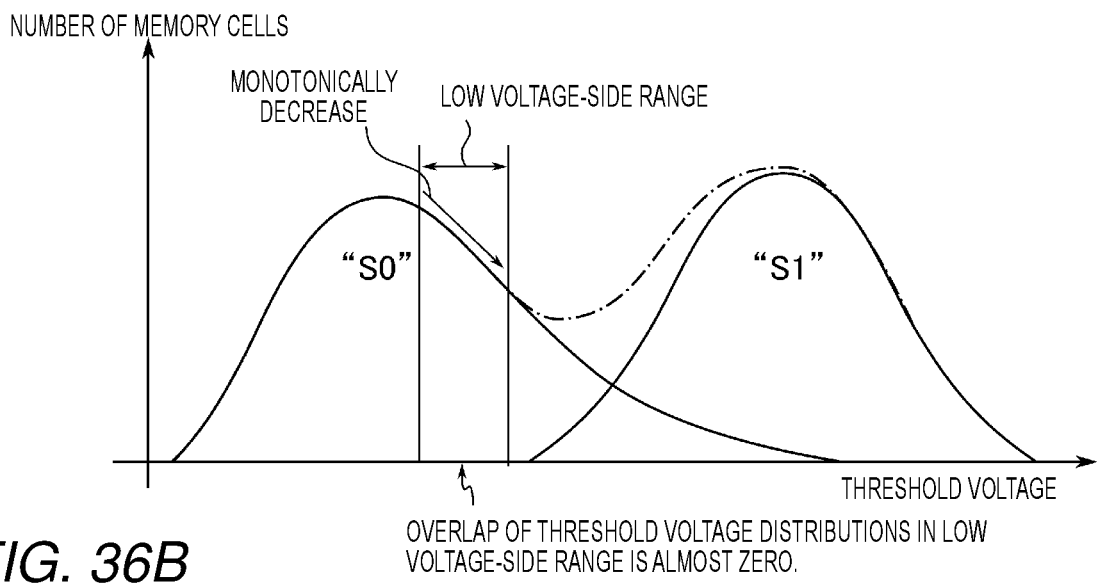
FIGS. 36A and 36B are schematic views illustrating the determination of whether or not to determine the optimal read voltage executed in the memory system according to the third modification.
Figure 36B:
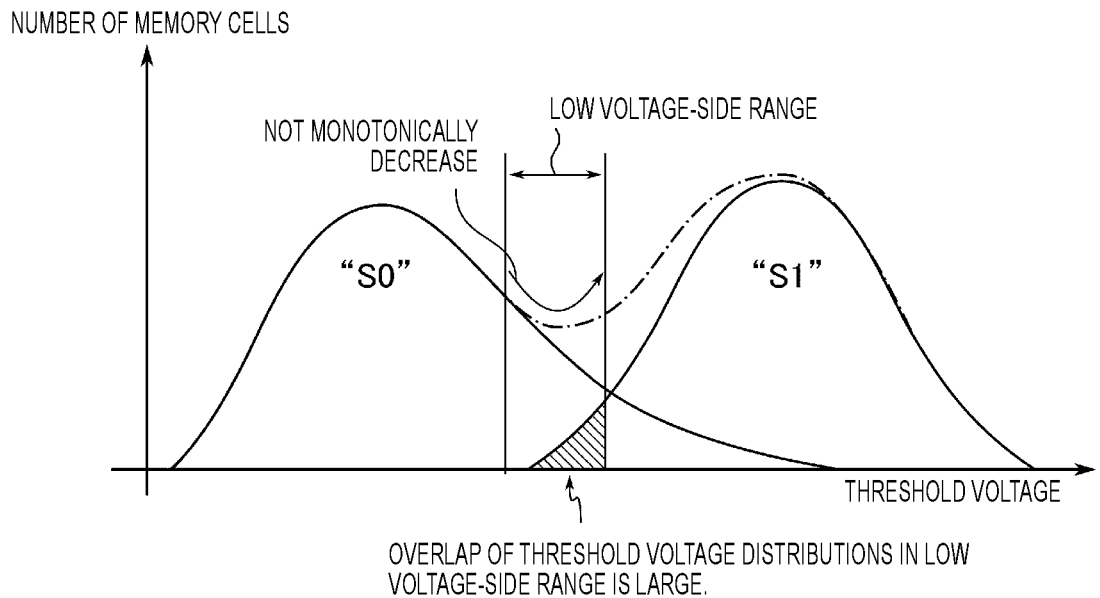

The flow of the determination of whether or not to determine the optimal read voltage R1opt executed in the memory system 1 according to the third modification (ST153) will be described with reference to FIGS. 35, 36A, and 36B. FIG. 35 is a flowchart illustrating the determination of whether or not to determine an optimal read voltage executed in the memory system according to the third modification. FIGS. 36A and 36B are schematic views illustrating the determination of whether or not to determine an optimal read voltage executed in the memory system according to the third modification.

In the determination of whether or not to determine the optimal read voltage, the tracking control unit 101 determines whether the on-cell numbers $h_d(i)$ decrease monotonically with the increase in label "i" in the first range. When it is determined that the on-cell numbers $h_d(i)$ decrease monotonically with the increase in label "i" in the first range, the tracking control unit 101 determines that the overlap of the respective threshold voltage distributions of the states "S0" and "S1" in the low voltage-side range is small (almost zero in the example illustrated in FIG. 36A), as illustrated in FIG. 36A. Then, the tracking control unit 101 determines to estimate the optimal read voltage R1opt. Meanwhile, when it is determined that the on-cell numbers $h_d(i)$ do not decrease monotonically with the increase in label "i" in the first range, the tracking control unit 101 determines that the overlap of the respective threshold voltage distributions of the states "S0" and "S1" in the low voltage-side range is large, as illustrated in FIG. 36B. Then, the tracking control unit 101 determines not to estimate the optimal read voltage R1opt.

Refer to FIG. 35. In ST161, the tracking control unit 101 sets the label "i" to imin (i=imin).

The tracking control unit 101 determines whether the label "i" is equal to (imin+L0−1) (ST162). When it is determined that the label "i" is equal to (imin+L0−1) (ST162; YES), the process proceeds to ST165. When it is determined that the label "i" is smaller than (imin+L0−1) (ST162; NO), the process proceeds to ST163.

The tracking control unit 101 calculates a difference $\Delta h_d(i)$ obtained by subtracting the on-cell number $h_d(i)$ from the on-cell number $h_d(i+1)$ (ST163).

The tracking control unit 101 increments the label "i" (ST164), and the process proceeds to ST162. As described above, the tracking control unit 101 repeats ST162 to ST164 until it is determined that the label "i" is equal to (imin+L0−1) (ST162; YES).

The tracking control unit 101 calculates an evaluation value $N_{cn}$ based on the result of the loop process of ST162 to ST164. The evaluation value $N_{cn}$ is a value for indicating whether the on-cell numbers $h_d(i)$ decrease monotonically with the increase in label "i". The evaluation value $N_{cn}$ is the maximum value among numbers in which differences $\Delta h_d(i)$ become consecutively negative when differences $\Delta h_d(imin)$, $\Delta h_d(imin+1)$, . . . , $\Delta h_d(imin+L0−2)$, $\Delta h_d(imin+L0−1)$ are arranged in this order. The tracking control unit 101 determines whether the on-cell numbers $h_d(i)$ decrease monotonically with the increase in label "i" in the first range, based on whether the evaluation value $N_{cn}$ is equal to or larger than a reference value $N_{cTh}$.

That is, the tracking control unit 101 determines whether or not to determine the optimal read voltage R1opt, based on the evaluation value $N_{cn}$ (ST165). When it is determined that the evaluation value $N_{cn}$ is equal to or larger than the reference value $N_{cTh}$ (ST165; YES), the tracking control unit 101 determines to determine the optimal read voltage R1opt, because the on-cell numbers $h_d(i)$ decrease monotonically with the increase in label "i", and the process proceeds to ST155. When it is determined that the evaluation value $N_{cn}$ is smaller than the reference value $N_{cTh}$ (ST165; NO), the tracking control unit 101 determines not to determine the optimal read voltage R1opt, because the on-cell numbers $h_d(i)$ do not decrease monotonically with the increase in label "i", and the process proceeds to ST154.

As described above, whether or not to determine the optimal read voltage R1opt is determined.

Figure 37A:
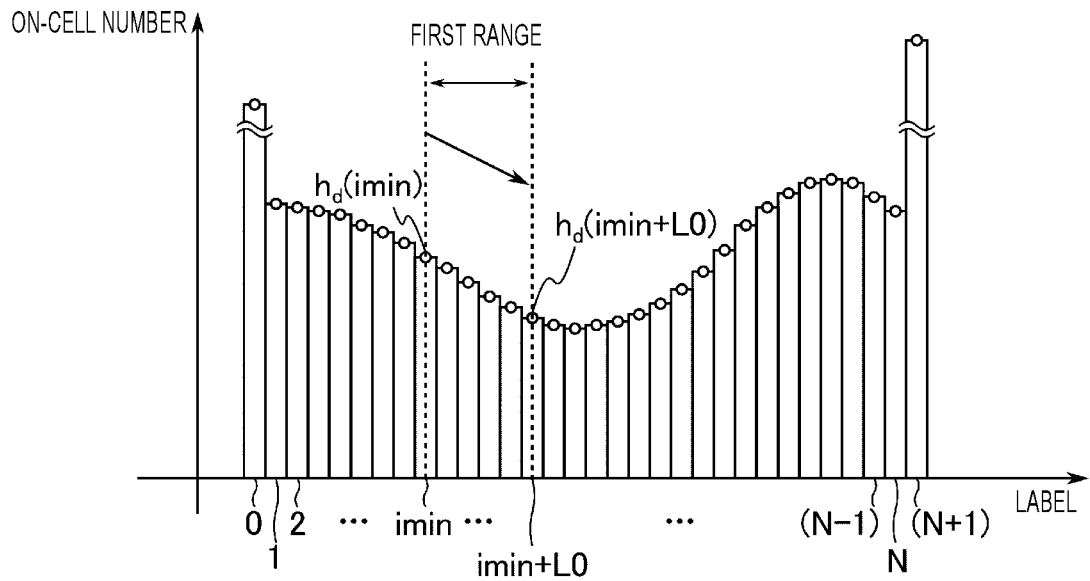
FIGS. 37A and 37B are schematic views illustrating the determination of whether or not to determine the optimal read voltage executed in the memory system according to the third modification.
Figure 37B:
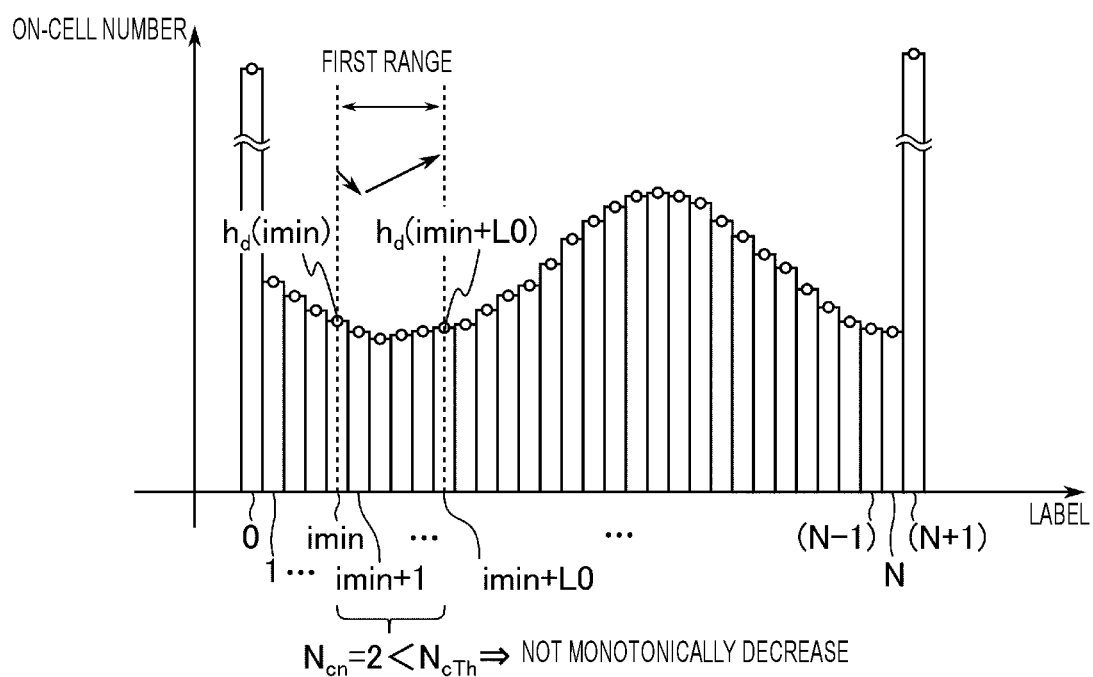

The determination of whether or not to determine the optimal read voltage R1opt will be further described with reference to FIGS. 37A and 37B. FIGS. 37A and 37B are schematic views illustrating the determination of whether or not to determine the optimal read voltage executed in the memory system according to the third modification.

As illustrated in FIG. 37A, when the evaluation value $N_{cn}$ is equal to or larger than the reference value $N_{cTh}$ in the first range (e.g., when the on-cell numbers $h_d(i)$ decrease monotonically with the increase in read voltage), the tracking control unit 101 determines to determine the optimal read voltage R1opt, because the overlap of the threshold voltage distributions in the low voltage-side range is small.

In the example illustrated in FIG. 37A, the differences $\Delta h_d(imin)$, $\Delta h_d(imin+1)$, . . . , $\Delta h_d(imin+L0−2)$, $\Delta h_d(imin+L0−1)$ are all negative. That is, the evaluation value $N_{cn}$ is L0. The tracking control unit 101 determines to determine the optimal read voltage R1opt, when the evaluation value $N_{cn}$ (here, L0) is equal to or larger than the reference value $N_{cTh}$.

Meanwhile, as illustrated in FIG. 37B, when the evaluation value $N_{cn}$ in the first range is smaller than the reference value $N_{cTh}$ (e.g., when the detected histogram in the first range has a shape which is convex downward), the tracking control unit 101 determines not to determine the optimal read voltage R1opt, because the overlap of the threshold voltage distributions in the low voltage-side range is large.

In the example illustrated in FIG. 37B, the differences $\Delta h_d(imin)$ and $\Delta h_d(imin+1)$ are negative. Meanwhile, differences $\Delta h_d(imin+2)$, $\Delta h_d(imin+3)$, $\Delta h_d(imin+L0−2)$, and $\Delta h_d(imin+L0−1)$ are all positive. That is, the evaluation value $N_{cn}$ is 2. The tracking control unit 101 determines not to determine the optimal read voltage R1opt, when the evaluation value $N_{cn}$ (here, 2) is smaller than the reference value $N_{cTh}$.

With the memory system 1 according to the third modification as described above, the increase in the error bit number can be prevented, as in the second modification.

2.4 Fourth Modification

In the third modification, the tracking control unit 101 determines whether or not to determine the optimal read voltage R1opt, based on the maximum value (evaluation value $N_{cn}$) among the numbers in which the difference $\Delta h_d(i)$ becomes consecutively negative, in the first range. However, the present disclosure is not limited thereto. The tracking control unit 101 may determine whether or not to determine the optimal read voltage R1opt, based on the number of negative differences $\Delta h_d(i)$ in the first range.

In the following description, the operation executed in the memory system 1 according to the fourth modification will be described focusing on the differences from the operation of the memory system according to the third modification.

Figure 38:
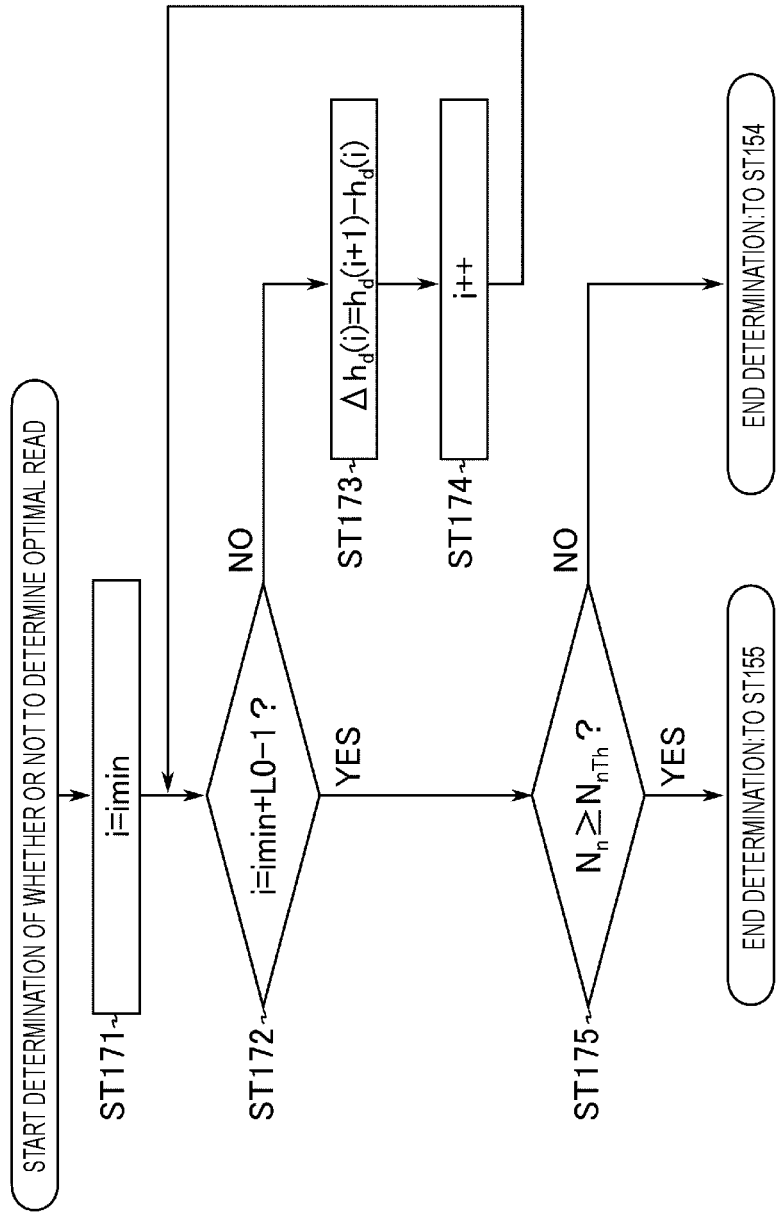
FIG. 38 is a flowchart illustrating a determination of whether or not to determine an optimal read voltage executed in a memory system according to a fourth modification.

The determination of whether or not to determine the optimal read voltage R1opt executed in the memory system 1 according to the fourth modification will be described with reference to FIG. 38. FIG. 38 is a flowchart illustrating the determination of whether or not to determine the optimal read voltage executed in the memory system according to the fourth modification.

In the determination of whether or not to determine the optimal read voltage R1opt, the tracking control unit 101 determines whether the on-cell numbers $h_d(i)$ tend to decrease with the increase in label "i" in the first range. When the on-cell numbers $h_d(i)$ tend to decrease with the increase in label "i" in the first range, the tracking control unit 101 estimates the optimal read voltage R1opt. When the on-cell numbers $h_d(i)$ do not tend to decrease with the increase in label "i" in the first range, the tracking control unit 101 sets the read voltage R1asm as the read voltage R1.

ST171 to ST174 are the same as ST161 to ST164, respectively.

The tracking control unit 101 calculates an evaluation value $N_n$, based on the result of the loop processes of ST172 to ST174. The evaluation value $N_n$ is a value for indicating whether the on-cell numbers $h_d(i)$ decrease monotonically with the increase in label "i". The evaluation value $N_n$ is the number of negative differences $\Delta h_d(i)$ among the differences $\Delta h_d(i)$ calculated in the loop processes of ST172 to ST174. The tracking control unit 101 determines whether the on-cell numbers $h_d(i)$ decrease monotonically with the increase in label "i" in the first range, based on whether the evaluation value $N_n$ is equal to or larger than a determination value $N_{nTh}$ ($0<N_{nTh}\leq L0$).

That is, the tracking control unit 101 determines whether or not to determine the optimal read voltage R1opt, based on the evaluation value $N_n$ (ST175). When the evaluation value $N_n$ is equal to or larger than the determination value $N_{nTh}$ (ST175; YES), the tracking control unit 101 determines to determine the optimal read voltage R1opt, because the on-cell numbers $h_d(i)$ decrease monotonically with the increase in label "i", and the process proceeds to ST155. When the evaluation value $N_n$ is smaller than the determination value $N_{nTh}$ (ST175; NO), the tracking control unit 101 determines not to determine the optimal read voltage R1opt, because the on-cell numbers $h_d(i)$ do not decrease monotonically with the increase in label "i", and the process proceeds to ST154.

Figure 39:
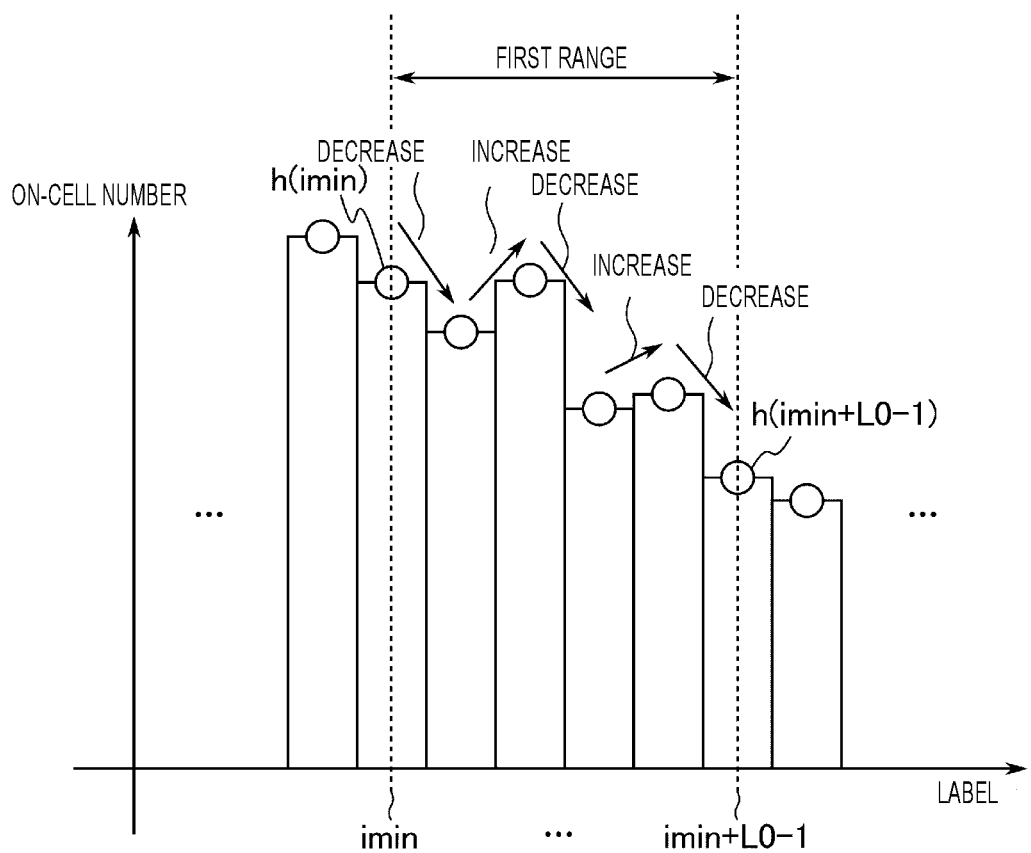
FIG. 39 is a view illustrating a fluctuation of values of a detected histogram by noise in the memory system according to the fourth modification.

FIG. 39 is a view illustrating a fluctuation of the on-cell numbers $h_d(i)$ of the detected histogram by noise. In the example illustrated in FIG. 39, the on-cell number $h_d(imin)$ is larger than the on-cell number $h_d(imin+1)$. The on-cell number $h_d(imin+1)$ is smaller than the on-cell number $h_d(imin+2)$. The on-cell number $h_d(imin+2)$ is larger than the on-cell number $h_d(imin+3)$. As such, the on-cell numbers $h_d(i)$ fluctuate by, for example, noise.

According to the memory system 1 of the fourth modification, the tracking control unit 101 may determine whether the low voltage-side range is a range in which the overlap of the threshold voltage distributions is small, based on the evaluation value $N_n$, even when the on-cell numbers $h_d(i)$ fluctuate.

As such, in the memory system 1 according to the fourth modification, even when the detected histogram $h_d$ fluctuates by noise, the increase in the error bit number can be prevented as in the second modification and the third modification.

2.5 Fifth Modification

In the above-described embodiment, the tracking control unit 101 determines the optimal read voltages R1opt to R7opt with respect to all read voltages R1 to R7, respectively. However, the present disclosure is not limited thereto. The tracking control unit 101 may determine whether or not to determine the optimal read voltage Rmopt, with respect to each of the read voltages R1 to R7.

Hereinafter, the operation executed in a memory system 1 according to a fifth modification will be described focusing on the differences from the operation of the memory system according to the embodiment.

Figure 40:
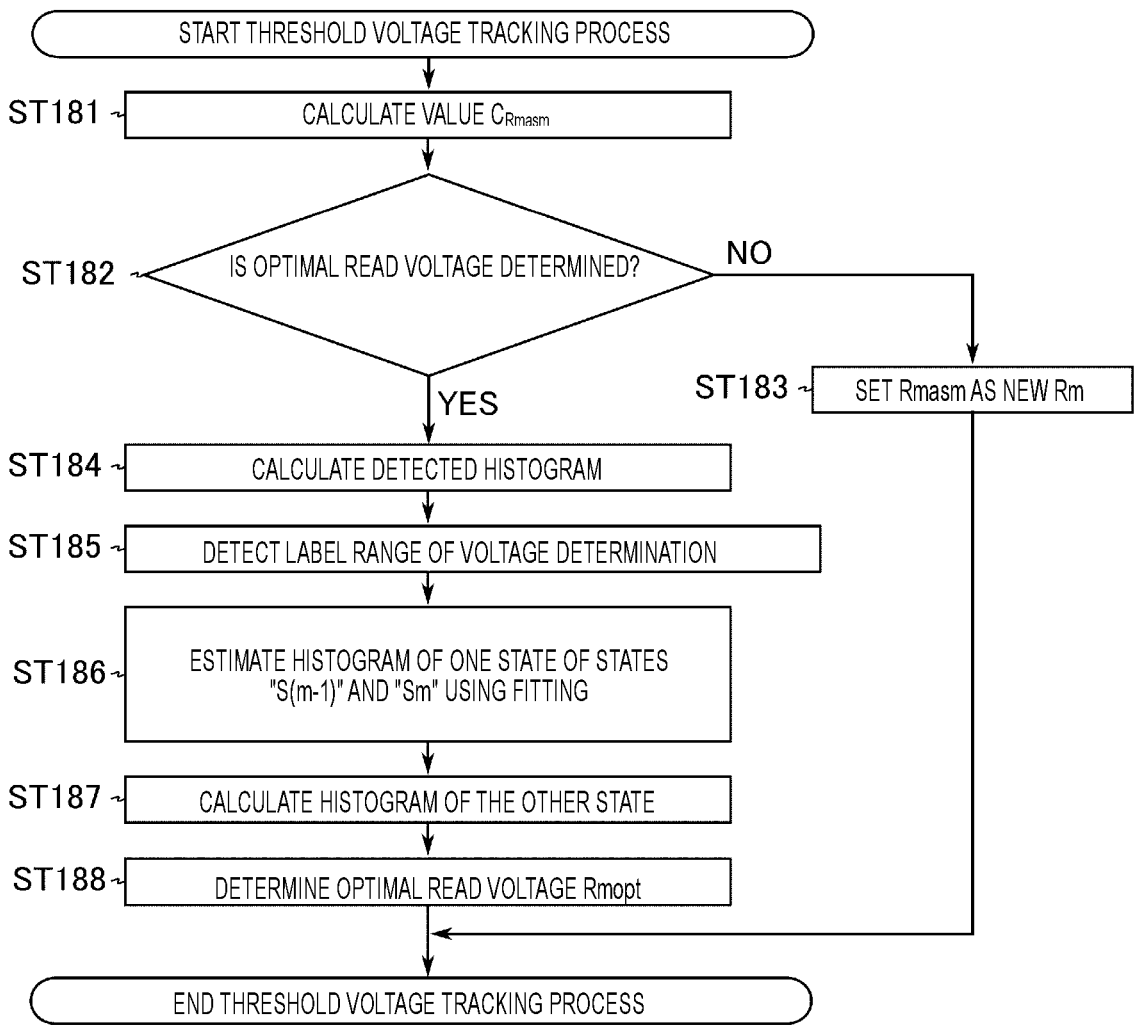
FIG. 40 is a flowchart illustrating a flow of a threshold voltage tracking process executed in a memory system according to a fifth modification.

The flow of the threshold voltage tracking process executed in the memory system 1 according to the fifth modification will be described with reference to FIG. 40. FIG. 40 is a flowchart illustrating the flow of the threshold voltage tracking process executed in the memory system according to the fifth modification.

The tracking control unit 101 determines that the read voltage Rmasm is approximately equal to the optimal read voltage Rmopt, when the number of memory cell transistors MT $c_{Rmasm}$ having a threshold voltage equal to or lower than the read voltage Rmasm is included in a predetermined range. Then, the tracking control unit 101 determines not to determine the optimal read voltage Rmopt. Further, the tracking control unit 101 determines that the read voltage Rmasm and the optimal read voltage Rmopt are different values, when the number of memory cell transistors MT $c_{Rmasm}$ is not included in the predetermined range. Then, the tracking control unit 101 determines to determine the optimal read voltage Rmopt.

The tracking control unit 101 calculates the number of memory cell transistors MT cRmasm (ST181). The number of memory cell transistors MT cRmasm is the number of memory cell transistors MT which transition to the ON state when the read operation is performed with the read voltage Rmasm.

The tracking control unit 101 determines whether or not to determine the optimal read voltage Rmopt, based on the number of memory cell transistors MT $c_{Rmasm}$ (ST182). The tracking control unit 101 determines whether the number of memory cell transistors MT $c_{Rmasm}$ is equal to or smaller than a value (C10×m−C31), or equal to or larger than a value (C10×m+C32). Here, the constants C31 and C32 are adjustment values for determining whether or not to determine the optimal read voltage Rmopt by using the fitting. The constants C31 and C32 have positive values.

The tracking control unit 101 determines to determine the optimal read voltage Rmopt, when the $c_{Rmasm}$ is equal to or smaller than the value (C10×m−C31), or the $c_{Rmasm}$ is equal to or larger than the value (C10×m+C32) (ST182; YES). The process proceeds to ST184.

The tracking control unit 101 determines not to determine the optimal read voltage Rmopt, when the number of memory cell transistors MT $c_{Rmasm}$ is larger than the value (C10×m−C31) and smaller than the value (C10×m+C32) (ST182; NO). The tracking control unit 101 determines, for example, the read voltage Rmasm to be the new read voltage R. (ST183).

As described above, the tracking control unit 101 determines whether or not the read voltage Rmasm and the optimal read voltage Rmopt are approximately equal to each other, based on whether the number of memory cell transistors MT $c_{Rmasm}$ is in a range larger than the value (C10×m−C31) and smaller than the value (C10×m+C32).

ST184 to ST188 are the same as ST11 to ST15, respectively.

With the operation described above, the threshold voltage tracking process according to the fifth modification is terminated.

Figure 41A:
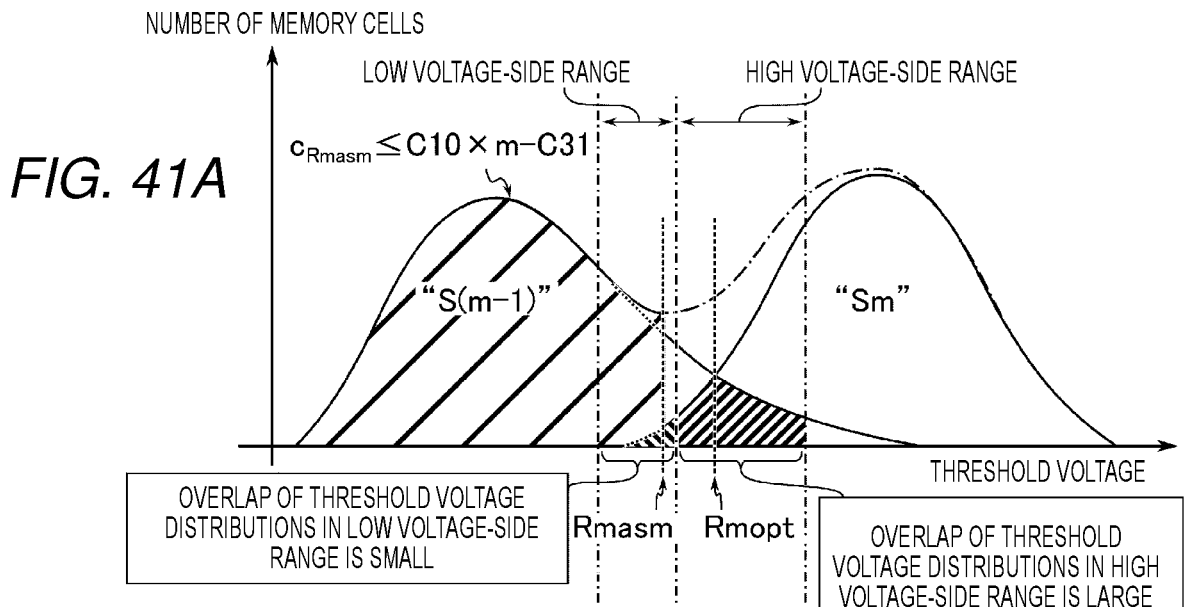
FIGS. 41A to 41C are views illustrating a determination of whether or not to determine an optimal read voltage executed in the memory system according to the fifth modification.
Figure 41B:
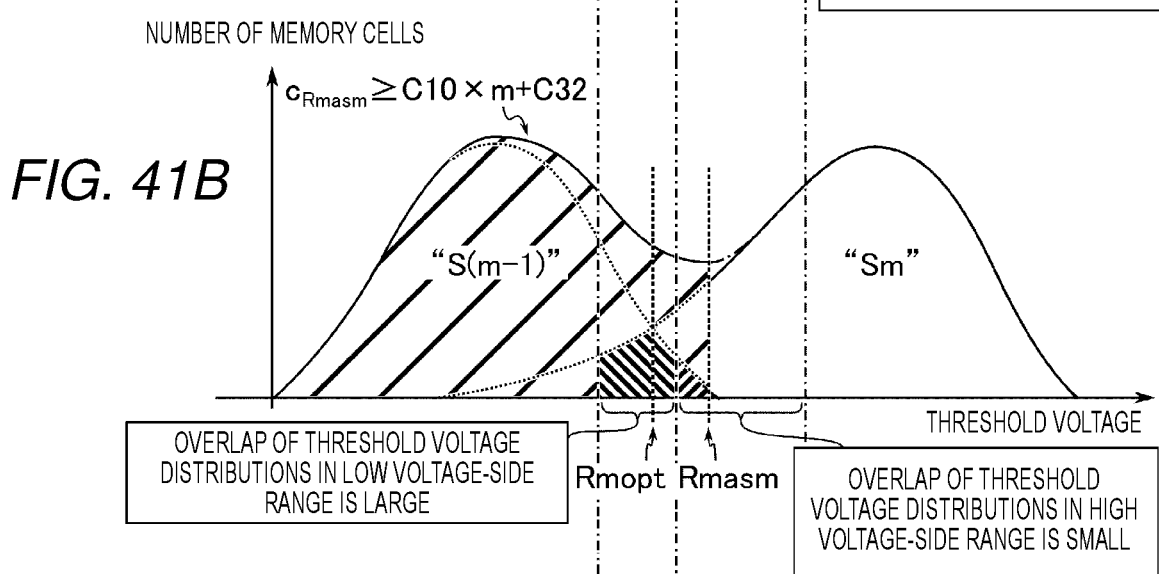
Figure 41C:
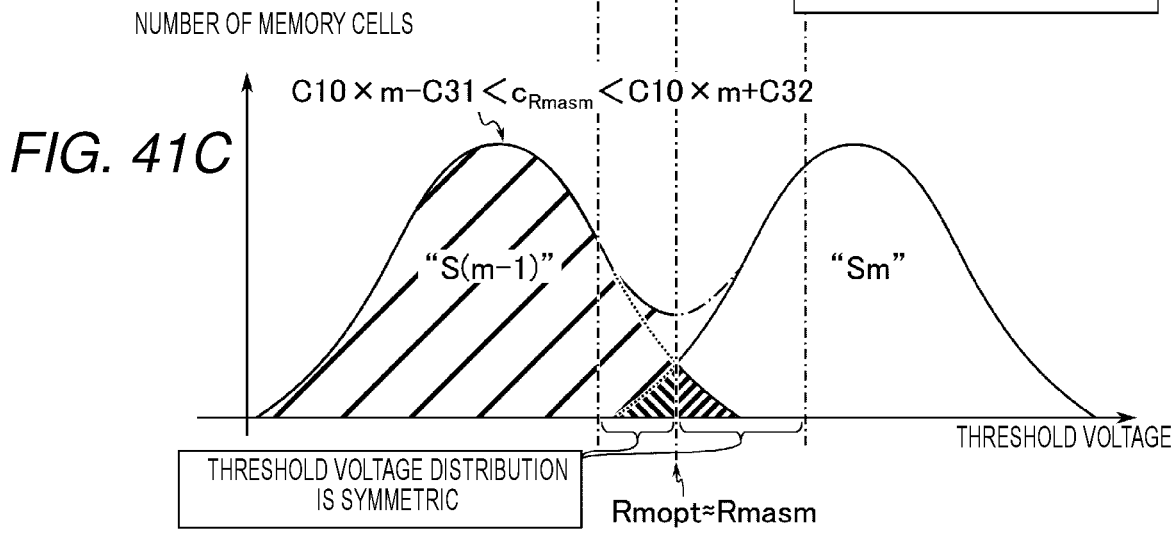

The determination of whether or not to determine the optimal read voltage Rmopt (ST182) will be described in more detail with reference to FIGS. 41A to 41C. FIGS. 41A to 41C are views illustrating the determination of whether or not to determine the optimal read voltage executed in the memory system according to the fifth modification.

As illustrated in FIG. 41A, for example, when the read voltage Rmasm is smaller than the optimal read voltage Rmopt, the number of memory cell transistors MT $c_{Rmasm}$ becomes equal to or smaller than the reference value (C10× m−C31). In this case, the overlap of the threshold voltage distributions in the high voltage-side range may become larger than that in the low voltage-side range by spread of the threshold voltage distribution of the state "S(m−1)" in the high voltage-side. In this case, the tracking control unit 101 determines to determine the optimal read voltage Rmopt.

Further, as illustrated in FIG. 41B, for example, when the read voltage Rmasm is larger than the optimal read voltage Rmopt, the number of memory cell transistors MT $c_{Rmasm}$ becomes equal to or larger than the reference value (C10× m+C32). In this case, the overlap of the threshold voltage distributions in the low voltage-side range becomes larger than that in the high voltage-side range by spread of the threshold voltage distribution of the state "Sm" in the low voltage-side. In this case, the tracking control unit 101 determines to determine the optimal read voltage Rmopt.

Further, as illustrated in FIG. 41C, for example, when the read voltage Rmasm is equal to the optimal read voltage Rmopt, the number of memory cell transistors MT $c_{Rmasm}$ becomes larger than the reference value (C10×m−C31) and smaller than the reference value (C10×m+C32). In this case, the respective threshold voltage distributions of the states "S(m−1)" and "Sm" may be symmetrical to each other, and sufficient precision of the read voltage Rm may be obtained by setting the read voltage Rmasm as the read voltage Rm. In this case, the tracking control unit 101 determines not to determine the optimal read voltage Rmopt.

The relationship between the threshold voltage distribution and the number of memory cell transistors MT $C_{Rmasm}$, which are illustrated in FIGS. 41A to 41C may be proven by, for example, the characteristics evaluation of the NAND memory 20.

According to the fifth modification, the tracking control unit 101 determines whether to set the optimal read voltage Rmopt as the new read voltage Rm or whether to set the read voltage Rmasm as the new read voltage Rm based on the number of memory cell transistors MT $c_{Rmasm}$, at the time of determining each of new read voltages R1 to R7. As a result, in the memory system 1 according to the fifth modification, when the sufficient precision can be obtained by setting the read voltage Rmasm as the new read voltage Rm, a time period for determining the optimal read voltage Rmopt can be reduced.

2.6 Sixth Modification

In the above-described fifth modification, the tracking control unit 101 determines whether or not to determine the optimal read voltages R1opt to R7opt, at the time of determining the new read voltages R1 to R7, respectively. However, the present disclosure is not limited thereto. The tracking control unit 101 may detect the read voltage Rm which is a determination target of the optimal read voltage Rmopt before the threshold voltage tracking process, based on, for example, a tendency of the shape of the threshold voltage distribution of each of the states "S0" to "S7".

2.6.1 Overall Operation

Figure 42:
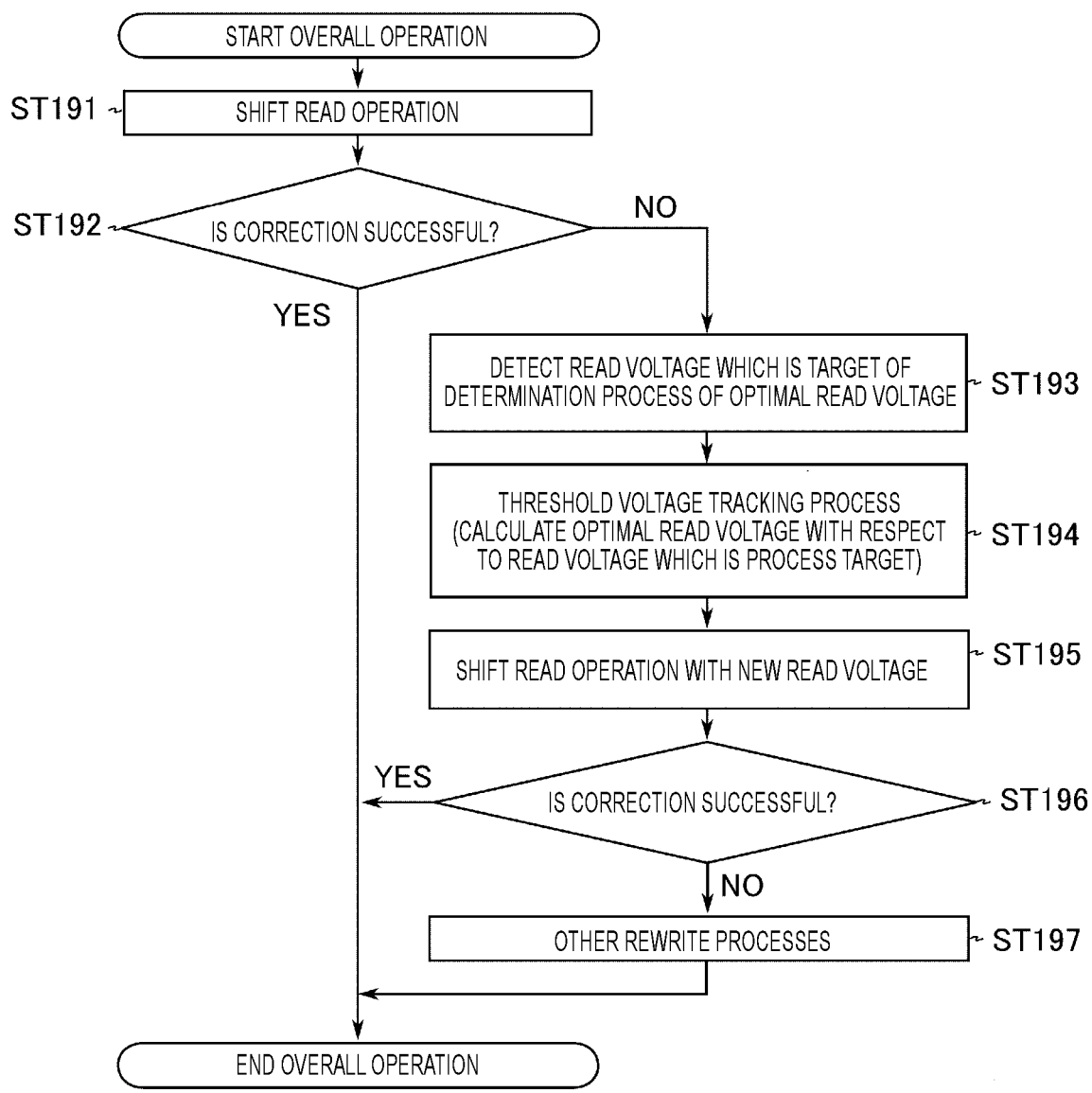
FIG. 42 is a flowchart illustrating a flow of an overall operation of a memory system according to a sixth modification.

The flow of the overall operation including the threshold voltage tracking process executed in a memory system 1 according to a sixth modification will be described with reference to FIG. 42. FIG. 42 is a flowchart illustrating the flow of the overall operation of the memory system according to the sixth modification.

The tracking control unit 101 detects the read voltage Rm (a process target read voltage) which is the target of the determination process of the optimal read voltage Rmopt among the read voltages R1 to R7 (ST193). Hereinafter, the process of ST193 will also be referred to as a detection process of the process target read voltage. The tracking control unit 101 detects the process target read voltage Rm, based on the shape of the overlap of the threshold voltage distributions of the states "S(m−1)" and "Sm" represented by the diagonal line portion of FIG. 6B. Details of the detection process of the process target read voltage will be described later.

The tracking control unit 101 executes the threshold voltage tracking process only for the process target read voltage Rm (ST194). The threshold voltage tracking process is the same as the threshold voltage tracking process (ST3) according to the embodiment. As a result, the tracking control unit 101 determines the optimal read voltage Rmopt as the new read voltage Rm with respect to the process target read voltage Rm. Meanwhile, the tracking control unit 101 determines the read voltage Rmasm as the new read voltage Rm with respect to the read voltage Rm which is not the process target.

ST191, ST192, and ST195 to ST197 are the same as ST1, ST2, and ST4 to ST6 according to the embodiment.

2.6.2 Detection Process of Process Target Read Voltage

Figure 43:
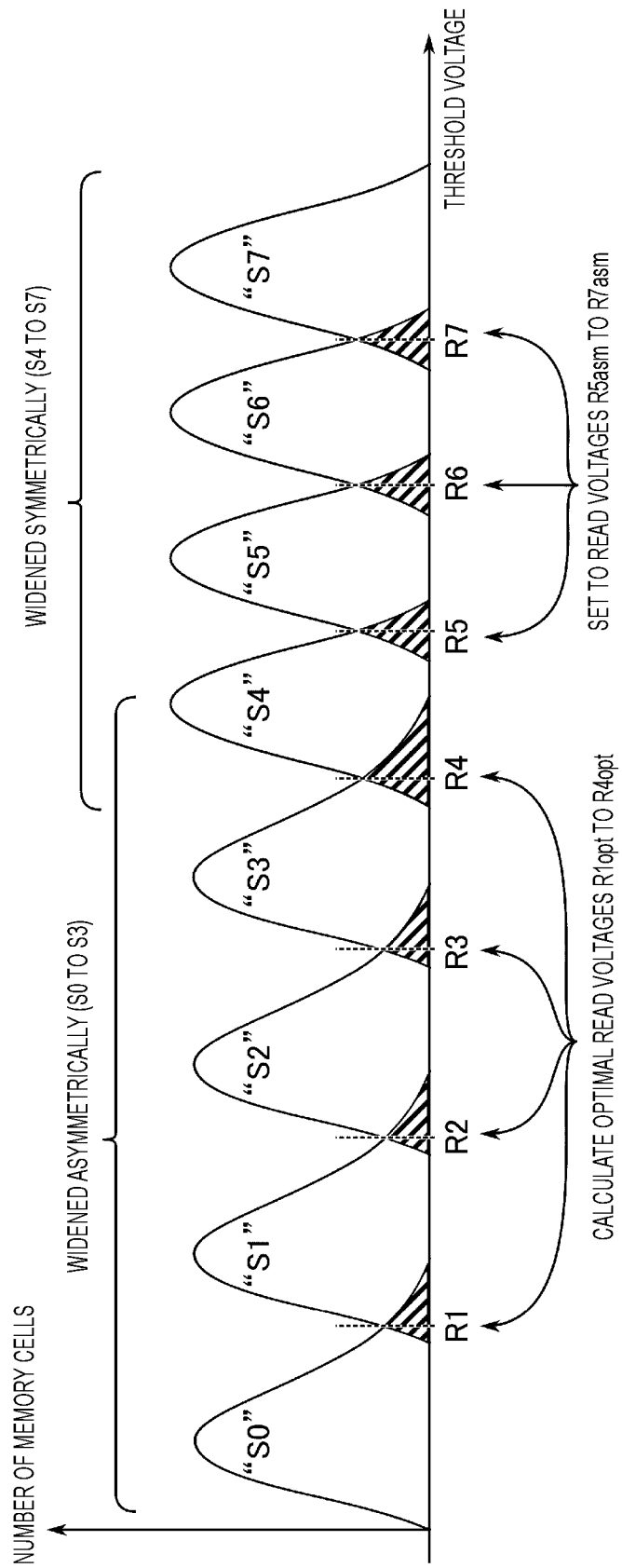
FIG. 43 is a view illustrating an example of a tendency of a shape of a threshold voltage distribution in the memory system according to the sixth modification.

Detection process of the process target read voltage (ST193) will be described with reference to FIG. 43. FIG. 43 is a view illustrating an example of the tendency of the shape of the threshold voltage distribution of each of the states "S0" to "S7". FIG. 43 illustrates the threshold voltage distribution of each of the states "S0" to "S7" widened by a factor such as disturb or the like after a write operation.

The tracking control unit 101 executes the detection process of the process target read voltage, based on the tendency of the shape of the threshold voltage distribution of each of the states "S0" to "S7".

As illustrated in FIG. 43, the threshold voltage distributions of the respective low voltage-side states "S0" to "S3" among the states "S0" to "S7" have a tendency in which a high voltage-side side spreads more than a low voltage-side side. Meanwhile, the threshold voltage distributions of the respective high voltage-side states "S4" to "S7" among the states "S0" to "S7" have, for example, a tendency of being symmetrically widened, as compared with the threshold voltage distributions of the states "S0" to "S3". By the tendency of the threshold voltage distribution, the overlap of the threshold voltage distributions of the states "S0" and "S1", the overlap of the threshold voltage distributions of the states "S1" and "S2", the overlap of the threshold voltage distributions of the states "S2" and "S3", and the overlap of the threshold voltage distributions of the states "S3" and "S4" are asymmetric to each other. Further, the overlap of the threshold voltage distributions of the states "S4" and "S5", the overlap of the threshold voltage distributions of the states "S5" and "S6", and the overlap of the threshold voltage distributions of the states "S6" and "S7" are further symmetric.

The tracking control unit 101 determines whether each of the overlap of the threshold voltage distributions of the states "S0" and "S1" and the overlap of the threshold voltage distributions of the states "S6" and "S7" is asymmetric. The tracking control unit 101 determines that the optimal read voltage Rmopt and the read voltage Rmasm are different, when the overlap of the threshold voltage distributions of the state "S(m−1)" and the state "Sm" is asymmetric. In addition, the tracking control unit 101 detects the read voltage (the read voltages R1 to R4 in FIG. 43) corresponding to the overlap of the threshold voltage distributions, which is determined to be asymmetric, as the process target read voltage Rm. Further, the tracking control unit 101 determines that the optimal read voltage Rmopt and the read voltage Rmasm are approximately equal to each other, when the overlap of the threshold voltage distributions of the states "S(m−1)" and "Sm" is symmetric. In addition, the tracking control unit 101 detects the read voltage (the read voltages R5 to R7 in FIG. 43) corresponding to the overlap of the threshold voltage distributions, which is determined to be symmetric, as the read voltage Rm which is not the process target.

Further, the tracking control unit 101 calculates a histogram including valley areas of the threshold voltage distributions corresponding to the read voltages R1 to R7, respectively, by using a voltage range wider than the voltage range ΔR used for calculating the detected histogram $h_d$, for example, before the detection process of the process target read voltage (ST193). The tracking control unit 101 determines whether the overlap of the threshold voltage distributions is asymmetric, based on, for example, the shape of the calculated histogram.

According to the memory system 1 of the sixth modification, the tracking control unit 101 detects the read voltage Rm for determining the optimal read voltage Rmopt among the read voltages R1 to R7, before the threshold voltage tracking process. As a result, in the memory system 1 according to the sixth modification, a time period for determining whether or not to determine the optimal read voltage Rmopt with respect to each of the read voltages R1 to R7 can be reduced in the threshold voltage tracking process.

3. Miscellaneous

In the above-described embodiments and modifications, the read operation is executed using any read voltage Rm of the read voltages R1 to R7. However, the present disclosure is not limited thereto. The controller 10 may execute the read operation using a plurality of voltages (e.g., voltages R1 and R5 corresponding to lower page data). When the read operation is operated using the voltages R1 to R5, the controller 10 sets the voltage range of the detected histogram calculation to a range which is higher than a voltage R1_(N+1) (<R1*asm*) and equal to or lower than a voltage R1_1 (>R1*asm*) based on the voltage R1*asm*, and a range which is higher than a voltage R5_(N+1) (R1_1<R5_(N+1) <R5*asm*) and equal to or lower than a voltage R5_1 (>R5*asm*) based on the voltage R5*asm*. That is, the memory system 1 executes a plurality of shift read operations using two read voltages R1_*n* and R5_*n*. Further, the controller 10 may include a separation read for determining whether the threshold voltage of each memory cell transistor MT is included in the range which is equal to or lower than the voltage R1_1 and whether the threshold voltage of each memory cell transistor MT is included in the range which is equal to or higher than the voltage R5_(N+1) at the time of calculating the detected histogram. The read voltage of the separation read is higher than the voltage R1_1 and lower than the voltage R5_(N+1). The read voltage of the separation read is, for example, a default read voltage R3*def*.

Further, in each of the embodiment and the first modification, the fitting of the first range is performed for all of the read voltages R1 to R7, and the fitting of the third range is performed for all of the read voltages R1 to R7. However, the present disclosure is not limited thereto. For example, with respect to the read voltage Rm of each of the read voltages R1 to R7, the optimal read voltage Rmopt may be determined by executing the fitting of the first range, and the optimal read voltage Rmopt may be determined by executing the fitting of the third range.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a semiconductor memory including a plurality of memory cells each configured to store data having one of at least a first value and a second value according to a threshold voltage thereof, the first value corresponding to the threshold voltage included in a first voltage range, and the second value corresponding to the threshold voltage included in a second voltage range; and
   a controller configured to
   write data having the first value in each of a plurality of first memory cells among the plurality of memory cells,
   write data having the second value in each of a plurality of second memory cells among the plurality of memory cells,
   determine a first voltage by executing a tracking process for the plurality of memory cells, and
   read data from the plurality of memory cells using the first voltage in a read process after the tracking process,
   wherein the controller is configured to, in the tracking process,
   perform a plurality of read operations using a plurality of read voltages in a third voltage range, the third voltage range including a part of the first voltage range and a part of the second voltage range, to determine a first threshold voltage distribution of the plurality of memory cells,
   estimate a second threshold voltage distribution of the plurality of first memory cells in the third voltage range based on the first threshold voltage distribution,
   calculate a third threshold voltage distribution of the plurality of second memory cells in the third voltage range based on a difference between the first threshold voltage distribution and the second threshold voltage distribution, and
   determine a voltage that is within the third voltage range as the first voltage, based on the second threshold voltage distribution and the third threshold voltage distribution.

2. The memory system according to claim 1, wherein the controller is configured to
   estimate a fourth threshold voltage distribution of the plurality of first memory cells based on the first threshold voltage distribution in a fourth voltage range that is included in the third voltage range, estimate a fifth threshold voltage distribution of the plurality of first memory cells in a fifth voltage range that is included in the third voltage range and is different from the fourth voltage range, based on the fourth threshold voltage distribution, and estimate the second threshold voltage distribution based on the fourth threshold voltage distribution and the fifth threshold voltage distribution.

3. The memory system according to claim 2, wherein the controller is configured to estimate the fourth threshold voltage distribution by executing a curve fitting process of the first threshold voltage distribution in the fourth voltage range.

4. The memory system according to claim 3, wherein the controller is configured to determine a first function by executing a least square method used in the curve fitting process, and estimate the fourth threshold voltage distribution based on the first function.

5. The memory system according to claim 4, wherein the controller is configured to estimate the fifth threshold voltage distribution based on a value of voltage included in the fourth voltage range and a constant determined to correspond to the first function.

6. The memory system according to claim 2, wherein the first voltage range includes lower voltages than the second voltage range, and
the fourth voltage range includes lower voltages than the fifth voltage range.

7. The memory system according to claim 2, wherein the first voltage range includes higher voltages than the second voltage range, and
the fourth voltage range includes higher voltages than the fifth voltage range.

8. The memory system according to claim 1, wherein the controller is configured to execute a determination process to determine whether or not the first voltage is to be determined.

9. The memory system according to claim 8, wherein the controller is configured to, in the determination process:
calculate a first on-cell number, which is a number of a plurality of third memory cells which transition to an ON state among the plurality of memory cells, when a read process is performed on the plurality of memory cells using a third voltage included in the first voltage range, and
determine whether or not to determine the first voltage based on the first on-cell number.

10. The memory system according to claim 9, wherein the third voltage is a minimum read voltage to perform the read process for the plurality of memory cells, and
the controller determines to determine the first voltage when the first on-cell number is smaller than a first threshold, and determines not to determine the first voltage when the first on-cell number is equal to or larger than the first threshold.

11. The memory system according to claim 8, wherein the controller is configured to, in the determination process:
determine whether the first threshold voltage distribution shows a tendency to decrease with an increase in read voltage, based on a shape of the first threshold voltage distribution in a sixth voltage range included in the third voltage range, and
determine to determine the first voltage when the first threshold voltage distribution in the sixth voltage range shows the tendency to decrease with the increase in read voltage.

12. The memory system according to claim 8, wherein the controller is configured to, in the determination process:
determine whether a maximum number of times the first threshold voltage distribution in a sixth voltage range included in the third voltage range consecutively decreases with an increase in read voltage, is equal to or larger than a first determination value, and
determine to determine the first voltage when the maximum number of times is equal to or larger than the first determination value.

13. The memory system according to claim 8, wherein the controller is configured to, in the determination process:
determine whether a total number of times the first threshold voltage distribution in a sixth voltage range included in the third voltage range decreases with an increase in read voltage is equal to or larger than a second determination value, and
determine to determine the first voltage when the total number of times is equal to or larger than the second determination value.

14. The memory system according to claim 8, wherein the controller is configured to, in the determination process:
determine whether an overlap of the second threshold voltage distribution and the third threshold voltage distribution is asymmetric, and
determine to determine the first voltage when the overlap of the second threshold voltage distribution and the third threshold voltage distribution is asymmetric.

15. A method of determining an optimal read voltage for a semiconductor memory including a plurality of memory cells each configured to store data having one of at least a first value and a second value according to a threshold voltage thereof, the first value corresponding to the threshold voltage included in a first voltage range, and the second value corresponding to the threshold voltage included in a second voltage range, said method comprising:
performing a first write operation to write data having the first value in each of a plurality of first memory cells among the plurality of memory cells;
performing a second write operation to write data having the second value in each of a plurality of second memory cells among the plurality of memory cells; and
determining the optimal read voltage by executing a tracking process for the plurality of memory cells,
wherein the tracking process includes:
performing a plurality of read operations using a plurality of read voltages in a third voltage range, the third voltage range including a part of the first voltage range and a part of the second voltage range, to determine a first threshold voltage distribution of the plurality of memory cells;
estimating a second threshold voltage distribution of the plurality of first memory cells in the third voltage range based on the first threshold voltage distribution;
calculating a third threshold voltage distribution of the plurality of second memory cells in the third voltage range based on a difference between the first threshold voltage distribution and the second threshold voltage distribution; and
determining a voltage that is within the third voltage range as the optimal read voltage, based on the second threshold voltage distribution and the third threshold voltage distribution.

16. The method according to claim 15, wherein the tracking process further includes:
 estimating a fourth threshold voltage distribution of the plurality of first memory cells based on the first threshold voltage distribution in a fourth voltage range that is included in the third voltage range;
 estimating a fifth threshold voltage distribution of the plurality of first memory cells in a fifth voltage range that is included in the third voltage range and is different from the fourth voltage range, based on the fourth threshold voltage distribution; and
 estimating the second threshold voltage distribution based on the fourth threshold voltage distribution and the fifth threshold voltage distribution.

17. The method according to claim 16, wherein the fourth threshold voltage distribution is estimated by executing curve fitting of the first threshold voltage distribution in the fourth voltage range.

18. The method according to claim 17, wherein the fourth threshold voltage distribution is estimated based on a first function that is determined by executing a least square method for the curve fitting.

19. The method according to claim 16, wherein the first voltage range includes lower voltages than the second voltage range, and
 the fourth voltage range includes lower voltages than the fifth voltage range.

20. The method according to claim 16, wherein the first voltage range includes higher voltages than the second voltage range, and
 the fourth voltage range includes higher voltages than the fifth voltage range.

* * * * *